United States Patent
Boles et al.

(10) Patent No.: US 11,942,518 B2
(45) Date of Patent: *Mar. 26, 2024

(54) REDUCED INTERFACIAL AREA III-NITRIDE MATERIAL SEMICONDUCTOR STRUCTURES

(71) Applicant: MACOM Technology Solutions Holdings, Inc., Lowell, MA (US)

(72) Inventors: Timothy E. Boles, Tyngsboro, MA (US); Wayne Mack Struble, Franklin, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 359 days.

This patent is subject to a terminal disclaimer.

(21) Appl. No.: 17/335,521

(22) Filed: Jun. 1, 2021

(65) Prior Publication Data

US 2021/0296481 A1    Sep. 23, 2021

Related U.S. Application Data

(63) Continuation of application No. 16/039,866, filed on Jul. 19, 2018, now Pat. No. 11,038,023.

(51) Int. Cl.
*H01L 29/20* (2006.01)
*H01L 21/02* (2006.01)
(Continued)

(52) U.S. Cl.
CPC .... *H01L 29/2003* (2013.01); *H01L 21/02381* (2013.01); *H01L 21/02458* (2013.01);
(Continued)

(58) Field of Classification Search
CPC ......... H01L 21/02381; H01L 21/02458; H01L 21/02505; H01L 21/0251; H01L 21/0254;
(Continued)

(56) References Cited

U.S. PATENT DOCUMENTS 3,544,864 A    12/1970    Richman
3,717,790 A    2/1973    Mathews et al.
(Continued)

FOREIGN PATENT DOCUMENTS

| EP | 1544968 | 6/2005 |
|---|---|---|
| EP | 2428981 | 3/2012 |
| EP | 2495759 | 9/2012 |
| JP | 2008034411 A | 2/2008 |
| JP | 2009065082 | 3/2009 |
| JP | 2017216257 A | 12/2017 |

(Continued)

OTHER PUBLICATIONS

International Search Report and Written Opinion dated Jan. 24, 2017 for PCT Patent Application No. PCT/US2016/050515.

(Continued)

*Primary Examiner* — Andres Munoz
(74) *Attorney, Agent, or Firm* — Perilla Knox & Hildebrandt LLP; Jason M. Perilla

(57) ABSTRACT

Semiconductor structures and devices in III-nitride materials are described herein, including material structures comprising III-nitride material regions (e.g., gallium nitride material regions). In certain cases, the material structures comprise substrates having relatively high electrical conductivities. In other cases, the material structures comprise substrates having relatively high resistivities. Certain embodiments include one or more features that reduce the degree to which thermal runaway occurs, which can enhance device performance including at elevated flange temperatures. Some embodiments include one or more features that reduce the degree of capacitive coupling exhibited during operation. For example, in some embodiments, relatively thick III-nitride material regions and/or relatively small ohmic contacts are employed.

20 Claims, 19 Drawing Sheets

(51) Int. Cl.
*H01L 23/66* (2006.01)
*H01L 27/02* (2006.01)
*H01L 27/06* (2006.01)
*H01L 29/15* (2006.01)
*H01L 29/778* (2006.01)
*H01L 29/872* (2006.01)

(52) U.S. Cl.
CPC .... *H01L 21/02505* (2013.01); *H01L 21/0254* (2013.01); *H01L 23/66* (2013.01); *H01L 27/0211* (2013.01); *H01L 27/0605* (2013.01); *H01L 29/155* (2013.01); *H01L 29/7787* (2013.01); *H01L 29/872* (2013.01)

(58) Field of Classification Search
CPC ..... H01L 21/0262; H01L 23/66; H01L 25/16; H01L 27/0211; H01L 27/0605; H01L 29/1066; H01L 29/155; H01L 29/2003; H01L 29/205; H01L 29/417; H01L 29/41758; H01L 29/41766; H01L 29/7786; H01L 29/7787; H01L 29/872
See application file for complete search history.

(56) References Cited

U.S. PATENT DOCUMENTS

| | | |
|---|---|---|
| 4,843,440 A | 6/1989 | Huang |
| 5,192,987 A | 3/1993 | Khan et al. |
| 5,239,188 A | 8/1993 | Takeuchi et al. |
| 5,290,393 A | 3/1994 | Nakamura |
| 5,296,395 A | 3/1994 | Khan et al. |
| 5,389,571 A | 2/1995 | Takeuchi et al. |
| 5,393,993 A | 2/1995 | Edmond et al. |
| 5,523,589 A | 6/1996 | Edmond et al. |
| 5,633,192 A | 5/1997 | Moustakas et al. |
| 5,679,965 A | 10/1997 | Schetzina |
| 5,739,554 A | 4/1998 | Edmond et al. |
| 5,741,724 A | 4/1998 | Ramdani et al. |
| 5,760,426 A | 6/1998 | Marx et al. |
| 5,786,606 A | 7/1998 | Nishio et al. |
| 5,815,520 A | 9/1998 | Furushima |
| 5,838,029 A | 11/1998 | Shakuda |
| 5,838,706 A | 11/1998 | Edmond et al. |
| 5,874,747 A | 2/1999 | Redwing et al. |
| 5,929,467 A | 7/1999 | Kawai et al. |
| 6,051,849 A | 4/2000 | Davis et al. |
| 6,064,078 A | 5/2000 | Northrup et al. |
| 6,064,082 A | 5/2000 | Kawai et al. |
| 6,069,021 A | 5/2000 | Terashima et al. |
| 6,100,545 A | 8/2000 | Chiyo et al. |
| 6,120,600 A | 9/2000 | Edmond et al. |
| 6,121,121 A | 9/2000 | Koide |
| 6,139,628 A | 10/2000 | Yuri et al. |
| 6,146,457 A | 11/2000 | Solomon |
| 6,153,010 A | 11/2000 | Kiyoku et al. |
| 6,156,581 A | 12/2000 | Vaudo et al. |
| 6,177,688 B1 | 1/2001 | Linthicum et al. |
| 6,180,270 B1 | 1/2001 | Cole et al. |
| 6,201,262 B1 | 3/2001 | Edmond et al. |
| 6,255,198 B1 | 7/2001 | Linthicum et al. |
| 6,261,929 B1 | 7/2001 | Gehrke et al. |
| 6,261,931 B1 | 7/2001 | Keller et al. |
| 6,265,289 B1 | 7/2001 | Zheleva et al. |
| 6,274,892 B1 | 8/2001 | Kub et al. |
| 6,291,319 B1 | 9/2001 | Yu et al. |
| 6,316,793 B1 | 11/2001 | Sheppard et al. |
| 6,329,063 B2 | 12/2001 | Lo et al. |
| 6,380,108 B1 | 4/2002 | Linthicum et al. |
| 6,391,748 B1 | 5/2002 | Temkin et al. |
| 6,403,451 B1 | 6/2002 | Linthicum et al. |
| 6,420,197 B1 | 7/2002 | Ishida et al. |
| 6,426,512 B1 | 7/2002 | Ito et al. |
| 6,440,823 B1 | 8/2002 | Vaudo et al. |
| 6,441,393 B2 | 8/2002 | Goetz et al. |
| 6,459,712 B2 | 10/2002 | Tanaka et al. |
| 6,465,814 B2 | 10/2002 | Kasahara et al. |
| 6,486,502 B1 | 11/2002 | Sheppard et al. |
| 6,498,111 B1 | 12/2002 | Kapolnek et al. |
| 6,521,514 B1 | 2/2003 | Gehrke et al. |
| 6,524,932 B1 | 2/2003 | Zhang et al. |
| 6,548,333 B2 | 4/2003 | Smith |
| 6,583,034 B2 | 6/2003 | Ramdani et al. |
| 6,583,454 B2 | 6/2003 | Sheppard et al. |
| 6,586,781 B2 | 7/2003 | Wu et al. |
| 6,610,144 B2 | 8/2003 | Mishra et al. |
| 6,611,002 B2 | 8/2003 | Weeks et al. |
| 6,617,060 B2 | 9/2003 | Weeks et al. |
| 6,624,452 B2 | 9/2003 | Yu et al. |
| 6,649,287 B2 | 11/2003 | Weeks et al. |
| 6,765,240 B2 | 7/2004 | Tischler et al. |
| 6,765,241 B2 | 7/2004 | Ohno et al. |
| 6,777,278 B2 | 8/2004 | Smith |
| 6,841,409 B2 | 1/2005 | Onishi |
| 6,849,882 B2 | 2/2005 | Chavarkar et al. |
| 7,041,519 B2 | 5/2006 | Taki |
| 7,071,498 B2 | 7/2006 | Johnson et al. |
| 7,141,489 B2 | 11/2006 | Burgener et al. |
| 7,247,889 B2 | 7/2007 | Hanson et al. |
| 7,867,861 B2 | 1/2011 | Giles et al. |
| 8,501,635 B1 | 8/2013 | Clark et al. |
| 8,618,578 B2 | 12/2013 | Ota et al. |
| 8,785,944 B2 | 7/2014 | Hwang et al. |
| 9,082,811 B2 | 7/2015 | Ward |
| 9,627,473 B2 | 4/2017 | Roberts et al. |
| 9,673,281 B2 | 6/2017 | Linthicum et al. |
| 9,704,705 B2 | 7/2017 | Roberts et al. |
| 9,773,898 B2 | 9/2017 | Roberts et al. |
| 9,799,520 B2 | 10/2017 | Roberts |
| 9,806,182 B2 | 10/2017 | Linthicum |
| 11,038,023 B2 * | 6/2021 | Boles ................. H01L 25/16 |
| 2001/0042503 A1 | 11/2001 | Lo et al. |
| 2002/0020341 A1 | 2/2002 | Marchand et al. |
| 2002/0117695 A1 | 8/2002 | Borges et al. |
| 2003/0136333 A1 | 7/2003 | Semond et al. |
| 2004/0011280 A1 | 1/2004 | Higuchi et al. |
| 2004/0119063 A1 | 6/2004 | Guo et al. |
| 2004/0119067 A1 | 6/2004 | Weeks et al. |
| 2005/0009310 A1 | 1/2005 | Vaudo et al. |
| 2005/0133818 A1 | 6/2005 | Johnson et al. |
| 2006/0118819 A1 | 6/2006 | Hanson et al. |
| 2006/0226412 A1 | 10/2006 | Saxler et al. |
| 2007/0007547 A1 | 1/2007 | Beach |
| 2007/0108497 A1 | 5/2007 | Shih et al. |
| 2007/0197004 A1 | 8/2007 | Dadgar et al. |
| 2007/0269966 A1 | 11/2007 | Suvorov |
| 2008/0023706 A1 | 1/2008 | Saito et al. |
| 2009/0008647 A1 | 1/2009 | Li et al. |
| 2009/0050980 A1 | 2/2009 | Ekbote et al. |
| 2010/0270562 A1 | 10/2010 | Ogihara |
| 2012/0098599 A1 | 4/2012 | Chang et al. |
| 2012/0126195 A1 | 5/2012 | Ignatiev et al. |
| 2012/0223365 A1 | 9/2012 | Briere |
| 2013/0026480 A1 | 1/2013 | Fenwick et al. |
| 2014/0117502 A1 | 5/2014 | Laven et al. |
| 2014/0299872 A1 | 10/2014 | Wilshaw et al. |
| 2015/0228484 A1 | 8/2015 | Dargis et al. |
| 2015/0236122 A1 | 8/2015 | Ren et al. |
| 2017/0069500 A1 | 3/2017 | Roberts et al. |
| 2017/0069716 A1 | 3/2017 | Roberts et al. |
| 2017/0069720 A1 | 3/2017 | Roberts et al. |
| 2017/0069721 A1 | 3/2017 | Linthicum |
| 2017/0069723 A1 | 3/2017 | Linthicum |
| 2017/0069742 A1 | 3/2017 | Roberts et al. |
| 2017/0069744 A1 | 3/2017 | Roberts et al. |
| 2017/0069745 A1 | 3/2017 | Linthicum |
| 2018/0026098 A1 | 1/2018 | Linthicum et al. |
| 2018/0122928 A1 | 5/2018 | Roberts et al. |
| 2018/0122929 A1 | 5/2018 | Linthicum |

(56) References Cited

U.S. PATENT DOCUMENTS

2018/0158685 A1 6/2018 Roberts
2019/0305122 A1 10/2019 Chen et al.

FOREIGN PATENT DOCUMENTS

| WO | 9641906 | 12/1996 |
| WO | 9837584 | 8/1998 |
| WO | 0113436 | 2/2001 |
| WO | 2016059923 A1 | 4/2016 |

OTHER PUBLICATIONS

International Preliminary Report on Patentability dated Jan. 24, 2017 for PCT Patent Application No. PCT/US2016/050515.
European Search Report dated Apr. 8, 2019 for European Patent Application No. 16844965.
International Search Report for PCT/US2019/042623 dated Oct. 31, 2019.
Written Opinion for PCT/US2019/042623 dated Oct. 31, 2019.
Takenaka Isao et al.: High-Efficiency and High-Power Microwave Amplifier Using GaN-on-Si FET With Improved High-Temperature Operation Characteristics11 , IEEE Tran Sa Cti Ons on Microwave Theory and Techniques, Plenum, USA, vol. 62, No. 3, Published on Mar. 3, 2014 and Jan. 16, 2014, pp. 502-512, XP011541890, ISSN: 0018-9480, DOI: 10.1109/TMTT.2014.2298381 [retrieved on Mar. 3, 2014] abstract figures 8, 9, 12 and—associated text.
Saito Wet Al: "Breakdown behaviour of high-voltage GaN-HEMTs", Microelectronics and Reliability, vol. 55, No. 9, 10 Published Aug. 2015 , pp. 1682-1686, XP029294642, ISSN: 0026-2714, DOI: 10.1016/J.MICROREL.2015.06.126 figure 1 and associated text.

* cited by examiner

REDUCED INTERFACIAL AREA III-NITRIDE MATERIAL SEMICONDUCTOR STRUCTURES

CROSS REFERENCE TO RELATED APPLICATIONS

This application is a continuation of U.S. Non-Provisional Application Ser. No. 16/039,866, titled "III-NITRIDE MATERIAL SEMICONDUCTOR STRUCTURES ON CONDUCTIVE SILICON SUBSTRATES," filed Jul. 19, 2018, the entire contents of which is hereby incorporated herein by reference.

TECHNICAL FIELD

III-nitride materials are generally described, including gallium nitride materials and associated material structures.

BACKGROUND

III-nitride materials include gallium nitride (GaN), aluminum nitride (AlN), indium nitride (InN) and their respective alloys (e.g., AlGaN, InGaN, AlInGaN and AlInN). In particular, gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others.

In many applications, III-nitride materials are typically grown heteroepitaxially on a substrate. However, property differences between III-nitride materials (e.g., gallium nitride materials) and many substrate materials can present challenges. For example, gallium nitride materials (e.g., GaN) have a different thermal expansion coefficient (i.e., thermal expansion rate) and lattice constant than many substrate materials and, in particular, silicon. These differences may lead to formation of cracks and/or other types of defects in gallium nitride material layers that are grown heteroepitaxially on silicon. In some methods, a transition layer is used to mitigate the effects of these differences in order to grow high quality gallium nitride material and device structures on silicon. However, these differences (and others) have limited the performance and commercialization of structures and devices that include gallium nitride material formed on silicon substrates.

III-nitride materials (e.g., gallium nitride materials) are being investigated in high frequency (e.g., radio frequency (RF)) device and power management applications. The use of III-nitride materials for certain applications can present challenges. Accordingly, improved devices and methods are desirable.

SUMMARY

III-nitride materials are generally described herein, including material structures comprising III-nitride material regions (e.g., gallium nitride material regions). In certain cases, the material structures also comprise substrates having relatively high electrical conductivities. Certain embodiments include one or more features that reduce the degree to which thermal runaway occurs, which can enhance device performance including at elevated flange temperatures. For example, in accordance with certain embodiments, III-nitride materials grown on substrates with relatively high electrical conductivities are described herein. The use of an electronically conductive substrate can reduce the amount of resistive heating that is present during device operation, which can reduce thermal runaway. Some embodiments include one or more features that reduce the degree of capacitive coupling exhibited during operation. For example, in some embodiments, relatively thick III-nitride material regions and/or relatively small ohmic contacts are employed. In some embodiments, the resulting semiconductor devices are capable of high efficiencies at elevated temperature and/or during operation at relatively high frequencies (e.g., RF frequencies).

The subject matter of the present invention involves, in some cases, interrelated products, alternative solutions to a particular problem, and/or a plurality of different uses of one or more systems and/or articles.

Some embodiments relate to a semiconductor structure for an integrated circuit component, comprising a substrate, at least a portion of which is made of bulk silicon having an electronic resistivity of less than $0.10$ $\Omega$-cm when the silicon is at $25°$ C. and a III-nitride material region located over the substrate.

Some embodiments relate to a semiconductor structure for an integrated circuit component, comprising a substrate, at least a portion of which comprises silicon having an electronic resistivity of less than $0.10$ $\Omega$-cm when the silicon is at $25°$ C. and a III-nitride material region located over the substrate, wherein the integrated circuit component is configured to operate at a frequency greater than 50 MHz.

Some embodiments relate to a semiconductor device, comprising a substrate, at least a portion of which is made of bulk silicon; a III-nitride material region having a thickness of at least 2.0 micrometers located over the substrate; a source electrode over the III-nitride material region, the source electrode defining a source electrode interfacial area with the III-nitride material region; a drain electrode over the III-nitride material region, the drain electrode defining a drain electrode interfacial area with the III-nitride material region; and a gate electrode over the III-nitride material region, the gate electrode defining a gate electrode interfacial area with the III-nitride material region; wherein: the source electrode, and the drain electrode, and the gate electrode define an active area, and the sum of the source electrode interfacial area, the drain electrode interfacial area, and the gate electrode interfacial area is less than 30% of the active area.

Some embodiments relate to a semiconductor device, comprising: a substrate, at least a portion of which is made of bulk silicon; a III-nitride material region having a thickness of at least 2.0 micrometers located over the substrate; at least one cathode electrode over the III-nitride material region, the at least one cathode electrode defining a cathode electrode interfacial area with the III-nitride material region; and an anode electrode over the III-nitride material region, the anode electrode defining an anode electrode interfacial area with the III-nitride material region; wherein: the at least one cathode electrode and the anode electrode define an active area, and the sum of the cathode electrode interfacial area and the anode electrode interfacial area is less than 30% of the active area.

Some embodiments relate to a semiconductor device, comprising: a substrate, at least a portion of which comprises silicon; a III-nitride material region having a thickness of at least 2.0 micrometers located over the substrate; an ohmic contact over the III-nitride material region, the ohmic contact defining an ohmic contact interfacial area with the III-nitride material region; and a gate electrode over the III-nitride material region, the gate electrode defining a gate electrode interfacial area with the III-nitride material region, wherein the ohmic contact interfacial area is less than 50 times the gate electrode interfacial area.

Some embodiments relate to a semiconductor device comprising: a substrate, at least a portion of which comprises silicon; a III-nitride material region having a thickness of at least 2.0 micrometers located over the substrate; an integrated circuit component formed, at least in part, in the III-nitride material region; and at least one ohmic contact over the III-nitride material region, wherein: the at least one ohmic contact defines, at least in part, an active area of the integrated circuit component, and an active-area capacitance ratio for the integrated circuit component is no greater than 0.4 pF/mm.

Some embodiments relate to a semiconductor device, comprising: a substrate, at least a portion of which comprises silicon; and a III-nitride material region located over the substrate, wherein: the semiconductor device is configured such that at 25° C., the device is capable of a power added efficiency of at least 50%, and the semiconductor device is configured such that: when the substrate is increased in temperature from 25° C. to 105° C., the device exhibits a drop in power added efficiency of less than 5%, and/or when the substrate is increased in temperature from 25° C. to 125° C., the device exhibits a drop in power added efficiency of less than 10%.

Some embodiments relate to a semiconductor structure, comprising: a substrate, at least a portion of which is electronically conductive, the substrate having a thickness of less than 150 micrometers; a III-nitride material region located over the substrate; and an electronically conductive material located over the III-nitride material region, wherein: the electronically conductive material is electrically coupled to the electronically conductive portion of the substrate through the thickness of the III-nitride material region.

Some embodiments relate to a semiconductor device, comprising: a substrate comprising silicon; a III-nitride material region located over the substrate; at least one ohmic contact located over the substrate and the III-nitride material region and defining an ohmic contact interfacial area with the III-nitride material region; a dielectric region located over the substrate and over the III-nitride material region; and at least one contact pad located over the substrate, over the III-nitride material region, and over the dielectric region, the at least one contact pad defining a contact pad area, wherein the ratio of the ohmic contact area to the contact pad area is less than 28%.

Some embodiments relate to a structure comprising: a substrate comprising silicon and having a bulk resistivity less than 0.10 Ω-cm; a III-nitride material region located over the substrate; and an integrated circuit component formed, at least in part, in the III-nitride material region and wherein the integrated circuit component has a ratio of an active-area of the device, measured in square microns, to a gate or anode peripheral length, measured in microns, that is no greater than 200.

Some embodiments relate to a structure, comprising: a substrate comprising silicon and having a bulk resistivity less than 0.10 Ω-cm; a III-nitride material region located over the substrate; and an integrated circuit component formed, at least in part, in the III-nitride material region and having at least one ohmic contact of a first type, wherein the integrated circuit component has a ratio of an ohmic contact interfacial area, measured in square microns, for the first type of ohmic contact to a gate or anode peripheral length, measured in microns, that is no greater than 30.

Some embodiments relate to a structure, comprising: a substrate comprising silicon and having a bulk resistivity less than 0.10 Ω-cm; a III-nitride material region located over the substrate; and an integrated circuit component formed, at least in part, in the III-nitride material region and having at least one gate or anode contact pad, wherein the integrated circuit component has a ratio of a contact-pad area, measured in square microns, for the at least one gate or anode contact pad to a gate or anode peripheral length, measured in microns, that is no greater than 20.

Some embodiments relate to a structure, comprising: a substrate comprising silicon and having a bulk resistivity less than 0.10 Ω-cm; a III-nitride material region located over the substrate; and an integrated circuit component formed, at least in part, in the III-nitride material region and having at least one drain, source, or cathode contact pad, wherein the integrated circuit component has a ratio of a contact-pad area, measured in square microns, for the at least one drain, source, or cathode contact pad to a gate or anode peripheral length, measured in microns, that is no greater than 50.

Some embodiments relate to a structure, comprising: a substrate comprising silicon and having a bulk resistivity less than 0.10 Ω-cm; a III-nitride material region located over the substrate; and an integrated circuit component formed, at least in part, in the III-nitride material region and having at least one ohmic contact of a first type, wherein the integrated circuit component has a ratio of an ohmic contact capacitance, calculated based on an area of the at least one ohmic contact, for the first type of ohmic contact to a gate or anode peripheral length, measured in millimeters, that is no greater than 2.5.

Some embodiments relate to a structure, comprising: a substrate comprising silicon and having a bulk resistivity less than 0.10 Ω-cm; a III-nitride material region located over the substrate; and an integrated circuit component formed, at least in part, in the III-nitride material region and having at least one gate or anode contact pad, wherein the integrated circuit component has a ratio of a contact pad capacitance, calculated based on an area of the at least one gate or anode contact pad, to a gate or anode peripheral length, measured in millimeters, that is no greater than 1.0.

Some embodiments relate to a structure, comprising: a substrate comprising silicon and having a bulk resistivity less than 0.10 Ω-cm; a III-nitride material region located over the substrate; and an integrated circuit component formed, at least in part, in the III-nitride material region and having at least one source, drain, or cathode contact pad, wherein the integrated circuit component has a ratio of a contact pad capacitance, calculated based on an area for the at least one source, drain, or cathode contact pad, to a gate or anode peripheral length, measured in millimeters, that is no greater than 1.5.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
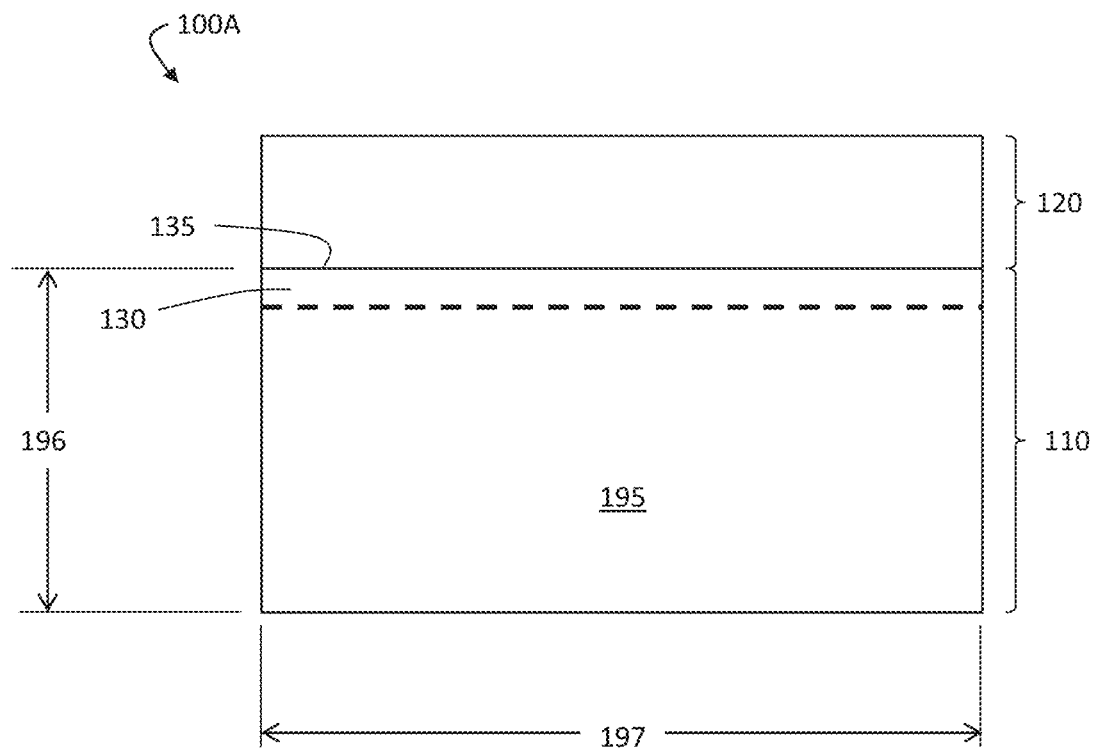
FIG. 1A is a cross-sectional schematic illustration of a semiconductor structure, according to certain embodiments.

III-nitride materials are generally described herein, including material structures comprising III-nitride material regions and substrates (e.g., silicon-containing substrates). Certain embodiments are related to gallium nitride materials, and material structures comprising gallium nitride material regions and silicon-containing substrates.

It has been discovered, in accordance with certain embodiments, that in certain cases, operation of semiconductor devices including III-nitride material regions over substrates generates heat, which decreases the electrical resistance of the substrate. The decrease in electrical resistance can lead to an increase in current transported across the substrate, which can lead to additional resistive heating. In this way, a positive feedback effect (in which further heating leads to further reductions in electrical conductivity and additional further heating) can be present that can degrade product performance characteristics, such as output power and efficiency of devices formed from such semiconductor structures. Certain of the embodiments described herein are related to structures and methods of operation that reduce this positive feedback effect, which in certain cases, enhances device performance.

Certain embodiments are related to semiconductor structures comprising substrates having relatively high electronic conductivities. For example, in accordance with certain embodiments, the structures include substrates comprising silicon having a relatively high electronic conductivity. In certain embodiments, electronically conductive substrates can reduce issues arising from increased thermal resistance within the semiconductor structure. For example, without wishing to be bound by any particular theory, it is believed that the use of substrates having regions with relatively high electronic conductivity reduces the amount of heat that is generated via resistive heating during operation of the device. It is further believed that the reduction in the amount of heat generated by the device leads to enhanced device performance (e.g., an increase in power output and/or device efficiency).

According to some embodiments, the semiconductor structures comprise relatively thick III-nitride layers. In certain embodiments, use of a relatively thick III-nitride layer (e.g., a relatively thick epitaxial GaN layer) reduces capacitive coupling between electrically conductive components of the semiconductor structure (e.g., conductive metal structures, such as electrodes, of transistors) and the substrate (e.g., a silicon-containing substrate which can be electronically conductive). The reduction in capacitive coupling can reduce RF current displacement in the semiconductor structures, which can ultimately result in higher operating temperatures of the semiconductor structures, enhanced operating efficiency, and/or other performance improvements.

According to certain embodiments, the interfacial area between the III-nitride material surface and electronically conductive components in a semiconductor device is relatively small. This can be achieved, for example, by using small ohmic or Schottky contacts. In certain embodiments, reducing and/or minimizing the contact area between electrode structures (e.g., metal structures) and the III-nitride material surface results in the reduction of capacitive coupling between the electrode structures and the substrate (e.g., a silicon-containing substrate, which can be electronically conductive). Not wishing to be bound by any particular theory, the ohmic or Schottky contacts can, in certain cases, capacitively couple to the substrate, which can result in the loss of energy during operation of the semiconductor device. It is believed that when large ohmic or Schottky contacts are used, capacitive coupling increases, which can result in increased displacement current, resulting in dissipated power in the substrate. Conversely, as the contact area is decreased, capacitive coupling to the substrate and displacement current can be decreased, leading to enhanced performance.

According to some embodiments, a dielectric region is located over the substrate and over the III-nitride material region. In certain embodiments, the dielectric region provides a surface on which large contact pads are formed. According to some embodiments when large contact pads are present on the thick dielectric region, the thick dielectric region separates the large contact pads from the III-nitride material region and underlying substrate, resulting in reduced capacitive coupling to the substrate (e.g., a silicon-containing substrate, which can be electronically conductive). In certain embodiments, a large contact pad present on a thick dielectric region reduces unwanted capacitance associated with the contact pad.

In certain embodiments, the semiconductor structures described herein comprise a backside ground that couples an electronically conductive material (e.g., a contact pad and/or an electrode) of a device to the electronically conductive substrate through the thickness of the III-nitride material region. According to certain embodiments, the electronically conductive material that is coupled to the electronically conductive substrate is coupled to the source electrode and/or drain electrode. In some embodiments, the electronically conductive material reduces the capacitance to the silicon-containing substrate (e.g., to ground) by providing an alternate source of grounding.

Some embodiments described herein are related to semiconductor structures and devices with improved performance. For example, in accordance with certain embodiments, the semiconductor structures exhibit increased efficiency at elevated temperatures. Furthermore, in certain embodiments, the semiconductor structures have small drops in efficiency upon increasing operating temperatures of the semiconductor structures.

Certain embodiments are related to inventive semiconductor structures. Certain inventive semiconductor structures described herein can comprise a substrate and a III-nitride material region located over the substrate (e.g., at least one region comprising III-nitride material formed over a surface region of the substrate). In some cases, a substrate can have one or more semiconductor layers and may further include one or more thin-film dielectric layers. A substrate may be made of bulk silicon or may comprise silicon in various embodiments. In some implementations, the III-nitride material region can include one or more thin-film dielectric layers.

FIG. 1A is a cross-sectional schematic illustration of a semiconductor structure 100A, according to certain embodiments. Semiconductor structure 100A comprises substrate 110 and a III-nitride material region 120 located over surface 135 of substrate 110 (and, thus, over surface region 130 of substrate 110). According to certain embodiments, surface 135 of substrate 110 can be a silicon surface. For example, surface 135 may correspond to a surface of a silicon wafer, in some embodiments. In certain embodiments, the top surface (e.g., surface 135 in the figures) may correspond to a silicon surface of a composite substrate (e.g., comprising a silicon layer and one or more additional underlying layers). For example, in some embodiments, surface 135 may correspond to a surface of a silicon portion of a silicon-on-insulator substrate, surface 135 may correspond to a surface of a silicon-on-sapphire substrate.

According to certain embodiments and as described above, the semiconductor structures described herein comprise a substrate. In certain embodiments, the substrate comprise silicon (i.e., a substrate containing the element silicon in any form). Some embodiments are related to substrates at least a portion of which is made of silicon. Certain embodiments are related to substrates at least a portion of which (or all of which) is made of bulk silicon. As used herein, bulk silicon refers to doped or undoped elemental Si in any form. Substrates that contain bulk silicon can include, for example, at least a layer of doped or undoped silicon, as opposed to silicon oxides, silicon carbides, silicon nitrides, etc. Examples of substrates comprising silicon that can be used in various embodiments include, but are not limited to, bulk silicon wafers, silicon-on-insulator substrates, and substrates made of or comprising alloys of silicon (e.g., silicon germanium and silicon carbide substrates). In some embodiments, the substrate comprises a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, and silicon-on-sapphire (SOS) substrates. Suitable silicon substrates also include composite substrates that have a silicon wafer bonded to another material such as diamond or other crystallographic forms of carbon, aluminum nitride (AlN), silicon carbide (SiC), or other crystalline or polycrystalline materials. Silicon substrates having different crystallographic orientations may be used, though single crystal silicon substrates may be preferred in certain, but not necessarily all, embodiments. In some embodiments, silicon (111) substrates are used. In certain embodiments, silicon (100) or (110) substrates are used. As used herein, a silicon carbide substrate refers to any substrate that includes a silicon carbide surface. Examples of suitable silicon carbide substrates include substrates that are composed entirely of silicon carbide (e.g., bulk silicon carbide wafers), silicon carbide composite wafers (e.g., wafers comprising a silicon carbide layer and a second layer of a material that is not silicon carbide), and the like.

In certain embodiments, at least a portion of the substrates described herein are electronically conductive. In some embodiments, the substrate comprises at least one layer that is electronically conductive. For example, in certain embodiments in which silicon substrates are used, the silicon substrate (or at least the silicon portion of the substrate for substrates that include a silicon portion formed on another material) is electronically conductive. As used herein, a material (e.g., a region, a layer, a substrate, etc.) is considered to be electronically conductive when it has an electronic resistivity of less than 0.10 Ω·cm when at 25° C. In certain embodiments, the region of the substrate underneath an active region of the semiconductor structure has a resistivity of about 0.01 Ω·cm to about 0.10 Ω·cm. For example, electronically conductive materials (e.g., regions, layers, substrates) have electronic resistivities of less than 0.10 Ω·cm in some embodiments, less than 0.05 Ω·cm in some embodiments, less than 0.03 Ω·cm in some embodiments, less than 0.01 Ω·cm in some embodiments, less than 0.001 Ω·cm in some embodiments, less than 0.0001 Ω·cm in some embodiments, less than 0.00001 Ω·cm in some embodiments, or yet less than 0.000001 Ω·cm in some embodiments, when the electronically conductive materials are at 25° C. According to certain embodiments, the electronic resistivity of the material (e.g., a layer, a substrate) when at 25° C. is greater than 0 Ω·cm in some embodiments, greater than $1\times10^{-10}$ Ω·cm in some embodiments, greater than $1\times10^{-9}$ Ω·cm in some embodiments, greater than $1\times10^{-8}$ Ω·cm in some embodiments, greater than $1\times10^{-6}$ Ω·cm in some embodiments, greater than $1\times10^{-4}$ Ω·cm in some embodiments, greater than $1\times10^{-2}$ Ω·cm in some embodiments, and yet greater than 0.01 Ω·cm in some embodiments. Combinations of these ranges are also possible, (e.g., greater than $1\times10^{-10}$ Ω·cm and less than 0.10 Ω·cm).

The electronic resistivity of a material (e.g., a region, a layer, a substrate, etc.) is measured laterally across the material (i.e., in a direction perpendicular to the thickness of the substrate). Those of ordinary skill in the art are capable of determining the electronic resistivity of a material. For example, the electronic resistivity of a material (e.g., a region, a layer, a substrate, etc.) can be determined by first making a resistance measurement across a known geometry (e.g., by placing two electrodes across the material). The resistivity of the material can then be determined as follows:

$$\rho = R\frac{A}{l}$$

(1)

where R is the measured electrical resistance, A is the cross-sectional area over which the resistance measurement was taken, and l is the length of the area over which the resistance measurement was taken. The conductivity of the region (also sometimes referred to as the "conductance") is the inverse of the resistivity of the region.

In some embodiments, the substrate comprises at least one portion having a length of at least 1 micrometer, at least 10 micrometers, at least 100 micrometers, at least 1 mm, or at least 10 mm, wherein that portion also has an electronic resistivity of less than 0.10 Ω·cm (or within any of the ranges outlined above) when at 25° C.

Electronically conductive substrates (e.g., comprising silicon, such as silicon substrates or other substrates comprising silicon) may be particularly useful in some (but not necessarily all) structures that are used to form devices that operate at high frequencies (e.g., RF devices). According to certain embodiments, the high conductivity can reduce so-called substrate losses which otherwise may arise and sacrifice performance. These substrate losses may render substrates with higher resistivities unsuitable in high frequency devices.

In certain embodiments, a substrate having one or more integrated circuit components (such as devices and/or discrete components) may have various device layers, homojunctions, heterojunctions, or circuit layers embedded in the substrate, or formed on the front-side and/or back-side of the substrate. Such substrates may be semi-spec standard thickness, or thicker, or in some implementations thinner than semi-spec standards. In some cases, for example, an Si substrate may have a diameter of less than one hundred millimeters (100 mm), while in other implementations, the substrate may have a diameter in a range from approximately 100 mm to approximately 150 mm. In certain embodiments, the substrate diameter may be in a range from approximately 150 mm to approximately 200 mm, or larger. In still other embodiments, the substrate may include a textured surface or may have a non-planar surface.

Embodiments include substrates of smaller size than a full wafer. The term "substrate" can also refer to a substrate having properties as described above and having a size of a chip, die, or discrete device. In certain implementations, a substrate of a chip, die, or discrete device is singulated from a larger wafer.

In some embodiments, the substrate may also have any of a variety of suitable thicknesses. According to some embodiments, the substrate has a thickness of less than 150 micrometers. According to certain embodiments, the substrate has a thickness of less than 100 micrometers, less than 50 micrometers, or less. According to certain embodiments, the thickness of the substrate may be selected based on the final device and heteroepitaxial specifications (e.g., wafer warp and bow), for example, as needed for successful high yielding semiconductor fabrication. In some embodiments, the thickness of the substrate may be semi-spec thicknesses typical of the wafer diameter used in high volume wafer silicon manufacturing.

As used herein, the term "III-nitride material" refers to any Group III element-nitride compound. Non-limiting examples of III-nitride materials include boron nitride (BN), aluminum nitride (AlN), gallium nitride (GaN), indium nitride (InN), and thallium nitride (TlN), as well as any alloys including Group III elements and Group V elements (e.g., $Al_xGa_{(1-x)}N$, $Al_xIn_yGa_{(1-x-y)}N$, $In_yGa_{(1-y)}N$, $GaAs_aP_bN_{(1-a-b)}$, $Al_xIn_yGa_{(1-x-y)}As_aP_bN_{(1-a-b)}$, and the like). Typically, when present, arsenic and/or phosphorus are at low concentrations (e.g., less than 5 weight percent). III-nitride materials may be doped n-type or p-type, or may be intrinsic. III-nitride materials may have any polarity including but not limited to Ga-polar, N-polar, semi-polar, or non-polar crystal orientations. A III-nitride material may also include either the Wurtzite, Zincblende, or mixed polytypes, and may include monocrystalline, polycrystalline, or amorphous structures.

In some embodiments, the III-nitride material region comprises a gallium nitride material. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_aP_bN_{(1-a-b)}$), aluminum indium gallium arsenide phosphoride nitride ($Al_xIn_yGa_{(1-x-y)}As_aP_bN_{(1-a-b)}$), amongst others. In certain embodiments, the III-nitride material region comprises GaN. According to some embodiments, the III-nitride material region is an epitaxial III-nitride material region. In certain embodiments, the III-nitride material region comprises a heterojunction, a two-dimensional electron gas (2DEG) region, and/or two-dimensional hole gas (2DHG). In some embodiments, the III-Nitride material region comprises doped homojunctions and/or doped heterojunctions.

Typically, when present, arsenic and/or phosphorus are at low concentrations (i.e., less than 5 weight percent). In certain embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic.

According to some embodiments, the thickness of the III-nitride material device region (e.g., which may comprise at least one gallium nitride material layer) and the number of different layers within the III-nitride material device region are dictated, at least in part, on the application in which the semiconductor structure is used. In some embodiments, the III-nitride material region is thick. According to certain embodiments, at a minimum, the total thickness of the III-nitride material region (or any individual layer within the III-nitride material device region) is sufficient to permit formation of the desired semiconductor structure or device. Certain embodiments are related to a III-nitride material region having a thickness of at least 2.0 micrometers located over the substrate. In some embodiments, the thickness of the III-nitride material device region is greater than 2.0 micrometers, or greater than 3.0 micrometers, or greater than 4.0 micrometers, greater than 5.0 micrometers, greater than 6.0 micrometers, greater than 7.0 micrometers, greater than 8.0 micrometers, or greater than 9.0 micrometers. According to certain embodiments, the thickness the III-nitride material device region is less than 10.0 micrometers, less than 9.0 micrometers, less than 8.0 micrometers, less than 7.0 micrometers, less than 6.0 micrometers, less than 5.0 micrometers, less than 4.0 micrometers, less than 3.0 micrometers, or less than 2.0 micrometers. Combinations of these ranges are also possible (e.g., greater than 2.0 micrometers and less than 5.0 micrometers, greater than 3.0 micrometers and less than 4.0 micrometers). Some embodiments are related to a III-nitride material region having a thickness of 4.8 micrometers.

In some embodiments, the III-nitride material region is located over the substrate. When a structure (e.g., layer and/or device) is referred to as being "on," "over," or "overlying" another structure (e.g., layer or substrate), it is over at least a portion of that structure. In some cases, a structure that is referred to as being "on," "over," or "overlying" another structure is over the entirety of that structure. When a structure (e.g., layer and/or device) is referred to as being "on," "over," or "overlying" another structure (e.g., layer or substrate), it can be directly on the structure, or an intervening structure (e.g., a layer, air gap) also may be present. A structure that is "directly on" or "in direct contact with" another structure means that no intervening structure is present. It should also be understood that when a structure is referred to as being "on" or "over" another structure, it may cover the entire structure, or a portion of the structure. In addition, when a structure is referred to as being "on" or "over" another structure, it may be embedded within that structure.

According to some embodiments, the III-nitride material region comprises an optional III-nitride nucleation layer or intermediate layer. For example, referring to the exemplary embodiment of FIG. 1B, III-nitride material region 120 comprises III-nitride material transition layer 170. It should be understood that transition layer 170 is optional, and in other embodiments, III-nitride material region 120 does not include transition layer 170.

Figure 1B:
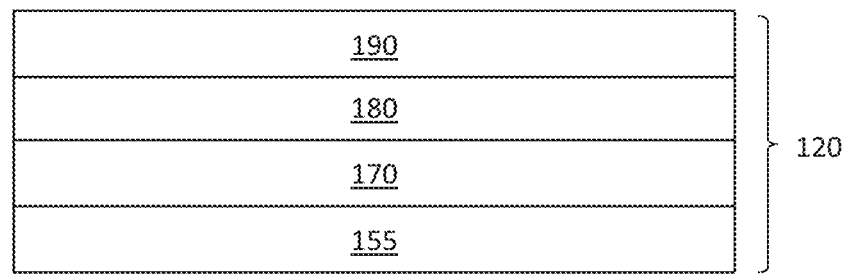
FIG. 1B is a cross-sectional schematic illustration of a multi-layered III-nitride material region, according to some embodiments.

In FIG. 1B, transition layer 170 is formed directly on nucleation layer 155. In other embodiments, one or more materials may be positioned between transition layer 170 and nucleation layer 155.

The nucleation layer can, according to certain embodiments, prepare a surface of the substrate for growth of III-nitride material over the substrate. In certain cases, III-nitride material (e.g., gallium nitride materials and/or other III-nitride materials) can be difficult to grow heteroepitaxially directly on the substrate (and/or another region that is over a surface of the substrate), for example, because the III-nitride material one wishes to grow may have a lattice structure and/or a lattice constant which is significantly different than the substrate or other underlying region. According to certain embodiments, the nucleation layer forms an appropriate template to transition from the lattice of the substrate (or other underlying layer) to a template more suitable for III-nitride growth. In certain embodiments, the nucleation layer can accommodate the difference in the lattice constants of an overlying layer in the III-nitride material region (e.g., the III-nitride material region portion in direct contact with the nucleation layer) and the region underneath the nucleation layer (e.g., the substrate and/or another underlying region, which in some cases, may be in direct contact with the nucleation layer). In some embodiments, the nucleation layer can accommodate the difference in the thermal expansion coefficients of an overlying layer in the III-nitride material region (e.g., the III-nitride material region portion in direct contact with the nucleation layer) and the region underneath the nucleation layer (e.g., the substrate and/or another underlying region, which in some cases, may be in direct contact with the nucleation layer). According to certain embodiments, the nucleation layer can accommodate both the difference in lattice constants and the difference in thermal expansion coefficients of an overlying layer in the III-nitride material region and the region underneath the nucleation layer. In some embodiments, the nucleation layer may also act as a reaction barrier between the III-nitride material region and the silicon substrate. For example, in organometallic vapor phase epitaxy (OMVPE) growth environments (e.g., metal-organic chemical vapor deposition (MOVCD)), the introduction of gallium species in direct proximity to the silicon surface can result in the formation and accumulation of free gallium atoms and deleterious formation of SiN preventing proper initiation of GaN heteroepitaxy. This can be prevented by first forming an AlN heteroepitaxy nucleation layer which acts to seal the silicon surface and reacting with subsequent growth of GaN or gallium containing III-Nitride material layers.

According to certain embodiments, the nucleation layer comprises an aluminum nitride material. As used herein, the phrase "aluminum nitride material" refers to aluminum nitride (AlN) and any of its alloys, such as aluminum gallium nitride ($Al_{(1-x)}Ga_{(x)}N$), aluminum indium nitride ($Al_{(1-x)}In_{(x)}N$), aluminum indium gallium nitride ($Al_{(1-x-y)}In_{(x)}Ga_{(y)}N$), aluminum indium gallium arsenide phosphoride nitride ($Al_{(1-x-y)}In_xGa_yAs_aP_bN_{(1-a-b)}$), amongst others. In certain embodiments, the aluminum nitride material has a high concentration of aluminum and includes little or no amounts of gallium and/or indium. In high aluminum concentration embodiments, the sum of (x+y) may be less than 0.4, less than 0.2, less than 0.1, or even less. In some cases, it is preferable for the aluminum nitride material to have a composition of MN (i.e., x+y=0). Aluminum nitride materials may be doped n-type or p-type, or may be intrinsic. In certain embodiments, the use of an aluminum nitride material as the nucleation layer may be preferred in certain cases in which the III-nitride material is formed on the substrate without the use of a diffusion barrier region between the III-nitride material and the substrate.

According to certain embodiments, the nucleation layer may comprise one or more layers. When multiple nucleation layers are present, the nucleation layers may be made of the same material or different materials. In addition, in certain embodiments in which multiple nucleation layers are present, the nucleation layers may be formed using different semiconductor growth conditions. For example, in some embodiments, the nucleation layers may comprise two or more aluminum nitride material layers formed at different growth temperatures (e.g., one at a relatively low temperature and another at a relatively high temperature). In some embodiments, other growth conditions (e.g., pressure, reactant flow rates, etc.) may be varied from the growth of one nucleation layer to another.

Suitable materials from which the III-nitride material nucleation layer may be formed include, but are not limited to, aluminum nitride materials (e.g., aluminum nitride, aluminum nitride alloys). The III-nitride material nucleation layer typically has a constant composition.

In some embodiments, the nucleation layer comprises a first aluminum nitride-based layer and a second aluminum nitride-based layer. The aluminum nitride-based nucleation layer can include aluminum nitride as well as other optional elements, such as silicon and/or oxygen. For example, in some embodiments, the aluminum nitride-based nucleation layer can be a thin (e.g., from about 10 Angstroms to about 20 Angstroms, or thinner) amorphous or non-crystalline (unordered) material comprising aluminum and nitrogen, and optionally silicon and/or oxygen. In some embodiments, the amorphous aluminum nitride-based layer may also act as a diffusion barrier region as discussed further below. In other embodiments, one or more separate diffusion barrier layers can be used in combination with the aluminum-nitride based layer.

In certain embodiments, a III-nitride material nucleation layer has a single crystal structure. It may be advantageous, in some but not necessarily all embodiments, for a III-nitride material nucleation layer to have a single crystal structure because such structures can facilitate formation of one or more single crystal layers (e.g., gallium nitride material layers) above the III-nitride material nucleation layer.

It should also be understood that a III-nitride material nucleation layer may not have a single crystal structure and may be amorphous or polycrystalline, though certain of the advantages associated with the single crystal nucleation layers may not be achieved in some such embodiments.

The III-nitride material nucleation layer may have a number of suitable thicknesses. For example, the III-nitride material nucleation layer may have a thickness of between about 10 nanometers and about 5 micrometers, though other thicknesses are also possible. In certain embodiments in which more than one nucleation layer is employed, the combined thickness of the nucleation layers may be between about 10 nanometers and about 5 micrometers, though other thicknesses are also possible.

According to certain embodiments, the III-nitride material region comprises an optional III-nitride transition layer. For example, referring to the exemplary embodiment of FIG. 1B, III-nitride material region 120 comprises III-nitride material transition layer 170. It should be understood that transition layer 170 is optional, and in other embodiments, III-nitride material region 120 does not include transition layer 170.

In FIG. 1B, transition layer 170 is formed directly on nucleation layer 155. In other embodiments, one or more materials may be positioned between transition layer 170 and nucleation layer 155.

In some embodiments, the III-nitride transition layer is compositionally graded. In some embodiments, the III-nitride material transition layer comprises a compositionally graded III-nitride material. Examples of such materials are described, for example, in U.S. Pat. No. 6,649,287, issued Nov. 18, 2003, and entitled "Gallium Nitride Materials and Methods," which is incorporated herein by reference in its entirety for all purposes. Compositionally-graded transition layers have a composition that is varied across at least a portion of the layer (e.g., across at least a portion of the thickness of the layer). For example, according to certain embodiments in which the transition layer comprises a III-nitride material layer, the concentration of at least one of the elements (e.g., Ga, Al, In) of the III-nitride material is varied across at least a portion of the thickness of the transition layer. Compositionally-graded transition layers are particularly effective, according to certain embodiments, in reducing crack formation in gallium nitride material regions formed on the transition layer, for example, by lowering thermal stresses that result from differences in thermal expansion rates between the gallium nitride material and the substrate (e.g., silicon). Compositionally-graded transition layers may also contribute to reducing generation of screw dislocations in the III-nitride material layer(s)/region(s) (e.g., gallium nitride material layer(s)). In some cases, the compositionally-graded transition layers may also contribute to reducing mixed and edge dislocation densities.

The composition of a compositionally-graded III-nitride material layer can be graded, for example, discontinuously (e.g., step-wise) or continuously. The composition of the compositionally-graded layer can be graded across the entire thickness of the layer, or across only a portion of the thickness of the layer.

According to one set of embodiments, the transition layer is compositionally-graded and formed of an alloy of gallium nitride such as $Al_xIn_yGa_{(1-31\ x-y)}N$, $Al_xGa_{(1-x)}N$, and $In_yGa_{(1-y)}N$. In some such embodiments, the concentration of at least one of the elements (e.g., Ga, Al, In) of the alloy is varied across at least a portion of the thickness of the transition layer. In certain embodiments in which the transition layer has an $Al_xIn_yGa_{(1-y)}N$ composition, x and/or y may be varied. In certain embodiments in which the transition layer has a $Al_xGa_{(1-x)}N$ composition, x may be varied. In certain embodiments in which the transition layer has a $In_yGa_{(1-y)}N$ composition, y may be varied.

In certain embodiments, it is desirable for the transition layer to have a low gallium concentration at a back surface which is graded to a high gallium concentration at a front surface. It has been found that such transition layers can be particularly effective in relieving internal stresses within overlying gallium nitride material layers. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In some embodiments, the semiconductor structure includes an aluminum nitride nucleation layer and a compositionally-graded transition layer. In some embodiments, the compositionally-graded transition layer has a composition of $Al_xGa_{(1-x)}N$, where x is continuously graded from a value of 1 at the back surface of the transition layer to a value of 0 at the front surface of the transition layer. One discontinuous grade may include steps of AlN, $Al_{0.6}Ga_{0.4}N$, and $Al_{0.3}Ga_{0.7}N$ (step grades) proceeding in a direction toward the gallium nitride material layer. In another example of a discontinuously graded III-nitride material transition layer, there may be periodic layers and/or intervening layers inserted between one or more of the step layers making up the step grade. The periodic layers and/or intervening layers, for example, may be layers of aluminum nitride material (e.g., AlN or AlGaN) formed at the same or different (e.g., lower) temperatures than are used to form the step grade layers. Another example of periodic layers or intervening layers include silicon nitride and/or aluminum silicon nitride layers, which can act as masking layers to pin the vertical threading and screw dislocations which may extend from one layer to the next.

It should be understood that, in other cases, the transition layer may have a constant composition and may not be compositionally-graded. In some cases (e.g., in certain cases in which the substrate is not a silicon substrate), the transition layer may have a constant composition. Suitable compositions include, but are not limited to, aluminum nitride-based materials (e.g., aluminum nitride, aluminum nitride alloys) and gallium nitride materials. In these constant composition embodiments, the transition layer may be similar to the nucleation layer described above.

According to certain embodiments, the transition layer may be made of, at least in part, one or more superlattices. In some cases, a superlattice of a transition layer can be formed as a strained layer superlattices (SLS). In some cases, a superlattic of a transition layer can be formed as a multiple quantum wells (MQW). In some cases, a superlattic of a transition layer can be formed as a compositionally-graded superlattice or compositionally graded MQW. Embodiments also include transition layers that have any combination of the foregoing superlattice types. Any of the foregoing superlattice types may include carbon doping.

In some cases, a superlattice or combination of superlattices of the foregoing types can be present outside of a transition layer. In yet additional embodiments, a superlattice or combination of superlattices of the foregoing types can be present only and there may be no other transition layer.

In certain embodiments, the III-nitride material region comprises an optional III-nitride buffer layer. For example, referring to the exemplary embodiment of FIG. 1B, III-nitride material region 120 comprises III-nitride material buffer layer 180. It should be understood that buffer layer 180 is optional, and in other embodiments, III-nitride material region 120 does not include buffer layer 180.

The buffer layer can, according to certain embodiments, provide a surface for the growth of epitaxial III-nitride material above the buffer layer.

According to certain embodiments, the buffer layer comprises an aluminum gallium nitride material. In some such embodiments, the buffer layer comprises $Al_xGa_{(1-x)}N$. In certain embodiments in which the buffer layer comprises $Al_xGa_{(1-x)}N$, x may be less than about 0.2, less than about 0.1, less than about 0.05, or less than about 0.01. In some embodiments, the buffer layer comprises GaN.

The buffer layer may be formed over the transition layer, for example, using any of a number of known growth techniques. For example, according to certain embodiments, the buffer layer may be formed over the transition layer using molecular-beam epitaxy (MBE) or metalorganic vapor phase epitaxy (MOVPE). In certain embodiments (including certain embodiments in which the desired epitaxial material structure will be used in the fabrication of devices such as field effect transistors (FETs), Schottky diodes, and/or High Electron Mobility Transistors (HEMTs)), it may be desirable to form a channel layer above the buffer layer. Typically, in some such embodiments, it would then be desirable for the buffer layer bandgap to be greater than or equal to the bandgap of the channel layer. For example, in certain transistor designs using back barriers, the channel layer may comprise gallium nitride while the buffer layer may comprise aluminum gallium nitride. In some such cases, the buffer layer may comprise a substantially uniform composition of AlGaN with a bandgap larger than the channel layer but smaller than the underlying transition layer alloy composition. In other examples, the buffer layer may itself be a compositionally graded layer which has a larger aluminum composition formed near the transition layer, and a smaller aluminum concentration formed near the channel layer.

In some embodiments, the composition of the channel layer and the buffer layer may be substantially the same. Although the intrinsic material properties of GaN materials can allow for the formation of high performance devices in theory, conventional growth environments of GaN nitride materials typically include impurity sources. For example, carbon impurities resulting from metalorganic precursors may be, in some cases, introduced into the GaN materials grown using MOCVD, also known more generically as organometallic vapor phase epitaxy (OMVPE). The presence of these impurities in the GaN growth environment can cause unintentional doping in or near critical device layers, for example the channel layer. In certain embodiments (e.g., including certain embodiments in which enhancing the standoff voltage is desired), it may be desirable to incorporate impurities into the buffer layer. For example, the addition of impurities such as carbon (C) and iron (Fe) into the buffer layers of gallium nitride based transistors may increase the vertical and lateral breakdown voltage capability and/or reduce the leakage levels of the device. However, addition of certain impurities within close proximity to the channel layer may result in dispersive device performance (e.g., exhibited by high levels of drain and gate lag). As such, in certain embodiments, it may be beneficial to form the buffer layer such that there is a substantially low impurity concentration throughout the thickness of the buffer layer. In certain other embodiments, there may be a graded (continuously or discontinuously) impurity level within the buffer layer, with a higher impurity concentration near the transition layer, and a lower impurity concentration formed nearer to the channel layer. In certain other embodiments, the transition layer(s) may also include one or more impurities. In some such embodiments, the concentration of impurities in the transition layer(s) may be higher than the concentration(s) of the impurities within the buffer layer and/or within the channel layer.

In certain embodiments, the III-nitride material region comprises an optional III-nitride device region. For example, referring to the exemplary embodiment of FIG. 1B, III-nitride material region 120 comprises III-nitride material device region 190. It should be understood that device region 190 is optional, and in other embodiments, III-nitride material region 120 does not include device region 190.

In some embodiments, the III-nitride material region includes at least one gallium nitride material layer. For example, in certain embodiments, the III-nitride material device region 190 comprises at least one gallium nitride material layer. Referring to FIG. 1B, for example, in some embodiments, III-nitride material device region 190 can include at least one gallium nitride material layer. As described further below, oftentimes, the structure includes more than one gallium nitride material layer which form, in part, the active region of a device.

Figure 1C:
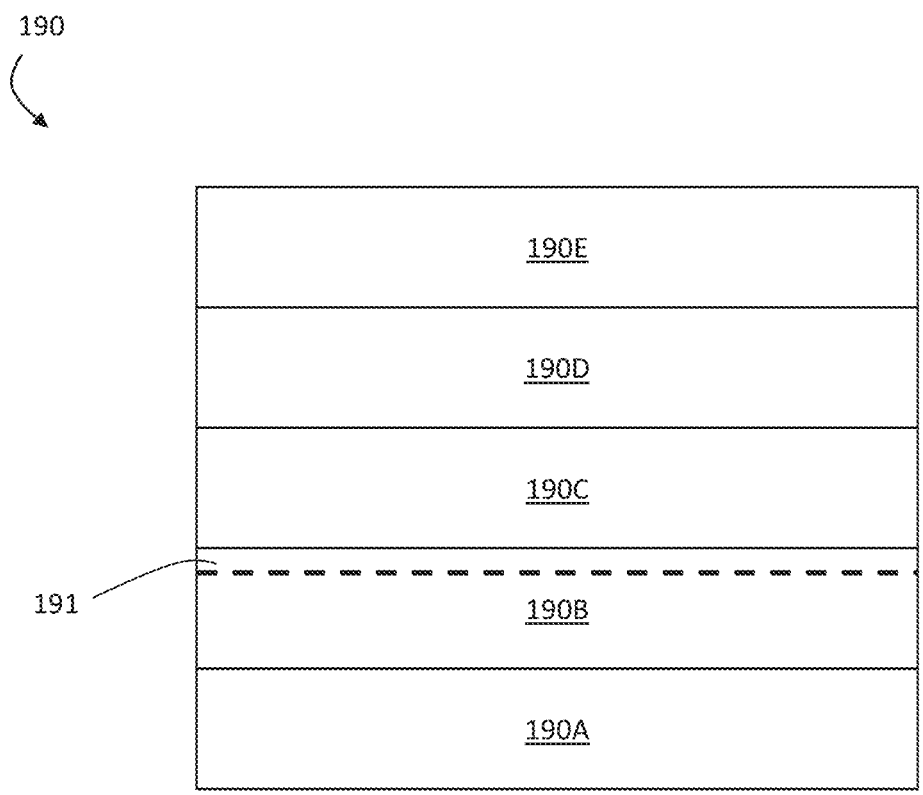
FIG. 1C is a cross-sectional schematic illustration of a multi-layered III-nitride material device region, according to certain embodiments.

As noted above, in some embodiments, the device region 190 comprises one or more III-nitride material layers. FIG. 1C is a cross-sectional schematic illustration of a III-nitride material device region 190, according to certain embodiments. In some embodiments, the III-nitride material device region comprises an optional back barrier layer. According to certain embodiments, when present, the optional back barrier layer is the layer of the III-nitride material region that is the closest to the underlying substrate. For example, in FIG. 1C, exemplary III-nitride material device region 190 comprises optional back barrier layer 190A, which as shown in FIG. 1C, is the closest of the layers within III-nitride material region to substrate 110. When used, the optional back barrier can create a double heterostructure (e.g., due to the bandgap off sets with the buffer layer, such as a GaN buffer layer). This may be desirable, in certain cases, in devices which operate under higher drain bias as they can prevent injection of electrons from the channel layer into the buffer layer, thereby reducing drain leakage and punch through of the device. Additionally, in some cases, the buffer layer may contain higher levels of impurities, intentionally (e.g., iron and carbon used to increase breakdown voltage) or unintentionally (e.g., carbon impurities incorporated into the buffer layer as byproducts from the crystal growth methodologies employed). These impurities and/or other defects may, in certain cases, act as trapping centers and cause deleterious performance results (e.g., memory effects) for the device if electrons from the channel layer penetrate into the underlying buffer layer. Back barrier layers can, in certain cases, help confine the electrons in the channel layer and prevent spill over into the more defective buffer layer and/or other underlying III-nitride layers. In certain embodiments, one or more AlGaN back barrier layers may be used. In certain embodiments, one or more InGaN back barrier layers may be used. In some embodiments, one or more AlInN back barrier layers may be employed. According to certain embodiments, the thickness of the back-barrier (either in the form of a single layer or a combination of layers) is in the range of about 1-300 angstroms.

In certain cases, the III-nitride material device region 190 (e.g., which may comprise at least one gallium nitride material layer) has a single crystal (i.e., monocrystalline) structure. In some cases, the III-nitride material device region (e.g., which may comprise at least one gallium nitride material layer) includes one or more layers having a Wurtzite (hexagonal) structure.

In some embodiments, the III-nitride material device region comprises an optional channel layer. The channel layer may be positioned, according to certain embodiments, over the back barrier layer when present. For example, in FIG. 1C, exemplary III-nitride material device region 190 comprises optional channel layer 190B, which as shown in FIG. 1C, is positioned over optional back barrier layer 190A. In other embodiments in which the back barrier layer is not present, the channel layer can be the layer within the III-nitride material device region that is closest to the underlying substrate. According to certain embodiments, the channel layer composition is selected with a smaller bandgap than either the spacer and or front-barrier layers (described in more detail below). Such arrangements can create a heterostructure forming a two-dimensional electron gas (2DEG) near the interface between the channel layer and an overlying layer (e.g., the spacer layer and/or the front barrier layer, described in more detail below). Such arrangements may be present, for example, in High Electron Mobility Transistors (HEMTs) and Schottky diodes. Electron flow through HEMTs and HFETs between the source and the drain of the device can, in some instances, be controlled by the gate of the device which acts to interrupt electron current flow between the source and drain. The channel layer can be formed, in certain cases, such that impurities or other point defects (which can act as trapping centers) are kept at a relatively low level, for example, to avoid impeding the mobility of the electrons and/or to avoid adding memory effects to the device. Trapping centers can adversely impact linearity in RF devices and turn-on and turn-off (switching) speeds in power management devices. The thickness of the channel layer can vary, for example, depending on the operational voltage desired for the device. As the drain voltage is increased, the depth of the depletion area between the gate and drain generally increases. In certain cases, if the channel is formed too thin, punch through into the buffer layer can occur, which can result in drain leakage and breakdown of the device.

According to certain embodiments, the III-nitride material device region comprises an optional spacer layer (sometimes also referred to as an interlayer). The spacer layer may be positioned, according to certain embodiments, over the channel layer and/or the back barrier layer when present. For example, in FIG. 1C, exemplary III-nitride material device region 190 comprises optional spacer layer 190C, which as shown in FIG. 1C, is positioned over optional back barrier layer 190A and over optional channel layer 190B. In some embodiments, the interface between the channel layer and the spacer layer can form a 2-dimensional electron gas region (i.e., a "2DEG region"). For example, in FIG. 1C, 2DEG region 191 is located at the interface of spacer layer 190C and channel layer 190B. Typically the spacer layer, when used, is formed with a high aluminum content. In some embodiments, the spacer layer is configured to have a relatively high bandgap offset with the underlying channel layer (e.g., by using a relatively high aluminum content in the spacer layer), which can lead to enhancement of the 2DEG. In certain embodiments, the spacer layer comprises $Al_xGa_{(1-x)}N$. In certain such embodiments, $(1-x)=0.5$ or greater. In some embodiments, the spacer layer comprises AlN. According to certain embodiments, the spacer layer is relatively thin (for example, less than about 50 Angstroms, less than about 20 Angstroms, or less). The use of a relatively thin spacer layer can avoid, in some cases, adversely impacting the ohmic contact resistance of the source and drain to the 2DEG and channel layer of the device.

The III-nitride material device region comprises, in some embodiments, an optional front barrier layer. The front barrier layer may be positioned, according to certain embodiments, over the spacer layer, the channel layer, and/or the back barrier layer when present. For example, in FIG. 1C, exemplary III-nitride material device region 190 comprises optional front barrier layer 190D, which as shown in FIG. 1C, is positioned over optional back barrier layer 190A, over optional channel layer 190B, and over optional spacer layer 190C. According to certain embodiments (and as described above), if the device structure is a HEMT and/or if a 2DEG is desired, the optional front-barrier 190A can be formed over the channel layer 190B (or spacer layer 190C, if used) to form a heterojunction The composition of the front-barrier is selected, according to certain embodiments, such that the carrier density and/or sheet charge of the 2DEG is tailored (e.g., optimized) for the device desired. In certain embodiments, the front-barrier layer comprises AlGaN. According to certain embodiments in which an AlGaN-containing front-barrier layer is used, the aluminum concentration of the AlGaN front-barrier is less than about 30 atomic percent (at%), less than about 25 at%, or between about 15 at% and about 20 at%. In certain embodiments, it may be desirable to match or substantially match the lattice constant between the channel and the front-barrier, and to maintain a bandgap offset, for example, to create a 2DEG.

In some such cases, an AlInN or InGaN front-barrier layer can be created to provide the bandgap offset and match or substantially match the lattice constants.

According to some embodiments, the III-nitride material device region comprises an optional cap layer. The cap layer may be positioned, according to certain embodiments, over the front barrier layer, the spacer layer, the channel layer, and/or the back barrier layer when present.

For example, in FIG. 1C, exemplary III-nitride material device region 190 comprises optional cap layer 190E, which as shown in FIG. 1C, is positioned over optional back barrier layer 190A, over optional channel layer 190B, over optional spacer layer 190C, and over optional front barrier layer 190D. Cap layers have been found useful in optimizing the semiconductor surface of the device structure, according to certain embodiments. For example, in certain cases in which the cap layer(s) comprises GaN, the resulting surface morphology may be smoother and/or include fewer defects, relative to surfaces formed when the cap layer(s) is not present. In addition, in some cases, a more uniform source composition may also be provided (i.e., terminated with gallium atoms rather than a mixture of gallium and aluminum atoms), which may, in some instances, aid in surface chemistry processing of the semiconductor surface and/or reduce the number of surface defects under the gate of the HFET. Such surface defects may, for example, act as shallow trapping centers and compromise the performance of the device, for example, due to increased gate leakage or lateral breakdown of the device, increased dispersion, increased gate and drain lag of the device, amongst other reductions in performance. Additionally, in certain cases, by providing a more consistently terminated semiconductor surface, the repeatability and consistency of the contact resistance may be enhanced, which can lead to higher manufacturing yields. In some embodiments, it may be desired to dope the cap layer(s). In some instances in which the barrier is doped, it may be desirable to use a GaN cap layer which is n-type doped (e.g., using silicon). The use of an n-type doped cap layer may, according to certain embodiments, reduce Idss degradation of the device. In some embodiments, the cap layer(s) may comprise a conductive GaN material layer, for example, used as a conductive field plate.

In certain embodiments, the cap layer(s) 190E may be doped p-type, for example, with magnesium. Such doping may be desirable, for example, in certain cases in which a normally OFF or enhancement mode HFET is being fabricated. As one non-limiting example, by forming a localized p-type GaN region under the gate of the HFET, the 2DEG can be disrupted and the channel depleted such that under no bias, the device is normally off. In some such cases, a positive bias to the gate would then be needed to restore the 2DEG locally under the gate and allow current flow from the source to the drain. It should be noted that one or more layers may be used as the cap layer(s), and that whether a single cap layer or multiple cap layers are employed may depend, for example, on the specifics of the design device structure.

In some embodiments, the cap layer may include an in-situ silicon nitride cap layer and/or passivation layer. Such layer(s) may be used to terminate the III-Nitride structure and/or stabilize the surface of the GaN material.

In some embodiments, the III-nitride material device region 190 comprises at least two device layers. In some embodiments, the first device layer can be the closest of two or three layers to the substrate. If three layers are present, the second device layer can be an intermediate layer (i.e., between the first device layer and a third device layer), and the third device layer can be the farthest of the three layers from the substrate. In some such embodiments, the first layer can be a channel layer, the second device layer can be a front-barrier layer, and the third device layer can be a cap layer. In some embodiments, the cap layer may not be present. Referring to FIG. 1C, for example, III-nitride material device region 190 can comprise channel layer 190B, front-barrier layer 190D, and cap layer 190E. In some such embodiments, back-barrier layer 190A and spacer layer 190C are each optional, and one or both may be present or not present. According to some such embodiments, channel layer 190B can be the closest of these three layers (i.e., channel layer 190B, front barrier layer 190D, and cap layer 190E) to the underlying substrate. In certain embodiments, it may be preferable for the second device layer to have an aluminum concentration that is greater than the concentration of aluminum in the first layer and/or the third layer. For example, referring to FIG. 1C, in some embodiments, front-barrier layer 190D can have an aluminum concentration that is greater than the concentration of aluminum in channel layer 190B and cap layer 190E. In some embodiments, the first and second layers (e.g., channel layer 190B and front-barrier layer 190D in FIG. 1C, respectively) can be gallium nitride material layers, and the value of x (as used elsewhere herein with reference to gallium nitride material layers, in subscripts to denote the relative amount of aluminum in a compound (e.g., the "x" in $Al_xGa_{(1-x)}N$)) in the second gallium nitride material layer may have a value that is between about 0.15 and about 0.3 greater, or between about 0.15 and about 0.75 greater than the value of x in the first gallium nitride material layer. For example, the second device layer may be formed of $Al_{0.26}Ga_{0.74}N$, while the first device layer may be formed of GaN. This difference in aluminum concentration may lead to formation of a highly conductive region at the interface of the second and first device layer (i.e., a 2DEG region). In some embodiments, the first device layer may be formed of GaN.

According to certain embodiments, the III-nitride material device region (e.g., which may comprise at least one gallium nitride material layer) has a low crack level. As described above, the transition layer (particularly when compositionally-graded) and/or the nucleation layer may reduce crack formation. Gallium nitride materials and other III-nitride materials having low crack levels have been described, for example, in U.S. Pat. No. 6,649,287, which is incorporated herein by reference in its entirety for all purposes. In some cases, the III-nitride material device region (e.g., which may comprise at least one gallium nitride material layer) has a crack level of less than 0.005 $\mu m/\mu m^2$. In some embodiments, the III-nitride material device region (e.g., which may comprise at least one gallium nitride material layer) has a very low crack level of less than 0.001 $\mu m/\mu m^2$. In certain cases, it may be preferable for the III-nitride material device region (e.g., which may comprise at least one gallium nitride material layer) to be substantially crack-free as defined by a crack level of less than 0.0001 $\mu m/\mu m^2$.

The optional III-nitride material nucleation layer, the optional III-nitride material transition layer, and the optional III-nitride material buffer layer are not typically (though may be) part of the active region of devices formed from structures of the embodiments described herein. As described above, these layers may be formed to facilitate deposition of the layer(s) of the III-nitride material device region.

Active regions of devices formed from certain of the structures described herein may be formed, in part, in one or more layers of the III-nitride material device region (e.g., gallium nitride material layers). Suitable gallium nitride material layer arrangements have been described, for example, in U.S. Pat. No. 7,071,498, entitled "Gallium Nitride Material Devices Including an Electrode-Defining Layer and Methods of Forming the Same," issued on Jul. 4, 2006, which is incorporated herein by reference in its entirety for all purposes. Other commonly used III-nitride material device layers include channel layers, spacer layers, barrier layers, capping layers, and P-type layers used under the gate electrodes used for the design of enhancement mode (normally OFF) transistor designs. These III-nitride material device layers may also include, according to certain embodiments, intentionally doped layers in addition to various III-nitride layers exhibiting different alloy compositions.

According to some embodiments, a semiconductor structure can comprise a second III-nitride material region 120. In certain embodiments, the semiconductor structure comprises a second III-nitride material region over the III-nitride material region 120 (second III-nitride material region not shown in FIG. 1A and 1B). In certain embodiments, the second III-nitride material region is an epitaxial III-nitride material region. In some embodiments, the second III-nitride material region comprises a III-nitride device region. According to some embodiments, the second III-nitride material region comprises a 2DEG.

The semiconductor structures described herein may, according to certain embodiments, form the basis of a variety of integrated semiconductor devices and/or discrete components (e.g., capacitors, resistors, thermistors, microstrip transmission lines, and inductors). Suitable devices include, but are not limited to, active devices like transistors (e.g., field effect transistors (FETs); either enhancement or depletion mode), Schottky diodes, junction diodes, PIN diodes, as well as light-emitting devices including light emitting diodes (LEDs) and laser diodes. Likewise, suitable devices also include integrated circuits (e.g., monolithic microwave integrated circuits (MMICs) having combinations of two or more active devices and/or discrete components, e.g., for assembly of front end modules (FEMs). It may be particularly advantageous, according to certain but not necessarily all embodiments, to use structures of the invention in devices that operate at high frequencies (e.g., at frequencies of 50 MHz or higher for certain power management applications, at frequencies of 1 GHz or higher (e.g., up to 20 GHz) for certain RF applications). Other non-limiting examples of RF applications include discretes and integrated circuits used for transmit and receive functions associated wireless and wireline communications, RF energy, RF plasma lighting, wireless charging, RF induction and microwave heating, RF spark-plugs, ISM, medical devices, RADAR, and electronic warfare and countermeasure devices. Additional applications using III-nitride devices operating at lower frequencies include power management discretes, devices, and integrated circuits used to switch, rectify, monitor, or control electric power from a source to a load (e.g., buck converters, boost converters, half bridges, H-bridges, full bridges, three-phase bridges and multi-phase bridges). Such power management devices can operate at frequencies down to 1 MHz or lower (e.g., down to about 50 kHz). In certain embodiments, there may be integrated circuits and/or multiple dice on a chip combining both RF devices and switching devices used to monitor, switch, or control the electric power delivery from a source to a load.

According to certain embodiments, the devices have active regions that are typically, at least in part, formed within the III-nitride material region (e.g., in one or more layers of the III-nitride material device region, such as one or more gallium nitride material layers). According to some embodiments, the devices include a variety of other functional layers and/or features (e.g., electrodes, dielectric regions, field plate layers, etc.).

According to certain embodiments, semiconductor devices can comprise the semiconductor structures described herein. Example devices include a transistor (e.g., a field effect transistor (FET)) or a diode. The transistor can comprise, according to certain embodiments, a source electrode and a drain electrode. The source electrode and the drain electrode can be electronically isolated from each other. For example, in some embodiments, the source electrode and the drain electrode are spatially separated. In some embodiments, the transistor further comprises a gate electrode. The gate electrode may be a Schottky gate or an insulated gate electrode. According to certain embodiments, during use, application of a voltage at the gate electrode can create and/or modify an electric field at least partially positioned between the source electrode and the drain electrode, such that electrons are transferred from the source electrode to the drain electrode.

Suitable transistors (e.g., FETs) that may be used in association with certain of the embodiments described herein include depletion mode (normally-ON) transistors and enhancement mode (normally OFF) transistors. A transistor can be associated with any of the semiconductor structures described elsewhere herein, including but not limited to those described with respect to FIGS. 1A-1C.

Figure 2A:
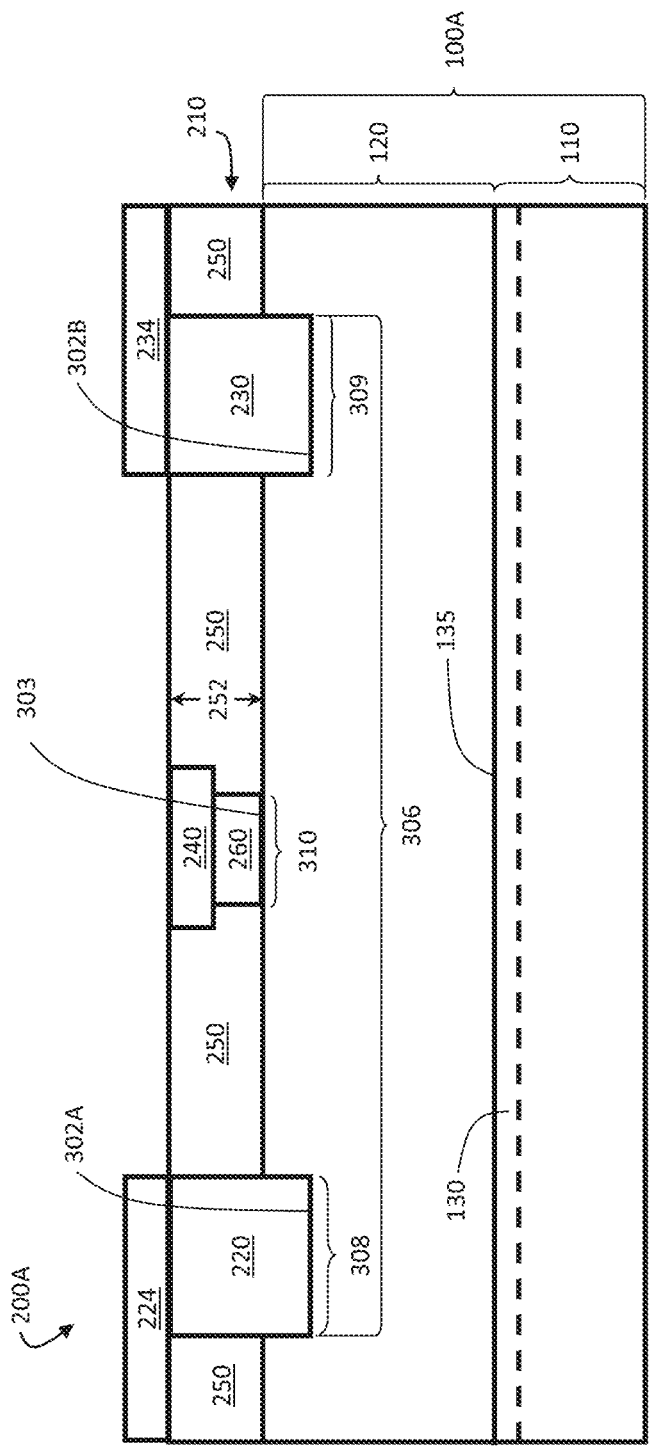
FIG. 2A is, according to some embodiments, a cross-sectional schematic illustration of a device comprising a semiconductor structure.

FIG. 2A is a cross-sectional schematic illustration of a portion of an exemplary semiconductor device 200A comprising a semiconductor structure, according to certain embodiments. In this example, the illustrated device 200A includes elements of a transistor, though the invention is not limited to only transistors. The inventive embodiments of semiconductor structures described herein can be applied to diodes, PIN switches, integrated inductors, and integrated capacitors, for example. The structure shown in FIG. 2A is also not limited to transistors. Such structure can be used for a diode, as described in U.S. patent publication No. 2017/0301798, titled "High Voltage Lateral GaN-on-Silicon Schottky Diode," filed Jul. 29, 2016, which is incorporated herein by reference. For example, the gate electrode 260 can be used as an anode electrode of a Schottky diode. The source electrode 220 and drain electrode 230 can be electrically connected together and serve as cathodes for the diode.

Figure 3A:
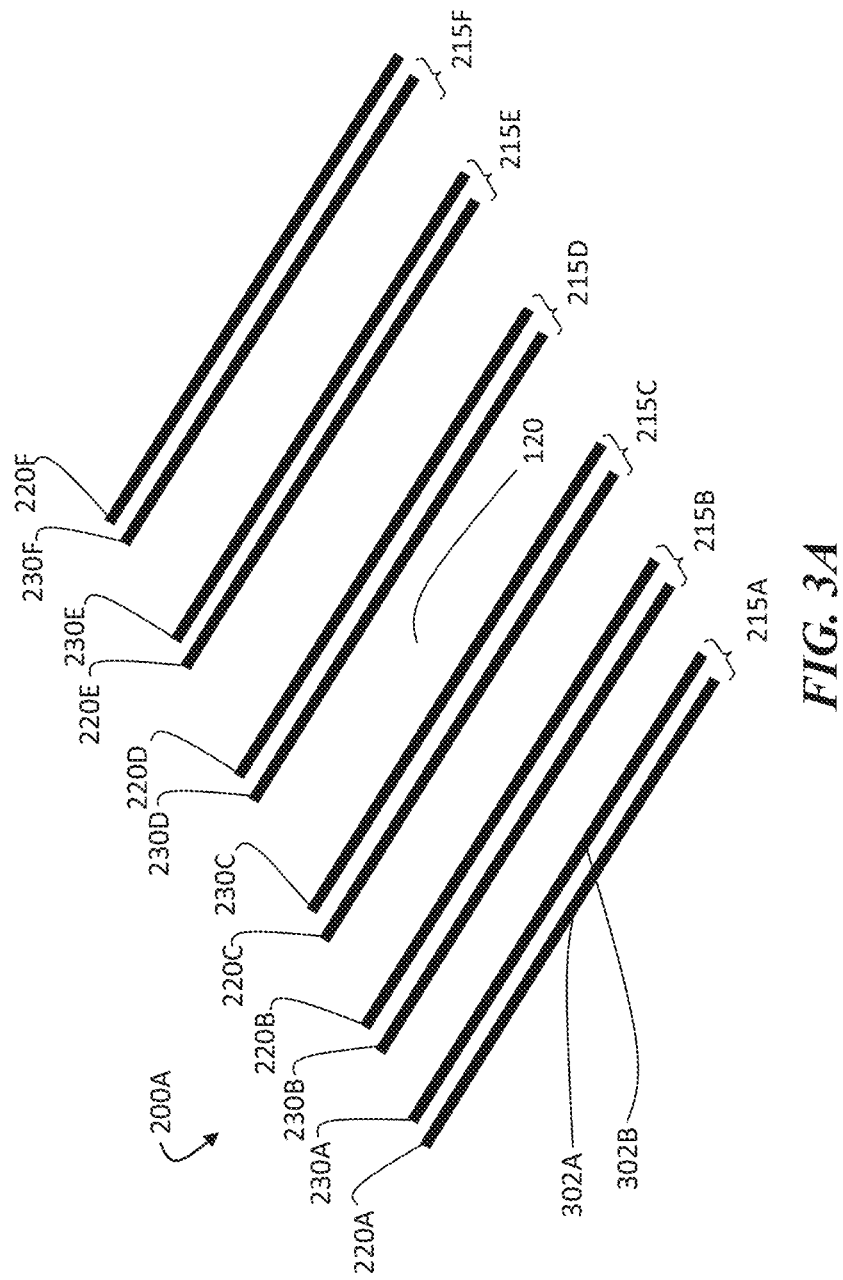
FIG. 3A is a top, perspective-view schematic illustration of a plurality of contact pairs, according to certain embodiments.
Figure 3B:
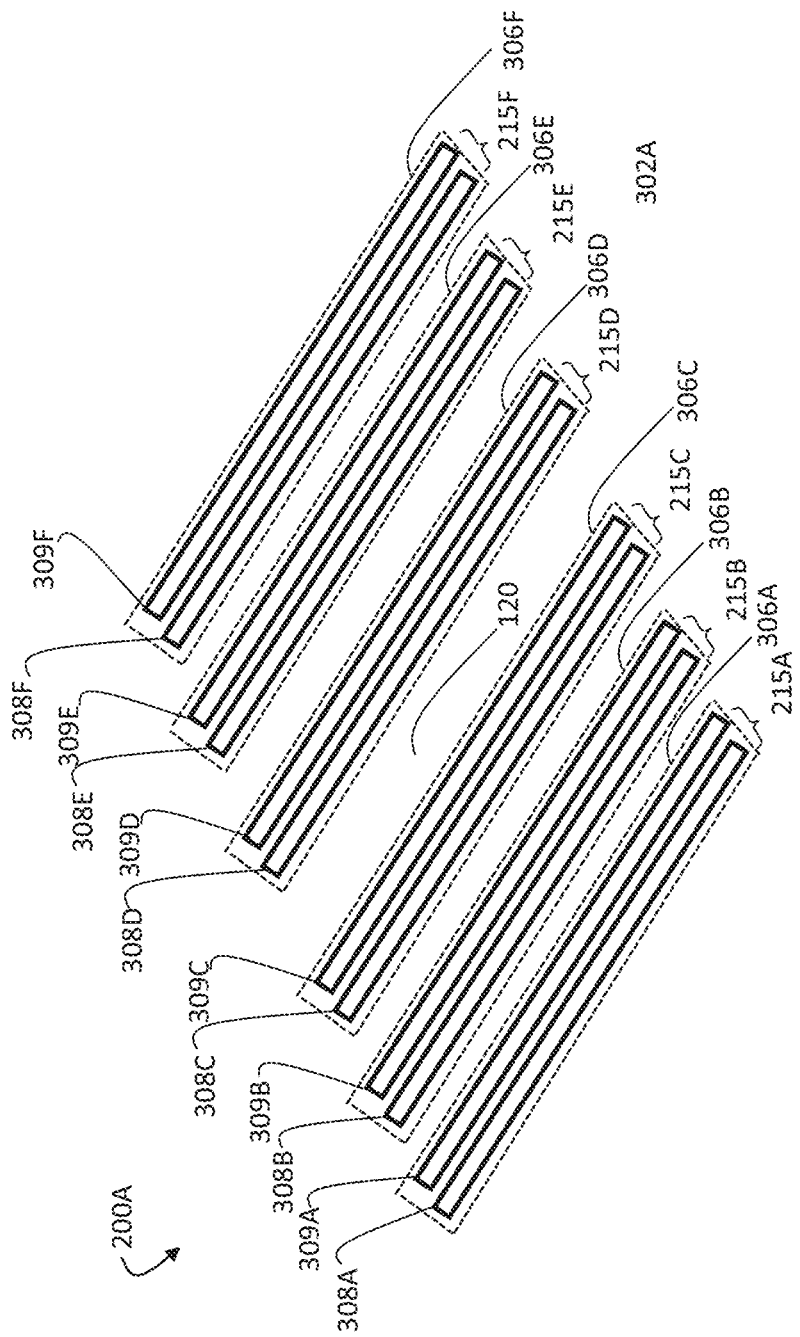
FIG. 3B is a top, perspective-view schematic illustration of a plurality of contact pairs, interfacial area, and active areas, according to certain embodiments.
Figure 3C:
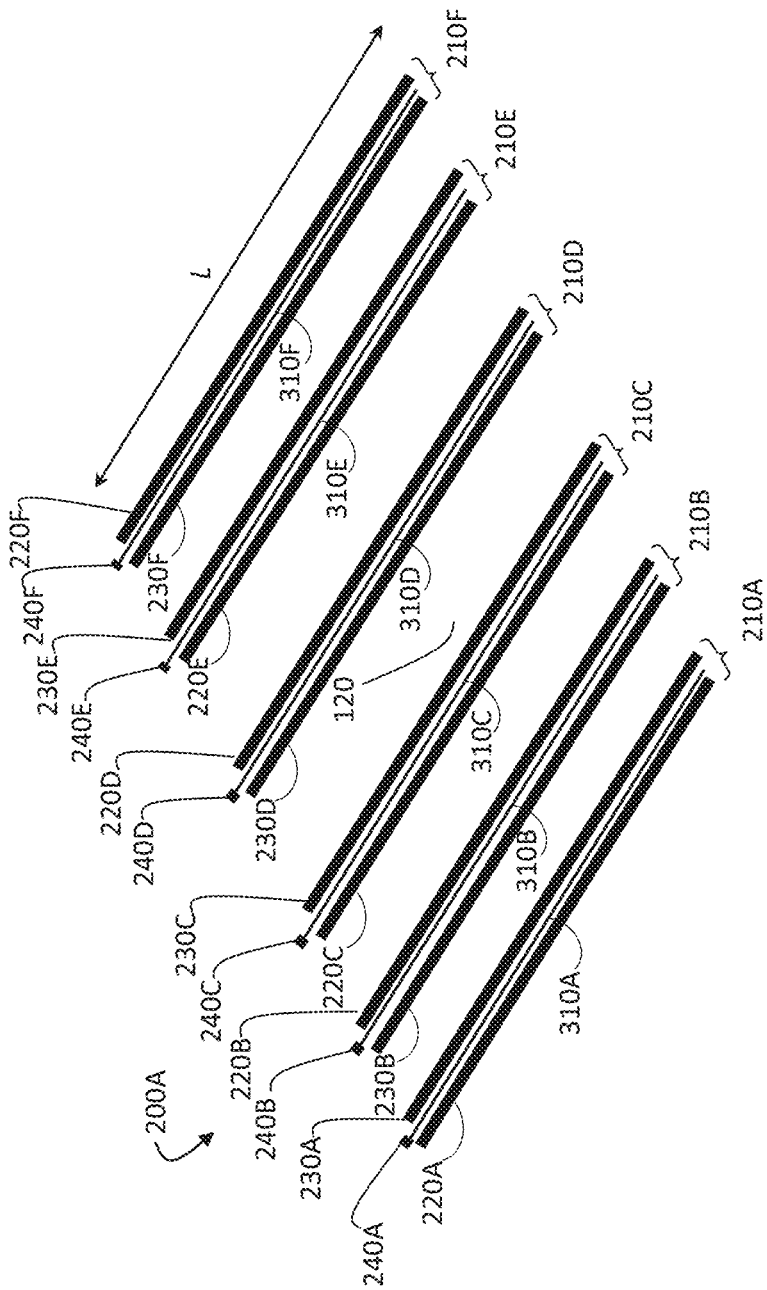
FIG. 3C is a top, perspective-view schematic illustration of a plurality of gate, source, and drain electrodes, according to certain embodiments.
Figure 3D:
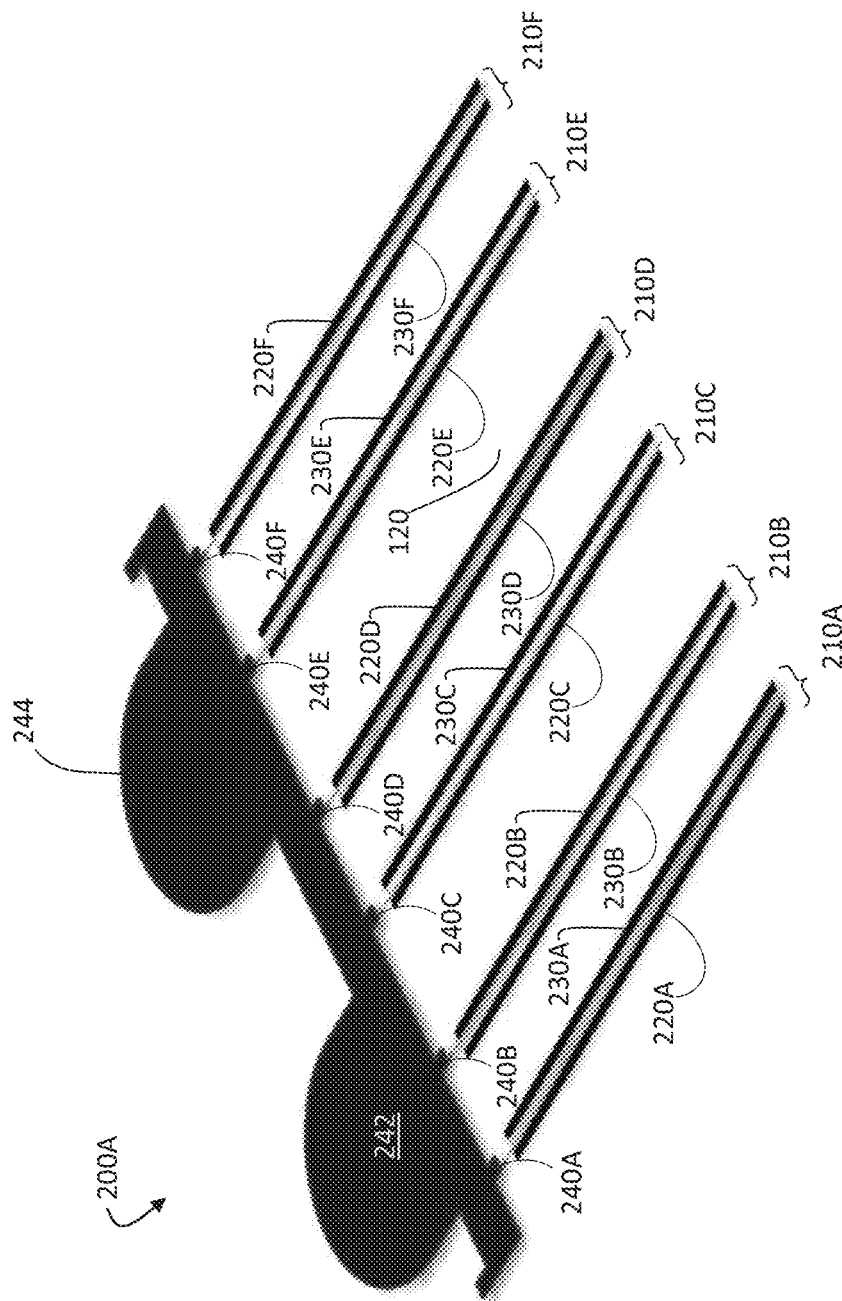
FIG. 3D is a top, perspective-view schematic illustration including gate contact pads, according to some embodiments.
Figure 3E:
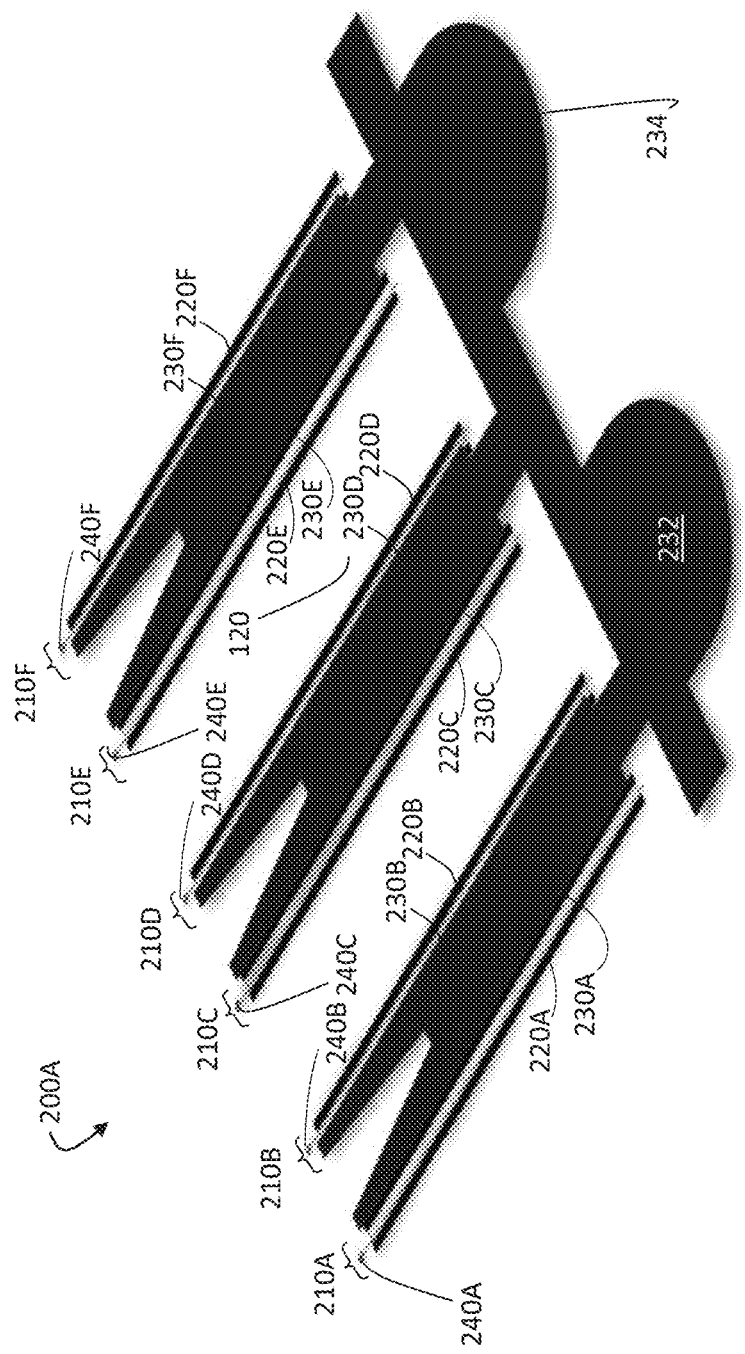
FIG. 3E is a top, perspective-view schematic illustration including a drain contact pad, according to certain embodiments.
Figure 3F:
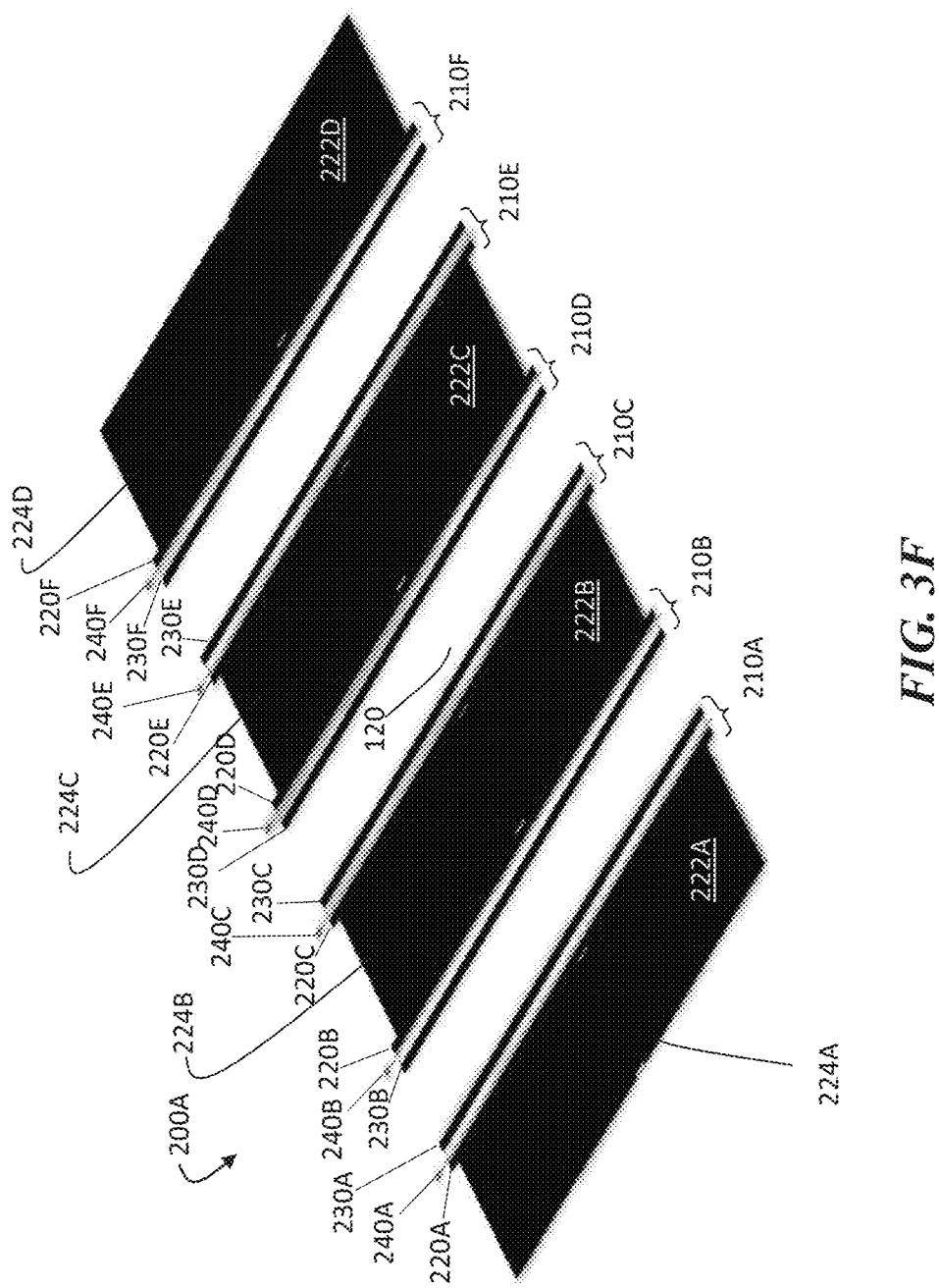
FIG. 3F is a top, perspective-view schematic illustration of a set of embodiments including a first type of source contact pad, according to some embodiments.
Figure 3G:
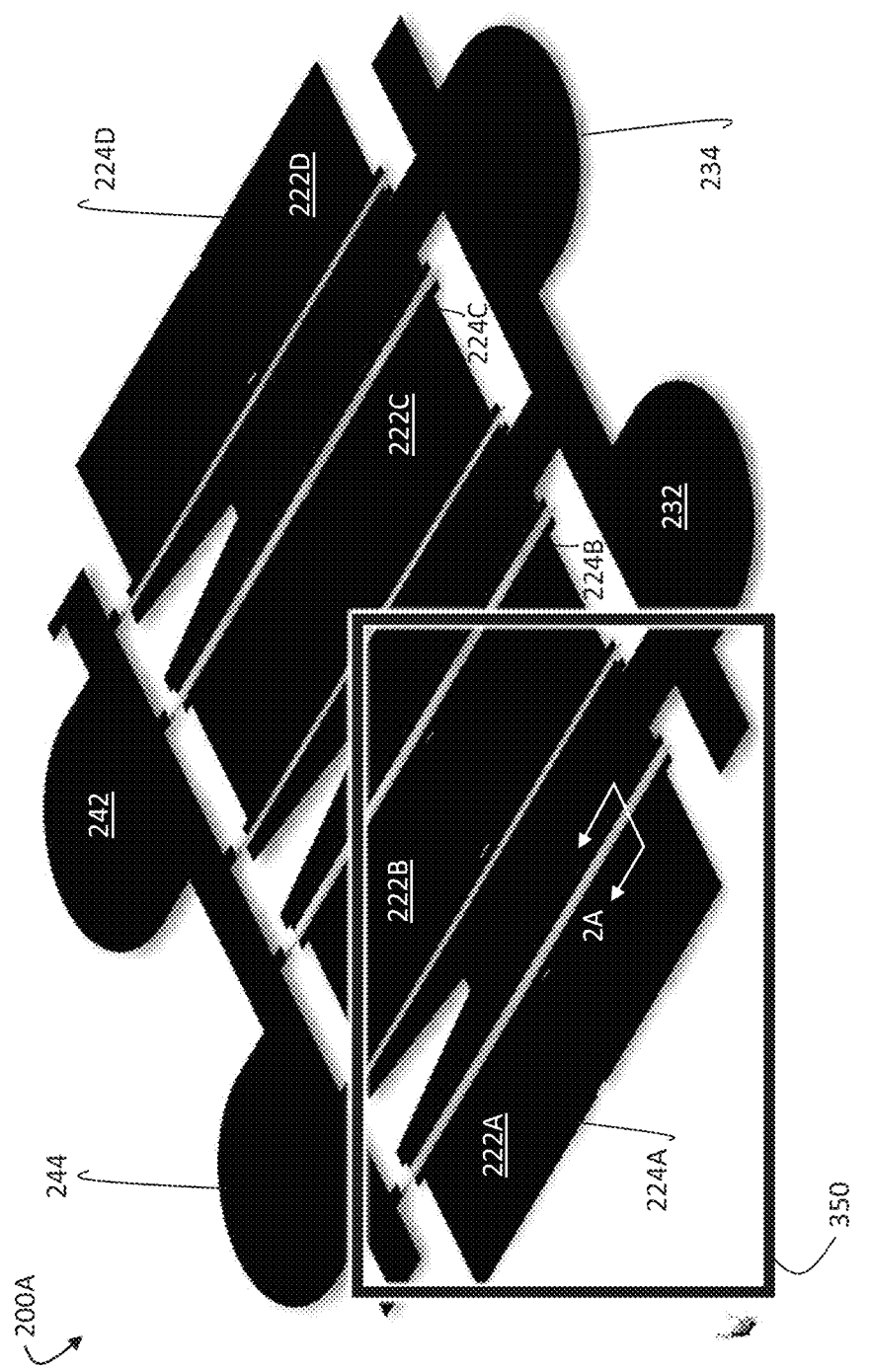
FIG. 3G is a top, perspective-view schematic illustration of contact pads and electrodes of a semiconductor device, according to certain embodiments.
Figure 3H:
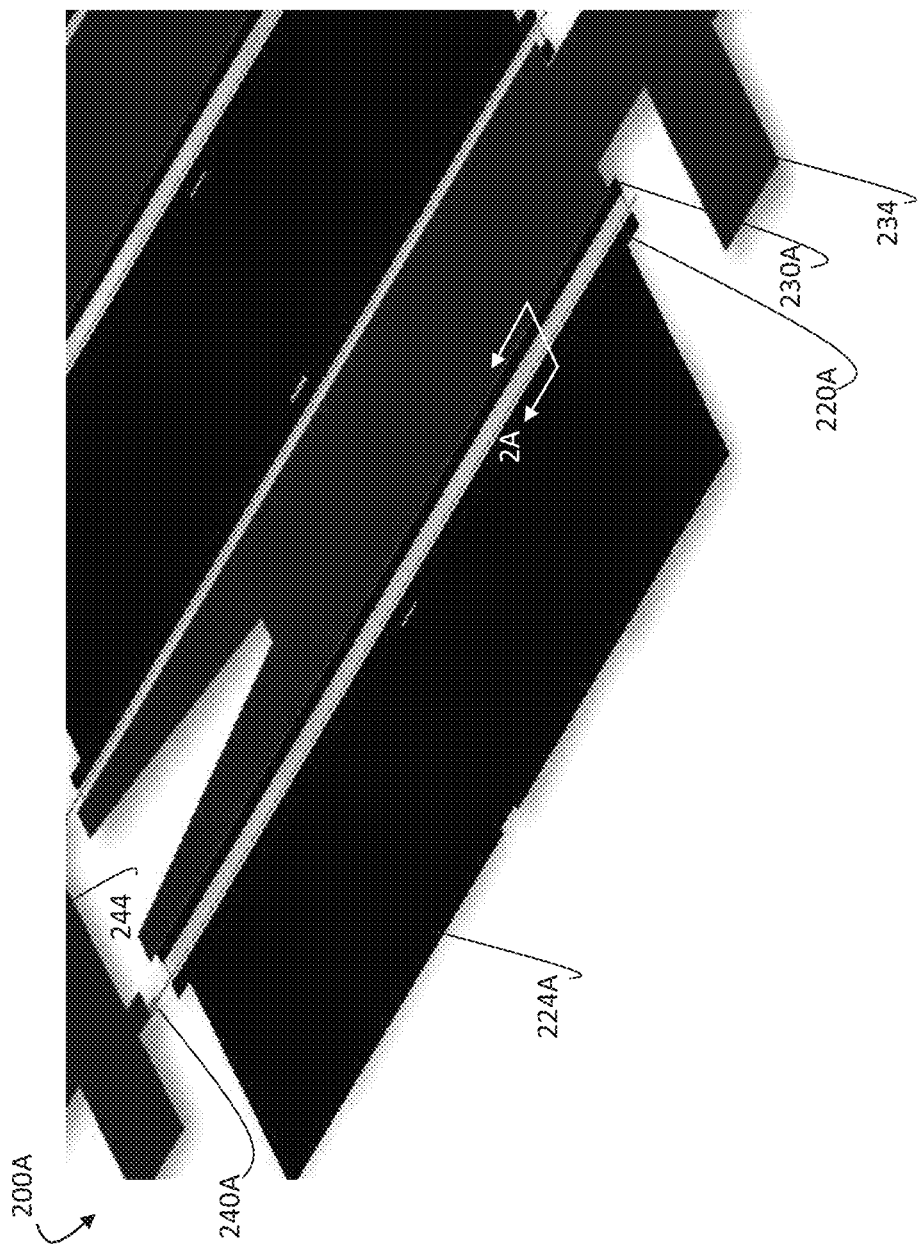
FIG. 3H is a top, perspective-view schematic illustration of a portion of the structure shown in FIG. 3G, according to certain embodiments.

FIGS. 3A-3H are top, perspective-view schematic illustrations of contacts and electrodes that can be patterned on the semiconductor device of which device 200A shown in FIG. 2A is a part, with the cross-section shown in FIG. 2A taken along line "2A" illustrated in FIGS. 3G and 3H. FIGS. 3A-3H represent a schematic progression of the addition of various components to the semiconductor device.

In FIG. 3A, a plurality of electrode pairs 215 have been added over III-nitride material region 120. According to certain embodiments, each of the electrode pairs (e.g., components of a transistor) has a source electrode and a drain electrode, each of which define ohmic contacts with an underlying III-nitride material region. As shown in FIG. 3A, semiconductor device 200A comprises six electrode pairs 215A-215F, wherein each electrode pair 215A-215F comprises source electrodes 220A-220F and drain electrodes 230A-230F. The source electrodes make ohmic contacts with the underlying III-nitride material region. For example, in FIG. 2A, source electrode 220 makes ohmic contact 302A with III nitride material 120. The drain electrodes also make ohmic contacts with the underlying III-nitride material region. For example in FIG. 2A, drain electrode 230 makes ohmic contact 302B with III-nitride material region 120. Electrode pairs 215A-215F may be, in accordance with various embodiments, evenly and/or non-evenly spaced on III-nitride material region 120.

In FIG. 3B, the electrode pairs have been removed to illustrate the interfacial areas between the electrode structures and the underlying semiconductor material (i.e., the ohmic contact interfacial areas), described in more detail below.

FIG. 3C is a top, perspective-view schematic illustration of the semiconductor structure of FIG. 3A, but in which gate electrodes 240A-240F have been added relative to the structure shown in FIG. 3A. In FIG. 3C, gate electrodes 240A-240F have been added between each of electrode pairs 215A-215F (each electrode pair including a source electrode 220 and a drain electrode 230), creating transistors 210A-210F.

In FIG. 3D, gate contact pad 244, which establishes electrical connections to gate contacts 240, has been added.

In FIG. 3E, drain contact pad 234, which establishes electrical connections to drain contacts 230, has been added.

In FIG. 3F, source contact pads 224A-224D, which establish electrical connections to source contacts 220, have been added.

FIG. 3G is a top, perspective-view schematic illustration of the completed device, with FIG. 3H showing a magnified view of portion 350.

In certain embodiments, as shown in FIG. 3C-3H, the semiconductor structure comprises multiple transistors. In other embodiments, the semiconductor structure includes only a single transistor. When multiple transistors are present, any suitable number of transistors (e.g. one, two, three, four, or more) can be present.

Referring back to FIG. 2A, transistor 210 comprises source electrode 220 and drain electrode 230. Transistor 210 also comprises gate electrode 240. Source electrode 220, drain electrode 230, and gate electrode 240 are positioned on III-nitride material region 120. The device also includes dielectric region 250. The dielectric region can be a passivating layer that protects and passivates the surface of the III-nitride material region. Via 260 is formed within the dielectric region 250 in which gate electrode 240 is, in part, formed. In FIG. 2A, as described above, III-nitride material region 120 is formed directly on substrate 110. It is also noted that the configuration of gate electrode 240 in direct contact with the III-nitride material device region 120 forms a Schottky-gated FET. In other embodiments (not shown in FIG. 2A) there may be an insulator layer formed between gate electrode 240 and III-nitride material device region 120 configured as a Metal Insulated Field Effect Transistor (MISFET) or more generically an insulated gate transistor. It should also be noted that, although FIG. 2A shows via 260 formed within dielectric region 250, in certain other embodiments, via 260 could extend down and terminate within III-nitride material region 120.

The transistor structures illustrated in FIGS. 2A-2D (and FIGS. 3A-3H) are exemplary, and other structures could also be used. For example, according to some embodiments, a single transistor comprising a semiconductor structure described herein may be located over the surface region of the substrate. In some embodiments, at least one second transistor or at least one diode comprising a semiconductor structure described herein can be located over the substrate and laterally spaced apart from the first transistor.

As noted above, certain embodiments are related to systems and methods for mitigating the impact of temperature increases on device performance. The maximum junction temperature in III-nitride materials on silicon substrates is typically fundamentally limited by junction reliabilities within the semiconductor device, and more specifically, by the substrate (e.g., silicon-containing substrate) resistivity at elevated temperatures. In certain cases, a resistive silicon-containing substrate at the epitaxial interface heats up under RF operation and elevated temperatures, and conducts RF current that degrades product performance such as output power and efficiency. In some cases, "high resistivity" silicon does not retain its high resistivity properties above 50° C. For example, 10 kΩ·cm high resistivity silicon at 25° C. becomes 100 Ω·cm at 177° C. As a result, in certain cases, current through the transistor (i.e., dissipated power) generates heat that spreads into the substrate from the III-nitride material.

In certain cases, the substrate is capacitively coupled with conductive structures (e.g., source, drain, or gate electrodes, associated contact pads, etc.), for example, at the III-nitride material interface. In some such cases, application of an RF voltage across the drain electrode to the source electrode generates heat in the substrate, leading to thermal runaway by increasing the heat source temperature and reducing the substrate resistance even further.

Effectively, in certain instances, as the temperature of the package flange and/or supply voltage of the semiconductor device is increased, the substrate resistance is decreased, and as a result the semiconductor structure has both lower output power and lower efficiency. RF induced substrate power dissipation is a strong function of supply voltage, and the power dissipated in the silicon-containing substrate is proportional to the square of the peak RF voltage, leading to significant performance degradation for semiconductor structures containing highly resistive silicon-containing substrates.

In some cases, when a voltage is applied to a semiconductor device, current is generated within the semiconductor structure between at least two electrodes (e.g., between a source electrode and a drain electrode). The flow of current within the semiconductor structure is generally dictated by Ohm's law, which dictates that the current is inversely proportional to the resistance. In some cases, the passage of electrical current through the semiconductor structure produces heat (also referred to as Joule heating or resistive heating); in this process, electric current energy is converted to heat through resistive losses (e.g., dissipated power) in the substrate of the semiconductor structure.

As discussed above, certain of the devices and semiconductor structures described herein comprise electronically conductive substrates (e.g., electronically conductive substrates comprising bulk silicon). The electrical resistance in the substrate can be reduced by the use of electronically conductive substrates (e.g., as the conductivity of the substrate increases, the resistance of the substrate decreases). As a result, the resistive heating of the semiconductor structure is lowered, resulting in semiconductor devices and semiconductor structures with less performance degradation and better efficiencies at higher operating temperatures, which is explained in more detail herein.

In certain embodiments, semiconductor structures comprising thick III-nitride material regions are described. The use of thick III-nitride materials can reduce leakage current between the substrate and components of a device that is formed using a semiconductor structure described herein. As a result, in some embodiments, the use of thick III-nitride layers can reduce the degree to which electrons are transported, undesirably, between the substrate and electronically conductive structures on the III-nitride material surface.

In some cases, ohmic contacts are present between electrode structures (e.g., metal structures) and the III-nitride material region, and in certain cases, the ohmic contact areas capacitively couple RF current to the electronically conductive substrate. In some cases, capacitive coupling results from the transfer of energy within the electrical network of the semiconductor structure by means of displacement current between transistor components incorporated in the semiconductor structure (e.g., a source electrode and/or a drain electrode) and the substrate.

According to certain embodiments, the capacitive coupling and displacement current generated during operation of the semiconductor structure can be decreased by the use of small ohmic contacts over the III-nitride material surface. Reduced ohmic contact interfacial areas on the III-nitride material surface have the effect, in accordance with certain embodiments, of lowering the amount of dissipated current transported through the substrate of the semiconductor structure.

Some embodiments described herein are related to the use of small ohmic contacts with large contact pads. In certain embodiments, the contact pads are present above and electrically connect to the electrode structures (e.g., metal structures) that make ohmic contacts with the III-nitride material surface. According to certain embodiments, large contact pads are useful for making external electrical connections to the semiconductor device.

In certain embodiments, the contact pads described above are present on a thick dielectric region that separates the large contact pads from the III-nitride material region. According to some embodiments, the use of a thick dielectric region between the large contact pads and the III-nitride material region can reduce the capacitance to the electronically conductive substrate, resulting in higher operating temperatures and better efficiencies at said temperatures.

Certain of the semiconductor structures described herein can be "self-grounding," for example, by including an electrical coupling between an electronically conductive component (e.g., on the top side of the device, such as an electrode or a contact pad) and the electronically conductive substrate (or an electronically conductive portion of the substrate). For example, in some embodiments, the semiconductor structures include a cavity formed in the top portion of the device. The cavity can be, in accordance with certain embodiments, a front-side via (also referred to as a top-side via). The cavity can be configured to expose the electronically conductive substrate (or an electronically conductive portion thereof), for example by extending through the III-nitride material region. In some embodiments, an electronically conductive material (e.g., a metal) can be disposed such that it establishes an electronically conductive grounding pathway between an electronically conductive component on the top side of the device to the electronically conductive substrate (or an electronically conductive portion of the substrate). The electronically conductive pathway between the electronically conductive component and the substrate can ensure that charge does not accumulate in an unwanted location, and can help limit the amount of power dissipated during operation. This arrangement can result in a "self-grounding" structure where no external electrical connection, such as a wire, is required to ground the device.

Certain embodiments are related to semiconductor structures comprising a substrate, at least a portion of which is electronically conductive. Referring back to FIGS. 2A, substrate 110 can be an electronically conductive substrate (e.g., a bulk silicon substrate) and/or may include a portion that is electronically conductive. In some embodiments, the use of substrates having electronically conductive regions can reduce the amount of heat that is generated during device operation. For example, in some cases, as a voltage is applied to the semiconductor structure, an electrical current is generated between at least two electrode structures, such as a source electrode and a gate electrode. Additionally, current can also be (undesirably) transported through the substrate. As current is transported through the substrate, heat can be generated (for example, due to Joule heating). In the case of highly resistive substrates, the generation of heat can result in a decrease in resistivity, which can result in an increase in the current transported through the substrate (which still remains relatively highly resistive), increased Joule heating, and increased substrate temperatures. In certain embodiments described herein, however, the use of substrates having electronically conductive regions can allow for current to be transferred through the substrate relatively efficiently, with little or no Joule heating. The relatively efficient transport of electrical current through the substrate can improve the efficiency of devices and components formed from the semiconductor structure, for example, even at relatively high operating temperatures.

In certain embodiments, the devices having semiconductor structures described herein comprise at least one ohmic contact located over the III-nitride material region. Certain devices (e.g., Schottky diodes and HEMTs) can also include Schottky contacts at the anode and gate, respectively. Referring to FIGS. 2A and 3A-3B, semiconductor device 200A comprises ohmic contacts 302A and 302B located over III-nitride material region 120. In certain embodiments, the ohmic contacts are an electrical junction between an electrode structure (e.g., a source electrode and/or a drain electrode of a transistor) and an underlying portion of the semiconductor structure (e.g., the III-nitride material region). In some cases, capacitive coupling occurs between the ohmic contact(s) and the substrate. The capacitive coupling between the ohmic contact(s) and the substrate can lead to the displacement current flowing through the substrate, resulting in dissipated power.

In some embodiments, as the ohmic contact area of the at least one ohmic contact decreases, the capacitive coupling between the ohmic contact(s) and the substrate decreases. In some such cases, less displacement current is transported through the substrate. Accordingly, in accordance with certain embodiments, the semiconductor devices described herein comprise ohmic contacts that are relatively small, which can help reduce capacitive coupling losses.

Figure 2B:
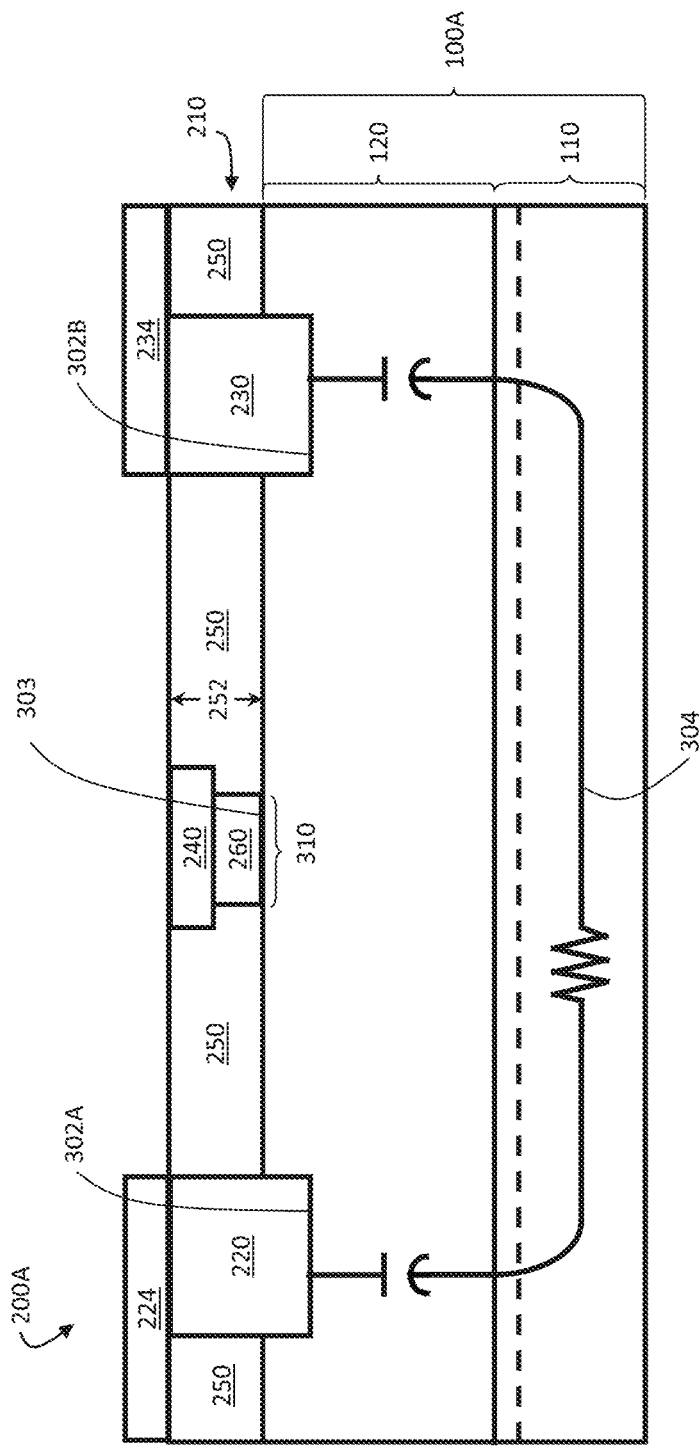
FIG. 2B is a is a cross-sectional schematic illustration of a semiconductor device comprising an electronically conductive substrate, according to some embodiments.
Figure 2C:
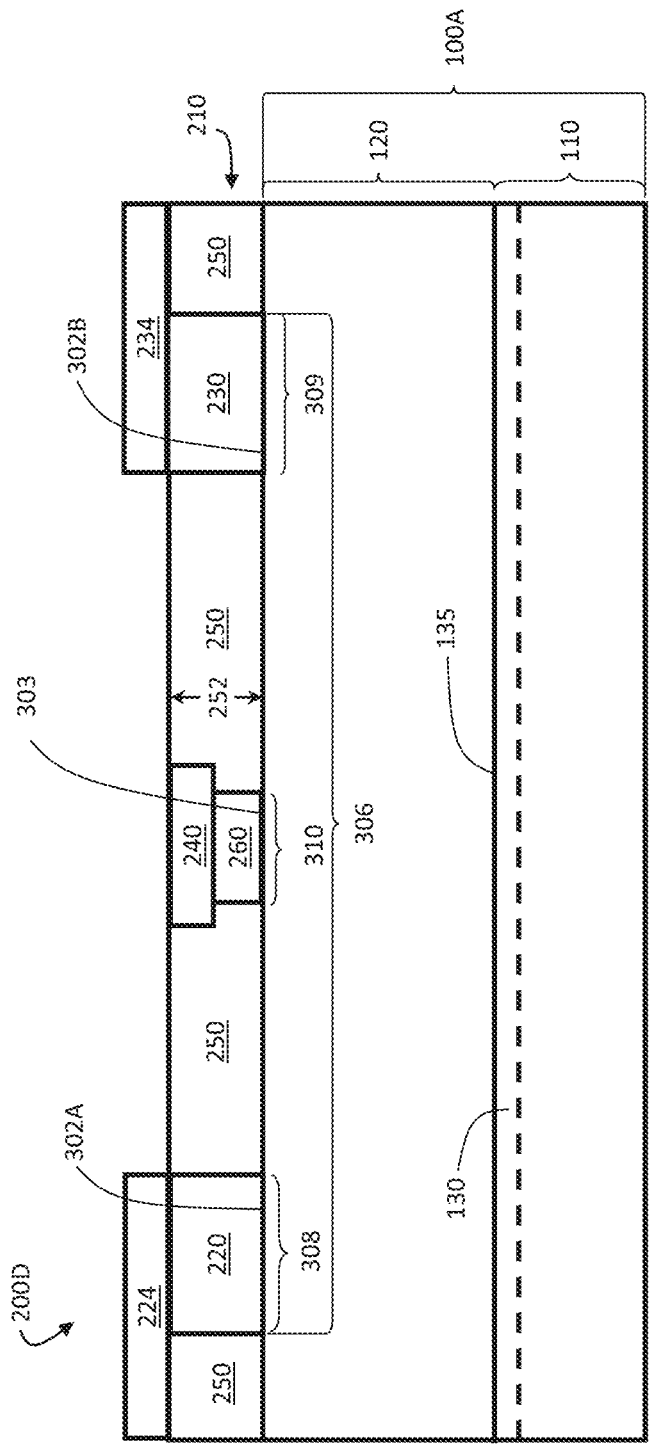
FIG. 2C is, in accordance with certain embodiments, a side-view schematic illustration of a semiconductor device having ohmic contacts on top of the III-nitride material region.

It should be understood that an ohmic contact that is "over" a III-nitride material region can sit on top of the III-nitride material region or be at least partially embedded in the III-nitride material region. For example, referring to FIGS. 2A, ohmic contact 302A and ohmic contact 302B are embedded in III-nitride material region 120. FIG. 2C is, in accordance with certain embodiments, a side-view schematic illustration of a semiconductor device with ohmic contacts on top of the III-nitride material region. In some embodiments, such as those illustrated in FIG. 2C, ohmic contact 302A and ohmic contact 302B sit on top of III-nitride material region 120.

According to certain embodiments, at least one ohmic contact defines an ohmic contact interfacial area with the III-nitride material region. The ohmic contact interfacial area of a given ohmic contact type (e.g., drain ohmic contact) refers to the area of the interface between the ohmic contact or contacts of the same type in a device and the III-nitride material. The ohmic contact interfacial area of a device (also referred to herein as the "device ohmic interfacial area") refers to the sum of all of the interfacial areas of the ohmic contacts of that device. For example, in the case of a transistor having a source electrode and a drain electrode, the device ohmic contact interfacial area for that device would correspond to the sum of the ohmic contact interfacial areas of all ohmic contacts for the source electrode and the drain electrode. The ohmic contact interfacial area of that transistor device would not include the interfacial area of the gate electrode, since in some cases the gate electrode may form a Schottky contact or a capacitive contact, rather than an ohmic contact.

Figure 2D:
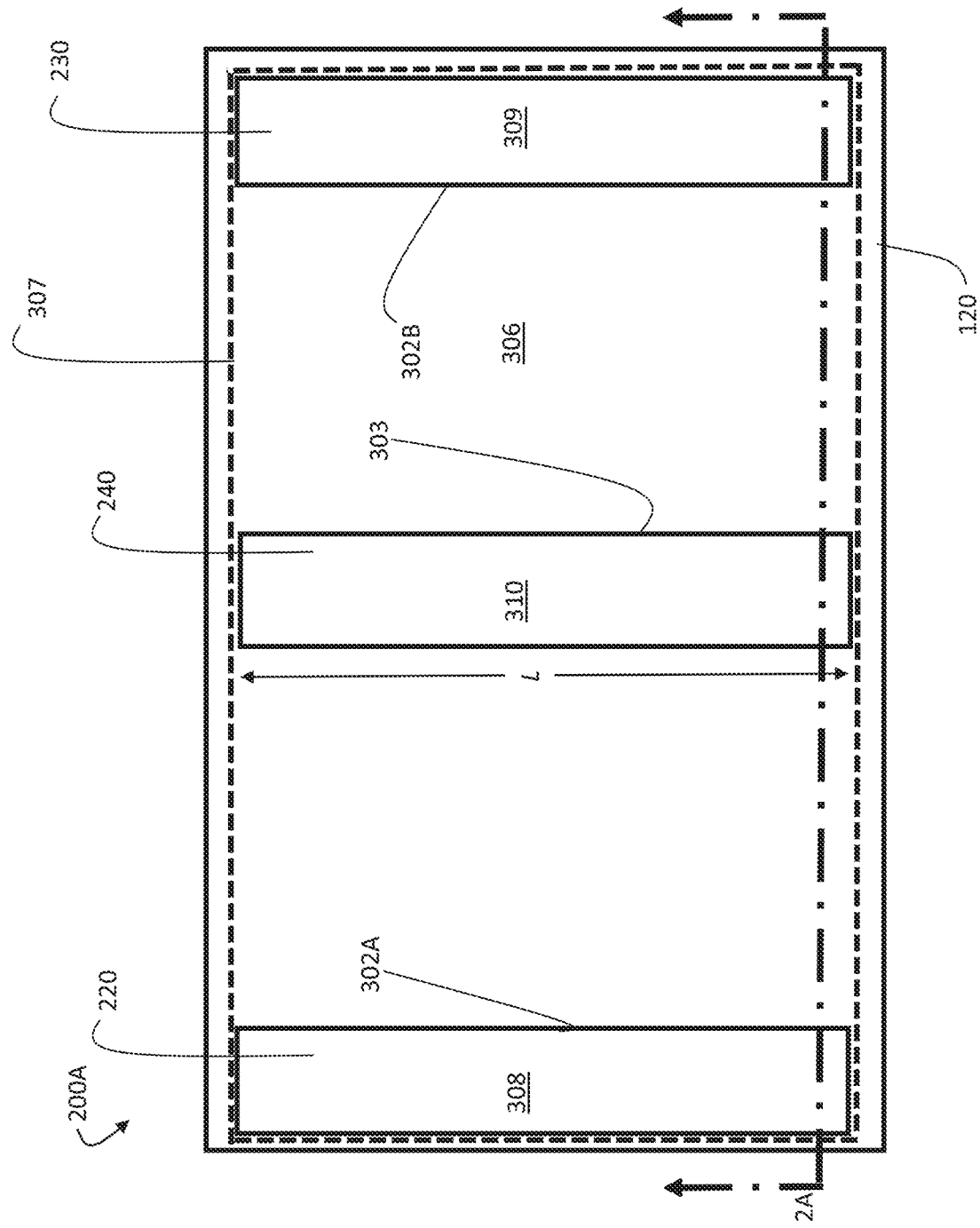
FIG. 2D is a top-view schematic illustration of the semiconductor device illustrated in FIG. 2A.

Referring to FIGS. 2A, for example, ohmic contact 302A of source electrode 220 has interfacial area 308, and ohmic contact 302B of drain electrode 230 has interfacial area 309. In addition, Schottky contact 303 of gate electrode 240 for the depicted type of transistor has interfacial area 310. FIG. 2D is a top-view schematic illustration of the semiconductor device illustrated in FIG. 2A (with the cross-sections shown in FIG. 2A taken along line 2A in FIG. 2D). In FIG. 2D, ohmic contact 302A of source electrode 220 has interfacial area 308, where source electrode 220 contacts III-nitride material region 120. In FIG. 2D, ohmic contact 302B of drain electrode 230 has interfacial area 309, where drain electrode 230 contacts III-nitride material region 120. Schottky contact 303 of gate electrode 240 has interfacial area 310, where gate electrode 240 contacts III-nitride material region 120.

Ohmic contact interfacial areas are further shown in FIG. 3B. In FIG. 3B, source electrodes 220A-220F that make ohmic contacts 302A with underlying III-nitride material region and drain electrodes 230A-230F that each make an ohmic contact 302B with underlying III-nitride material region 120 have been removed (relative to FIG. 3A) for purposes of clarity, and to illustrate the interfacial areas defined by the electrodes of the electrode pairs. Referring to FIG. 3B, each of areas 308A-308F and 309A-309F correspond to the interfacial area defined by one of the ohmic contacts (e.g., 302A and 302B) from FIG. 3A. For example, in FIG. 3B, electrode pair 215A comprises interfacial area 308A that is defined by ohmic contact 302A of source electrode 220A, and interfacial area 309A that is defined by ohmic contact 302B of drain electrode 230A. In certain embodiments, each electrode pair 215A-215F comprises interfacial areas 308A-308F and 309A-309F. Where there are multiple electrodes of a same type (e.g., drain, source, cathode) present in a device, the ohmic contact interfacial area for a type of an electrode is a sum of all constituent ohmic contact interfacial areas for electrodes of a same type. For example, a drain ohmic contact interfacial area for the device of FIG. 3B would be a sum of interfacial areas 309A-309F.

The ohmic contact interfacial area can generally be calculated by examining a top-down view of the semiconductor device and determining the geometric area of the III-nitride region that is covered by the conductive material forming the ohmic contact with the III-nitride region.

The interfacial areas of the ohmic contacts can have any of a variety of suitable shapes including, but not limited to, square, rectangular, circular, and the like.

According to certain embodiments, the ohmic contact interfacial area of the device is less than 50 $\mu m^2$, less than 40 $\mu m^2$, less than 30 $\mu m^2$, less than 20 $\mu m^2$, or less than 10 $\mu m^2$. In certain embodiments, the ohmic contact interfacial area of the device is greater than 1 $\mu m^2$, greater than 10 $\mu m^2$, greater than 20 $\mu m^2$, greater than 30 $\mu m^2$, or greater than 40 $\mu m^2$. Combinations of these ranges are also possible (e.g., less than 40 $\mu m^2$ and greater than 20$\mu m^2$, less than 30 $\mu m^2$ and greater than 10 $\mu m^2$).

According to some embodiments, an ohmic contact interfacial area ratio can be defined for a device. For example, an ohmic contact interfacial area ratio can be defined as a ratio of the ohmic contact interfacial area of at least one type of ohmic contact for a device (e.g., interfacial area of a source or drain of a transistor or interfacial area of a cathode for a Schottky diode) to a peripheral length of a gate or anode for the device. For example and referring to FIG. 2A and FIG. 2D, an ohmic contact interfacial area ratio for a transistor can be a ratio of a drain interfacial area 309 to a gate peripheral length L that is measured transverse to the direction of current flow under the gate electrode 240. In this regard, gate peripheral length L is measured in a direction that is transverse to conventional "gate length." If a device has more than one gate or anode, then the peripheral length for the device will be the sum of all peripheral lengths for the constituent gates (e.g., 240A-240F as depicted in FIG. 3C) or anodes for the device. For a diode, anode peripheral length would correspond to a length of the anode (or all anodes of the device) measured transverse to the direction of current flow from the anode. If an ohmic contact for a device comprises a plurality of ohmic contacts of a particular type (e.g., a plurality of drain contacts, as described in connection with FIG. 3A for example) then the ohmic contact interfacial area for the device is a sum of all relevant ohmic contact interfacial areas (e.g., a sum of ohmic contact interfacial areas 309A-309F for drain contacts of the device) divided by the peripheral length of a selected terminal for the device. For a transistor, an ohmic contact interfacial area ratio can be calculated for the drain contact(s). Additionally or alternatively, an ohmic contact interfacial area ratio can be calculated for the source contact(s).

The units of an ohmic contact interfacial area ratio (and other area-to-peripheral length ratios described herein) can be expressed in square microns/micron ($\mu m^2/\mu m$) or ($\mu m$), where the size of the ohmic contact interfacial area and the peripheral length are both measured in microns. Other units may be used to express area-to-peripheral length ratio with a corresponding change in ratio value.

In some implementations, devices formed in accordance with the present embodiments can have an ohmic contact interfacial area ratio for at least one type of ohmic contact of the device. An ohmic contact interfacial area ratio can be between 1 $\mu m^2/\mu m$ and 30 $\mu m^2/\mu m$. The ohmic contact interfacial area ratio for at least one type of ohmic contact of a device can be less than 5 $\mu m^2/\mu m$ according to some embodiments, less than 10 $\mu m^2/\mu m$ according to some embodiments, less than 20 $\mu m^2/\mu m$ according to some embodiments, and yet less than 40 $\mu m^2/\mu m$ according to some embodiments.

According to certain embodiments, the semiconductor devices described herein comprise components of transistor, including a source electrode over the III-nitride material region. For instance, referring to FIGS. 2A, semiconductor device 200A comprises source electrode 220 over III-nitride material region 120. In certain embodiments, the source electrode defines a source electrode interfacial area with the III-nitride material region. The source electrode interfacial area corresponds to interfacial area of the ohmic contact between the source electrode and the III-nitride material region. For example, referring to FIG. 2A and FIG. 2D, source electrode 220 has interfacial area 308.

In some embodiments, the semiconductor devices described herein comprise a drain electrode over the III-nitride material region. For instance, referring to FIGS. 2A, semiconductor device 200A comprises drain electrode 230 over III-nitride material region 120. In certain embodiments, the drain electrode defines a drain electrode interfacial area with the III-nitride material region. The drain electrode interfacial area corresponds to the interfacial area of the ohmic contact between the drain electrode and the III-nitride material region. Referring to FIGS. 2A and FIG. 2D, for example, drain electrode 230 has interfacial area 309.

According to certain embodiments, the semiconductor devices described herein comprise a gate electrode over the III-nitride material region. For instance, referring to FIGS. 2A, semiconductor device 200A comprises gate electrode 240 over III-nitride material region 120. In certain embodiments, the gate electrode defines a gate electrode interfacial area with the III-nitride material region. The gate electrode interfacial area corresponds to the interfacial area of the contact between the gate electrode and the underlying material, which could be the III-nitride material or an intermediate material between the gate electrode and the III-nitride material. Referring to FIGS. 2A and FIG. 2D, for example, gate electrode 230 has interfacial area 310.

According to some embodiments, it may be beneficial to have an ohmic contact interfacial area that is less than 50 times the gate electrode interfacial area because reduced interfacial areas of the source and drain ohmic contacts on the III-nitride material surface can reduce the capacitive coupling to the substrate (e.g., an electronically conductive substrate). In certain embodiments, the ohmic contact interfacial area defined by the source electrodes is less than 50 times (or less than 40 times, less than 30 times, less than 20 times, less than 10 times, or less than 5 times) the Schottky contact interfacial area defined by the gate electrodes. In some embodiments, the ohmic contact interfacial area defined by the source electrodes is at least 0.01 times, at least 0.1 times, or at least 1 time the Schottky contact interfacial area defined by the gate electrodes. Combinations of these ranges are also possible.

For example, referring to FIG. 2D, the ohmic contact interfacial area 308 defined by source electrode 220 is less than 50 times the Schottky contact interfacial area 310 defined by the gate electrode. To calculate the ratio of the ohmic contact interfacial area defined by the source electrodes to the Schottky contact interfacial area defined by the gate electrodes, one would determine the ratio of:
  (1) interfacial area 308 defined by source electrode 220 to
  (2) interfacial area 310 defined by gate electrode 240.

According to certain embodiments, the ohmic contact interfacial area defined by the drain electrodes is less than 50 times (or less than 40 times, less than 30 times, less than 20 times, less than 10 times, or less than 5 times) the Schottky contact interfacial area defined by the gate electrodes. In some embodiments, the ohmic contact interfacial area defined by the drain electrodes is at least 0.01 times, at least 0.1 times, or at least 1 time the Schottky contact interfacial area defined by the gate electrodes. Combinations of these ranges are also possible. For example, referring to FIG. 2D, the ohmic contact interfacial area 309 defined by drain electrode 230 is less than 50 times the Schottky contact interfacial area 310 defined by the gate electrode. To calculate the ratio of the ohmic contact interfacial area defined by the drain electrodes to the Schottky contact interfacial area defined by the gate electrodes, one would determine the ratio of:
  (1) interfacial area 309 defined by drain electrode 230 to
  (2) interfacial area 310 defined by gate electrode 240.

In certain embodiments, the ohmic contacts define an active area. For example, in embodiments in which the semiconductor device comprises a transistor, the source electrode and the drain electrode define an active area. The active area generally refers to the area over which electrons are transported between ohmic contacts during normal operation of the semiconductor structure. For example, in the case of a transistor, the active area refers to the area under and between the source and the drain electrodes over which electrons are transported during device operation.

One example of an active area is shown in FIGS. 2A. In FIGS. 2A, the active area 306 is the area over which the drain current is transported between ohmic contacts 302A and 302B. In certain embodiments, the active area of a semiconductor device includes the area both beneath the ohmic contact, as well as the area between them. For example, referring to FIGS. 2A, ohmic contact active area 306 includes the area beneath ohmic contacts 302A and 302B, as well as the area between ohmic contacts 302A and 302B.

The active area shown in FIGS. 2A is also shown in the top-view schematic illustration of FIG. 2D. In FIG. 2D, semiconductor device 200A comprises source electrode 220, drain electrode 230, and gate electrode 240. Source electrode 220 and drain electrode 230 define active area 306, denoted by dotted box 307.

Exemplary active areas are also shown in the top, perspective view schematic illustration shown in FIG. 3B. In FIG. 3B, each electrode pair 215A-215F comprises ohmic contacts 302A and 302B where source electrode 220A-220F and drain electrode 230A-230F contact the III-nitride material region 120. (See FIG. 3A). As shown in FIG. 3B, in some embodiments, each electrode pair 215A-215F has an active area (306A-306F), which are denoted by dotted boxes.

The active area of a given semiconductor device can be defined by a single continuous region or a plurality of regions (as shown in FIGS. 3A-3H). In instances in which a plurality of regions define the active area of the semiconductor device, the active area of the device (also referred to herein as the "cumulative active area" of the device) is calculated by summing the areas of the individual active area regions in the semiconductor device. For example, referring to FIG. 3B, the cumulative active area of semiconductor device 200A would be determined by adding the areas of regions 306A, 306B, 306C, 306D, 306E, and 306F.

The size and shape of the active area of a given semiconductor device will depend upon the size, shape, and layout of the ohmic contacts. According to certain embodiments, the active area of the semiconductor device can be defined by regions having any of a variety of suitable shapes, including but not limited to, square regions, rectangular regions, circular regions, and the like.

While examples of active areas have been described with reference to an exemplary transistor, other semiconductor devices also have active areas, and those of ordinary skill in the art would be capable of determining the active area of a given semiconductor device based on its geometry and operation. For example, in some cases, the semiconductor device can be a diode. Referring to FIG. 2A, for example, a diode could be created by short circuiting electrode 220 (previously referred to as the source electrode in exemplary transistor embodiments) and electrode 230 (previously referred to as the drain electrode in exemplary transistor embodiments) such that, together, they form one electrode (e.g., a cathode of a diode). Electrode 240 (previously referred to as the gate electrode in exemplary transistor embodiments) could be used as a second electrode (e.g., an anode). In such a case, each of source electrode 220 and drain electrode 230 would establish an ohmic contact (i.e., contacts 308 and 309 would remain ohmic contacts. Contact 310 would remain a Schottky contact. The active area in such a device would correspond to the area over which electrons would be transported between the Schottky contact and ohmic contacts during normal operation of the diode. For the example of FIG. 2A, the active area for a corresponding diode embodiment may be slightly less than the active area of the transistor embodiment. However, for short gate lengths, the difference in active area may be insignificant.

According to certain embodiments, the ohmic contacts in the semiconductor device define a cumulative active area that is less than 100 $\mu m^2$, less than 80 $\mu m^2$, less than 60 $\mu m^2$, less than 40 $\mu m^2$, or less than 20 $\mu m^2$. In certain embodiments, the ohmic contacts define an active area that is greater than 10 $\mu m^2$, greater than 20 $\mu m^2$, greater than 40 $\mu m^2$, greater than 60 $\mu m^2$, or greater than 80 $\mu m^2$. Combinations of these ranges are also possible (e.g., greater than 40 $\mu m^2$ and less than 80 $\mu m^2$, greater than 10 $\mu m^2$ and less than 40 $\mu m^2$).

In some embodiments, the semiconductor device includes at least one region having a continuous active area that is at least 10 $\mu m^2$ (or at least 20 $\mu m^2$, at least 40 $\mu m^2$, at least 60 $\mu m^2$, at least 80 $\mu m^2$, or at least 100 $\mu m^2$) in size.

According to some embodiments, an active-area ratio can be defined for a device. For example, an active-area ratio can be defined as a ratio of the active area of a device to a peripheral length of a gate or anode for the device. The gate or anode peripheral length can be determined as described above. The active area can be the active area (e.g., active area 306) of a single device having one gate or anode, or the sum of all active areas of constituent devices (e.g., when there is more than one gate or anode present in a device). In some implementations, devices formed in accordance with the present embodiments can have an active-area ratio that is between 10 $\mu m^2/\mu m$ and 250 $\mu m^2/\mu m$. The active-area ratio of a device can be less than 20 $\mu m^2/\mu m$ according to some embodiments, less than 50 $\mu m^2/\mu m$ according to some embodiments, less than 100 $\mu m^2/\mu m$ according to some embodiments, and yet less than 200 $\mu m^2/\mu m$ according to some embodiments.

In certain embodiments, the sum of the source electrode interfacial area, the drain electrode interfacial area, and the gate electrode interfacial area is substantially less than the active area defined by the source electrode, drain electrode, and the gate electrode. Without wishing to be bound by any particular theory, it is believed that employing electrodes and active areas that are sized in this way advantageously reduces capacitive coupling between the electrodes and the substrate. According to certain embodiments, the sum of the source electrode interfacial area, the drain electrode interfacial area, and the gate electrode interfacial area is less than 65% of the active area. For example, referring to FIG. 2D, source electrode 220 has interfacial area 308 with III-nitride material region 120 that is about 30% of active area 306. In addition, in FIG. 2D, drain electrode 230 has interfacial area 309 with III-nitride material region 120 that is about 30% of active area 306. In certain embodiments, in FIG. 2D, gate electrode 240 has interfacial area 310 with III-nitride material region 120 that is about 2.5% of active area 306. Thus, in FIG. 2D, the sum of the interfacial areas 310, 309, and 310 is about 60% of active area 306 (which is less than 65% of active area 306).

In certain embodiments, the sum of the source electrode interfacial area and the drain electrode interfacial area is less than 60% of the active area. For example, referring to FIG. 2D, in some embodiments, the sum of interfacial areas 308 and 309 is less than 58.5% of active area 306.

In certain embodiments, the gate electrode interfacial area is less than 3% of the active area. For example, in FIG. 2D, in some embodiments, the interfacial area 310 is less than 2.6% of active area 306.

In certain embodiments, the sum of the device ohmic interfacial area and the device gate interfacial areas is substantially less than the device cumulative active area. According to certain embodiments, the sum of the device ohmic interfacial area and the device gate interfacial areas is less than 65% of the device cumulative active area. For example, referring to FIG. 3B, the sum of interfacial areas 308A-308F is about 30% of the sum of active areas 306A-306F. In addition, in FIG. 3B, the sum of interfacial areas 309A-309F is about 30% of the sum of active areas 306A-306F. In certain embodiments, in FIG. 3C, gate electrodes 240A-240F define interfacial areas 310A-310F with III-nitride material region 120 that is about 5% of the sum of active areas 306A-306F (in FIG. 3B). Thus, the sum of the interfacial areas 308A-309F, 309A-309F, and 310A-310F is about 60% of active area 306A-306F (which is less than 65% of active area 306A-306F).

In certain embodiments, the device ohmic interfacial area is substantially less than the device cumulative active area. According to certain embodiments, the device ohmic interfacial area is less than 60% of the device cumulative active area. For example, referring to FIG. 3B, the sum of interfacial areas 308A-308F is about 30% of the sum of active areas 306A-306F. In addition, in FIG. 3B, the sum of interfacial areas 309A-309F is about 30% of the sum of active areas 306A-306F. Thus, the sum of the interfacial areas 308A-309F and 309A-309FF is about 58% of active area 306A-306F (which is less than 60% of active area 306A-306F).

In certain embodiments, the gate electrode cumulative interfacial area is less than 3% of the cumulative active area. For example, referring to FIG. 3C, in some embodiments, the sum of interfacial areas 310A-310F is less than 2.5% of active area 306A-306 (in FIG. 3B).

According to certain embodiments, the semiconductor structures described herein comprise a thick III-nitride material region located over the substrate. For example, referring to FIGS. 2A, semiconductor device 200A comprises III-nitride material region 120 that can be thick. As noted above, in certain embodiments the III-nitride material region located over the substrate has a thickness of at least 2.0 micrometers. For example, in some embodiments, the III-nitride material region located over the substrate has a thickness of 4.8 micrometers.

According to certain embodiments, the use of a relatively thick III-nitride material region reduces undesired leakage current and transport of electrons from a first electrode structure (e.g., a source electrode), through the electronically conductive substrate (e.g., a silicon-containing substrate), and to a second electrode structure (e.g., a drain electrode). FIG. 2B is a is a cross-sectional schematic illustration of a semiconductor device having a semiconductor structure that includes an electronically conductive substrate, according to some embodiments. Referring to FIG. 2B, source electrode 220 is electrically connected to drain electrode 230 by current flow 304 through III-nitride material region 120 and substrate 110. In certain embodiments, the use of a thick III-nitride material region 120 can reduce the amount of leakage current between source electrode 220 and drain electrode 230 as less current is leaked along current flow 304.

In certain embodiments, the use of a relatively thick III-nitride material region reduces the capacitive coupling between electrode structures (e.g., metal electrodes) and the substrate. In some instances, the use of an electronically conductive substrate (e.g., a silicon-containing substrate) results in an increase in the capacitance between electrode structures and the substrate, effectively reducing the efficiency of devices or components formed using the semiconductor structure. Thickening the III-nitride material region, according to some embodiments, reduces the amount of energy transferred between the electrode structures and the substrate. Referring to FIG. 2B, use of a thick III-nitride material region 120 can reduce the amount of capacitive coupling between source electrode 220, drain electrode 230, and gate electrode 240 with substrate 110.

In certain cases, the source electrode, the drain electrode, and/or the gate electrode of transistors can capacitively couple to the substrate. Similarly, anode and cathode electrodes of diodes can capacitively couple to the substrate. Certain embodiments are directed to employing component configurations and/or methods of operation that reduce the degree to which capacitive coupling is observed. In some cases, the capacitive coupling results from the use of conductive substrates, as conductive structures (e.g., source, drain, and/or gate electrodes) capacitively couple to the substrate (e.g., silicon-containing substrate). In certain embodiments, the capacitive coupling can be reduced by the use of thick III-nitride materials, and/or the use of small ohmic contacts associated with the electrodes.

In certain embodiments, the capacitive coupling of the at least one type of ohmic contact (e.g., drain, source, cathode) with the substrate is small. According to some implementations, an ohmic contact capacitance ratio can be defined for a device. The ohmic contact capacitance can depend on at least the ohmic contact area and on a thickness of the epitaxial structure between the ohmic contact(s) and the conductive substrate. Without being bound to any particular theory, a capacitance ratio of an ohmic contact can be expressed as follows $$C_{oc}=(\varepsilon_0\varepsilon_r A_{oc})/(tL) \quad (2)$$

where $\varepsilon_0$ is the permittivity of free space, $\varepsilon_r$ is the effective relative permittivity of the epitaxial structure between the ohmic contact and the conductive substrate, $A_{oc}$ is the area of the ohmic contact, t is the thickness of the epitaxial structure between the ohmic contact and the conductive substrate, and L is the gate or anode peripheral length. If there is more than one ohmic contact (e.g., multiple drain contacts), then the areas of the ohmic contacts are summed to obtain $A_{oc}$. Similarly, the gate or anode peripheral length L is a sum of peripheral lengths of constituent gates or anodes in a device, as described above.

As an example for an epitaxial structure of the present embodiments that is approximately 1.6 microns thick with $\varepsilon_r$ of approximately 9.5, an ohmic contact capacitance ratio for at least one type of ohmic contact of a device can have a value between 0.1 pF/mm and 2.5 pF/mm. The ohmic contact capacitance ratio for at least one type of ohmic contact of a device can be less than 0.25 pF/mm in some cases, less than 0.5 pF/mm in some cases, less than 1 pF/mm in some cases, and yet less than 2 pF/mm in some cases.

As another example for an epitaxial structure of the present embodiments that is approximately 4.8 microns thick with $\varepsilon_r$ of approximately 9.5, an ohmic contact capacitance ratio for at least one type of ohmic contact of a device can have a value between 0.05 pF/mm and 0.8 pF/mm. For this example, the ohmic contact capacitance ratio for at least one type of ohmic contact of a device can be less than 0.1 pF/mm in some cases, less than 0.2 pF/mm in some cases, less than 0.4 pF/mm in some cases, and yet less than 0.6 pF/mm in some cases.

According to some embodiments, the semiconductor devices comprise at least one contact pad over the substrate, over the III-nitride material region, and over at least one ohmic contact. In some embodiments, the ohmic contacts are relatively small compared to the size of the contact pads. Large contact pads are, in accordance with certain embodiments, beneficial in the operation of the semiconductor devices that include semiconductor structures, as external connections can easily be made to the semiconductor structure through the large contact pads.

According to certain embodiments, the contact pads are located over the substrate, over the III-nitride material, and over an electrode (including the electrode's ohmic contact).

In some embodiments, the gate contact pad(s) is(are) located over the substrate, over the III-nitride material, and over the gate electrode(s). Referring back to FIG. 3D, for example, gate contact pad 244 is positioned over and in electrical contact with gate electrodes 240A, 240B, 240C, 240D, 240E, and 240F. Gate contact pad 244 is not visible in FIGS. 2A-2D, as the gate contact pad resides behind the plane of the cross-section.

According to certain embodiments, the drain contact pad(s) is(are) located over the substrate, over the III-nitride material, and over the drain electrode(s). Referring back to FIG. 3E, for example, drain contact pad 234 is positioned over and in electrical contact with drain electrodes 230A, 230B, 230C, 230D, 230E, and 230F. Drain contact pad 234 is also illustrated in the cross-sections shown in FIGS. 2A-2D. In FIGS. 2A-2D, drain contact pad 234 contacts drain electrode 230, and extends laterally beyond interfacial area 309 of ohmic contact 302B.

In some embodiments, the source contact pad(s) is(are) located over the substrate, over the III-nitride material, and over the source electrode(s). Referring back to FIG. 3F, for example, source contact pad 224A is positioned over and in electrical contact with source electrode 220A, source contact pad 224B is positioned over and in electrical contact with source electrode 220B, source contact pad 224C is positioned over and in electrical contact with source electrode 220C, and source contact pad 224D is positioned over an in electrical contact with source electrode 220D. Source contact pad 224A is also illustrated in the cross-sections shown in FIGS. 2A-2D. In FIGS. 2A-2D, source contact pad 224A contacts source electrode 220A and extends laterally beyond interfacial area 308 of ohmic contact 302A.

FIGS. 3G and 3H include top, perspective views of the device once the source, gate, and drain contact pads have been added to the device.

To reduce deleterious effects of contact pads above a conductive substrate, areas of the contact pads can be reduced. In this regard, contact-pad area ratios $Ar_{cp}$ referenced to peripheral lengths can be defined for devices of the present embodiments and represented, for example, as follows $$Ar_{cp}=A_{cp}/L \quad (3)$$

where $A_{cp}$ represents the area of all contact pads of a same type (e.g., all drain contact pads, all anode contact pads) for a device, and L is the gate peripheral length or anode peripheral length for a device as described above.

In some implementations, devices formed in accordance with the present embodiments can have a contact-pad area ratio for gate or anode contact pads that is between 15 $\mu m^2/\mu m$ and 20 $\mu m^2/\mu m$. In some cases, the contact-pad area ratio for gate or anode contact pads of a device can be less than 17 $\mu m^2/\mu m$ according to some embodiments, less than 18 $\mu m^2/\mu m$ according to some embodiments, less than 19 $\mu m^2/\mu m$ according to some embodiments, and yet less than 20 $\mu m^2/\mu m$ according to some embodiments.

In some implementations, devices formed in accordance with the present embodiments can have a contact-pad area ratio for drain, source, or cathode contact pads that is between 30 $\mu m^2/\mu m$ and 50 $\mu m^2/\mu m$. In some cases, the contact-pad area ratio for gate or anode contact pads of a device can be less than 35 $\mu m^2/\mu m$ according to some embodiments, less than 40 $\mu m^2/\mu m$ according to some embodiments, less than 45 $\mu m^2/\mu m$ according to some embodiments, and yet less than 50 $\mu m^2/\mu m$ according to some embodiments.

In embodiments, any of the aforementioned contact pads can capacitively couple to a conductive substrate. Accordingly, capacitance of a contact pad can be reduced to ameliorate deleterious effects of such capacitive coupling. A contact-pad capacitance ratio referenced to peripheral length can be defined for contact pads of devices of the present embodiments. Without being bound to any particular theory, a contact-pad capacitance ratio can be expressed as follows $$C_{cp} = \left(\frac{1}{C_1} + \frac{1}{C_2}\right)^{-1}$$

(4)

where $C_1$ represents a capacitance component attributed to epitaxial material in a region between the conductive substrate 110 and dielectric region 250, and $C_2$ represents a capacitance component attributed to the dielectric region 250, for example and referring to FIG. 2A. $C_1$ and $C_2$ can be expressed as follows $$C_1 = (\varepsilon_0 \varepsilon_{r1} A_{cp})/(t_1 L) \quad (5)$$

$$C_2 = (\varepsilon_0 \varepsilon_{r2} A_{cp})/(t_2 L)$$

where $\varepsilon_0$ is the permittivity of free space, $\varepsilon_{r1}$ is the effective relative permittivity of the epitaxial structure between the conductive substrate 110 and dielectric region 250, $\varepsilon_{r2}$ is the relative permittivity of the dielectric region 250, $A_{cp}$ is the area of the contact pad as described above, $t_1$ is the thickness of the epitaxial structure between the conductive substrate 110 and dielectric region 250, $t_2$ is the thickness of the dielectric region 250, and L is the gate peripheral length or anode peripheral length as described above. The area of the contact pad can be the area of a source contact pad, a drain contact pad, a gate contact pad, an anode contact pad, or a cathode contact pad. If there is a plurality of a same type of contact pads in a device (e.g., plural drain contact pads for a transistor), then the area of the contact pad $A_{cp}$ would be the sum of all areas of the contact pads of the same type when determining the capacitance ratio. If there is a plurality of gates or anodes for a device, then the peripheral length L would be the sum of all gate peripheral lengths or anode peripheral lengths.

As examples for an epitaxial structure of the present embodiments that is approximately 4.8 microns thick with $\varepsilon_{r1}$ of approximately 9.5 and that is covered with at least one layer of dielectric material (e.g., approximately 4 microns of benzocyclobutane (BCB) with $\varepsilon_{r2}$ of approximately 2.65), a contact-pad capacitance ratio for a gate or anode of a device can have a value between 0.05 pF/mm and 1.0 pF/mm. The contact-pad capacitance ratio for a gate or anode of a device can be less than 0.1 pF/mm in some cases, less than 0.2 pF/mm in some cases, less than 0.4 pF/mm in some cases, less than 0.6 pF/mm in some cases, less than 0.8 pF/mm in some cases, and yet less than 1 pF/mm in some cases. In some implementations, the dielectric region can include additional layers of dielectric material (e.g., a layer of silicon nitride between 0.1 micron and 1 micron thick with $\varepsilon_{r2}$ of approximately 6.44).

As additional examples for an epitaxial structure of the present embodiments that is approximately 4.8 microns thick with $\varepsilon_{r1}$ of approximately 9.5 and that is covered with at least one layer of dielectric material (e.g., approximately 4 microns of benzocyclobutane (BCB) with $\varepsilon_{r2}$ of approximately 2.65), a contact-pad capacitance ratio for a drain, source, or cathode of a device can have a value between 0.1 pF/mm and 1.5 pF/mm. The contact-pad capacitance ratio for a drain, source, or cathode of a device can be less than 0.2 pF/mm in some cases, less than 0.4 pF/mm in some cases, less than 0.6 pF/mm in some cases, less than 0.8 pF/mm in some cases, less than 1.0 pF/mm in some cases, and yet less than 1.2 pF/mm in some cases. In some implementations, the dielectric region can include additional layers of dielectric material (e.g., a layer of silicon nitride between 0.1 micron and 1 micron thick with ere of approximately 6.44).

According to some embodiments, an active-area capacitance ratio $C_a$ can be defined for a device formed over a conductive substrate as follows $$C_a = (\varepsilon_0 \varepsilon_r A_a)/(tL) \quad (6)$$

where $\varepsilon_0$ is the permittivity of free space, $\varepsilon_r$ is the effective relative permittivity of the epitaxial structure between the conductive substrate 110 and the devices active area 306, $A_a$ is the active area of the device as described above (e.g., a sum of active areas for a transistor that comprises multiple source, gate, and drain electrode groups as in FIG. 3C), t is the thickness of the epitaxial structure between the conductive substrate 110 and active area 306, and L is the gate peripheral length or anode peripheral length as described above.

In some implementations, an active-area capacitance ratio $C_a$ for a device is between 0.05 pF/mm and 0.5 pF/mm. The active-area capacitance ratio $C_a$ for a device can be no greater than 0.2 pF/mm in some embodiments, no greater than 0.3 pF/mm in some embodiments, and yet no greater than 0.4 pF/mm in some embodiments.

In certain embodiments, the at least one contact pad defines a contact pad area. The contact pad area of a particular contact pad refers to the area over which that contact pad forms an interface with the underlying material. For example, referring to FIG. 3D, gate contact pad 244 defines contact pad area 242, which is the entire black area of contact pad 244. In FIG. 3E, drain contact pad 234 defines contact pad area 232, which is the entire black area of contact pad 234. Referring to FIG. 3F, source contact pads 224A, 224B, 224C, and 224D define contact pad areas 222A, 222B, 222C, and 222D, respectively (which, each, correspond to the entire black areas of contact pads 224A-224D).

In some embodiments, for at least one contact pad, the ratio of (1) the ohmic contact interfacial area of the electrode connected to that contact pad to (2) the contact pad area of that contact pad is less than 12%. In some cases, the ratio of (1) the ohmic contact interfacial area of the electrode connected to that contact pad to (2) the contact pad area of that contact pad is less than 10%. In some cases, the ratio of (1) the ohmic contact interfacial area of the electrode connected to that contact pad to (2) the contact pad area of that contact pad is less than 15%. In some cases, the ratio of (1) the ohmic contact interfacial area of the electrode connected to that contact pad to (2) the contact pad area of that contact pad is less than 20%. In some cases, the ratio of (1) the ohmic contact interfacial area of the electrode connected to that contact pad to (2) the contact pad area of that contact pad is less than 30%.

In certain embodiments, for at least one gate or anode contact pad, the ratio of (1) the Schottky contact interfacial area of the gate or anode electrode(s) connected to the gate or anode contact pad to (2) the contact pad area of the gate or anode contact pad is less than 2.5%. For example, in FIG. 3D, gate contact pad 244 is connected to each of gate electrodes 240A, 240B, 240C, 240D, 240E, and 240F. Thus, to calculate the ratio of the Schottky contact interfacial area to the contact pad area for contact pad 244, one would determine the ratio of:
(1) the sum of the interfacial areas of the gate (or anode) electrodes 240A-240F (which would be determined by summing the interfacial areas of each of the six gate or anode electrodes) to
(2) the contact pad area 242.
According to certain embodiments, this ratio is less than 1.5%. In some cases, this ratio is less than 30%. In some cases, this ratio is less than 20%. In some cases, this ratio is less than 15%.

In accordance with certain embodiments, for at least one drain or cathode contact pad, the ratio of (1) the ohmic contact interfacial area of the drain or cathode electrode(s) connected to the drain or cathode contact pad to (2) the contact pad area of the drain or cathode contact pad is less than 12%. For example, referring to FIG. 3E, drain contact pad 234 is connected to each of drain electrodes 230A, 230B, 230C, 230D, 230E, and 230F. Thus, to calculate the ratio of the ohmic contact interfacial area to the contact pad area for contact pad 234, one would determine the ratio of:
(1) the sum of the interfacial areas of the drain (or cathode) electrodes 230A-230F (which would be determined by summing the interfacial areas of each of the six drain electrodes) to
(2) the drain or cathode contact pad area 232.
According to certain embodiments, this ratio is less than 10%. In some cases, this ratio is less than 30%. In some cases, this ratio is less than 20%. In some cases, this ratio is less than 15%.

In some embodiments, for at least one source contact pad, the ratio of (1) the ohmic contact interfacial area of the source electrode(s) connected to the source contact pad to (2) the contact pad area of the source contact pad is less than 15%. For example, referring to FIG. 3F, source contact pad 224A is connected to a single source electrode 220A. Thus, to calculate the ratio of the ohmic contact interfacial area to the contact pad area for contact pad 224A, one would determine the ratio of:
(1) the interfacial area of the source electrodes 220A connected to contact pad 224A to
(2) the source contact pad area 222A.
According to certain embodiments, this ratio is less than 28%. In some cases, this ratio is less than 30%. In some cases, this ratio is less than 20%. In some cases, this ratio is less than 15%.

As another example, in FIG. 3F, source contact pad 224B is connected to two source electrodes 220B and 220C. Thus, to calculate the ratio of the ohmic contact interfacial area to the contact pad area for contact pad 224B, one would determine the ratio of:
(1) the interfacial areas of the two source electrodes 220B and 220C connected to contact pad 224B to
(2) the source contact pad area 222B.
According to certain embodiments, this ratio is less than 13.6%. In some cases, this ratio is less than 30%. In some cases, this ratio is less than 20%. In some cases, this ratio is less than 15%.

According to certain embodiments, the device ohmic interfacial area is relatively small compared to the device ohmic contact pad area. As noted above, the device ohmic interfacial area refers to the sum of all of the interfacial areas of the ohmic contacts of that device. In a similar manner, the "device ohmic contact pad area" refers to the sum of all of the areas of contact pads connected to electrodes that establish ohmic contacts of that device. For example, referring back to FIG. 3G. The device ohmic interfacial area would be calculated by summing twelve (12) interfacial areas (i.e., the six interfacial areas defined by the six source electrodes 220 and the six interfacial areas defined by the six drain electrodes 230). In FIG. 3G, the device ohmic contact pad area would be calculated by summing five (5) contact pad areas (i.e., drain contact pad area 232, source contact pad area 222A, source contact pad area 222B, source contact pad area 222C, and source contact pad area 222D).

In certain embodiments, the ratio of the device ohmic interfacial area to the device ohmic contact pad area is less than 13.6%. In some cases, the ratio of the device ohmic interfacial area to the device ohmic contact pad area is less than 15%. In some cases, the ratio of the device ohmic interfacial area to the device ohmic contact pad area is less than 20%. In some cases, the ratio of the device ohmic interfacial area to the device ohmic contact pad area is less than 30%.

According to certain embodiments, the semiconductor devices and semiconductor structures described herein comprise a dielectric region (e.g., a single dielectric layer, a combination of dielectric layers). In certain embodiments, the dielectric region is located over the substrate and over the III-nitride material region. For instance, as shown in FIG. 2B, semiconductor device 200A comprises dielectric region 250 located over substrate 110 and over III-nitride material region 120.

According to certain embodiments, the dielectric region can be made of any of a variety of suitable dielectric materials. Non-limiting examples of suitable materials from which the dielectric region can be made include silicon dioxide ($SiO_2$), tetraethyl orthosilicate (TEOS), high-k dielectrics or transition metal (TM) oxides, polyimide, polybenzoxazole (PBO), and/or benzocyclobutane (BCB).

In some embodiments, the dielectric region of the semiconductor device is thick. For example, referring to FIGS. 2A-2D, in some embodiments, dielectric region 250 can be relatively thick (with the thickness illustrated in FIGS. 2A-2D as dimension 252). In certain embodiments, the dielectric region has a thickness of at least 1 micrometer, at least 2 micrometers, at least 3 micrometers, at least 5 micrometers, or at least 10 micrometers. In some embodiments, the dielectric region thickness is less than 10 micrometers, less than 5 micrometers, less than 3 micrometers, or less than 2 micrometers. Combinations of these ranges are also possible (e.g., greater than 3 micrometers and less than 10 micrometers, greater than 1 micrometer and less than 5 micrometers).

In certain embodiments, at least one of the contact pads is located over the dielectric region. Contact pad(s) located over the dielectric region can, for example, sit on top of the dielectric region. Referring to FIG. 2A, for example, semiconductor device 200A comprises contact pad 244 located over substrate 110, over III-nitride material region 120, and over dielectric region 250. In other cases, a contact pad(s) positioned over the dielectric region can be embedded within the dielectride layer. According to certain embodiments, a large contact pad located over a thick dielectric region can lower the amount of RF current displaced through the silicon-containing substrate.

In certain embodiments, the dielectric region material has any of variety of suitable dielectric constants. In certain embodiments, the dielectric material has a dielectric constant of less than 4, less than 3, or less than 2. In certain embodiments, the dielectric material has a dielectric constant of greater than 1, greater than 2, or greater than 3. Combinations of these ranges are also possible (e.g., greater than 1 and less than 4, greater than 2 and less than 3). In some embodiments, the dielectric material has a dielectric constant of 2.65.

According to certain embodiments, the semiconductor devices described herein comprise an electronically conductive material located within and/or over the III-nitride material region. The electrically conductive material (e.g., a conductive via) can be arranged such that it establishes an electrical connection between top side electronic structures (e.g., one or more contact pads) and the electronically conductive substrate by passing vertically through the III-nitride material region. In some implementations, the electrically conductive substrate can be held at ground potential (or some other reference potential) and provide a backside ground at the location of integrated circuit components. According to certain embodiments, the use of electronically conductive materials located within and/or over the III-nitride material region is advantageous as grounding can be achieved in such devices without the need for an external wire(s) and/or patterning other interconnects on the substrate to provide ground. The backside ground can also provide, in accordance with certain embodiments, improved gain.

Figure 4:
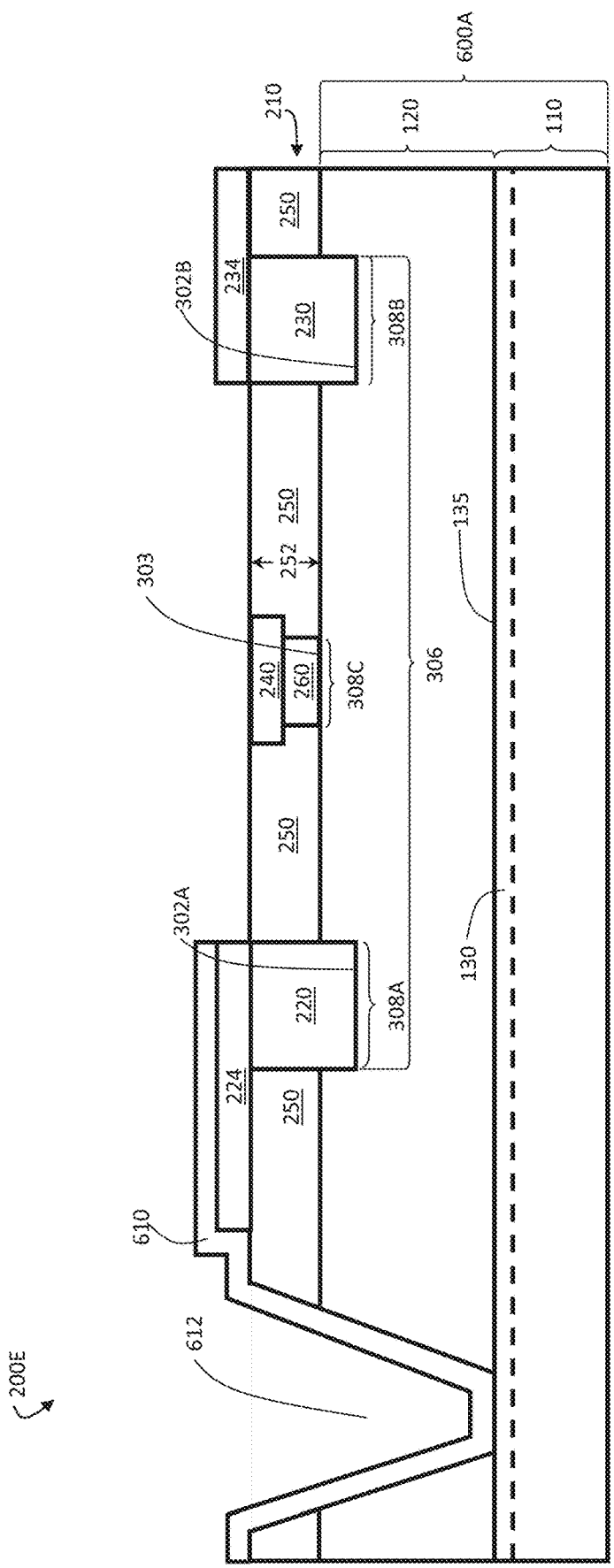
FIG. 4 is a cross-sectional schematic illustration of a device comprising a semiconductor structure that includes an electronically conductive material coupled to an electronically conductive substrate, according to certain embodiments.

FIG. 4 is a cross-sectional schematic illustration of a semiconductor device comprising an electronically conductive material coupled to a contact pad and a substrate, according to certain embodiments. As shown in FIG. 4, semiconductor structure 600A comprises substrate 110 and III-nitride material region 120 over substrate 110. Also shown in FIG. 4 is electronically conductive material 610, which has been deposited within cavity 612 formed in the device.

In some embodiments, the electronically conductive material is electrically coupled to the electronically conductive portion of the substrate through the thickness of the III-nitride material region. For example, referring to FIG. 4, electronically conductive material 610 is electrically coupled to electronically conductive portion of substrate 110 through the thickness of the III-nitride material region 120 by way of cavity 612. Cavity 612 can function, for example, as a front-side (or top-side) via. In certain embodiments, cavity 612 is formed (e.g., etched) into the layers of the semiconductor structure (such as III-nitride material region 120), and electronically conductive material 610 is deposited or otherwise formed in cavity 612 such that it is coupled to the electronically conductive portion of the substrate through the thickness of the III-nitride material region. In some embodiments, the perimeter (e.g., sidewalls and base) of the cavity or via is lined with a conductive metal, and in other embodiments a metal or conductive plug is formed by filling the cavity or via. According to certain embodiments, the semiconductor structure can be grounded to the electronically conductive substrate through electronically conductive material 610 without using an external connection from the drain electrode to an external ground.

In certain embodiments, the electronically conductive material can make an electrical connection from the source electrode to an electronically conductive portion of the substrate. For example, in FIG. 4, electronically conductive material makes an electrical connection from source electrode 220 to substrate 110 by connecting source contact pad 224 (which is electrically coupled to source electrode 220) to substrate 110.

As described elsewhere herein, the use of an electronically conductive substrate can lower thermal runaway within the semiconductor structure. In addition, the use of thick III-nitride materials, small ohmic contacts, and/or thick dielectric regions can reduce capacitive coupling. Such improvements can, in accordance with certain embodiments, result in performance enhancements with high operational frequencies and/or high input frequencies are employed. In certain embodiments, operating semiconductor structures with electronically conductive structures at high operational frequencies and high input frequencies results in generated RF signals with a reduction in the dissipated current throughout the electronically conductive substrate. As a result, and according to certain embodiments, the devices can be operated at high frequencies at higher temperatures with less device degradation, which will be described herein in further detail.

In some embodiments, the semiconductor structures described herein are capable of operation at a high operational frequency. As used herein, operational frequency can be understood as the frequency of a signal that is input to a device having a semiconductor structure of the present embodiments, and operated on by the device (e.g., amplified, switched, modulated, etc.) to produce an output signal. In some embodiments, the semiconductor structures described herein are capable of receiving a high input frequency without significant attenuation (e.g., less than 6 dB of power attenuation between input and output of a device formed using the semiconductor structures described herein). As used herein, input frequency can be understood as the frequency of the applied signal to the gate of a transistor or anode of a diode. High operational frequencies can be in the radio frequency (RF) range and have a value between 50 MHz and 50 GHz.

In some embodiments, certain of the devices described herein are configured to maintain high operational frequencies over a relatively large number of operation cycles. For example, in some embodiments, devices and components formed using the semiconductor structure can maintain an operational frequency of greater than 50 MHz (or greater than 60 MHz, greater than 70 MHz, greater than 80 MHz, greater than 90 MHz, or greater than 100 MHz, and/or, in some embodiments, up to 50 GHz) for at least 10 seconds, at least 100 seconds, at least 10 minutes, at least 100 minutes, at least 10 hours, at least 100 hours, or more (and/or, in some embodiments, up to $10^7$ hours).

According to certain embodiments, devices and components formed using the semiconductor structures have an operational frequency of greater than 50 MHz. In certain embodiments, the operational frequency of the devices or components is greater than 60 MHz, greater than 70 MHz, greater than 80 MHz, greater than 90 MHz, or greater than 100 MHz. According to certain embodiments, the operational frequency is less than 110 MHz, less than 100 MHz, less than 90 MHz, less than 80 MHz, less than 70 MHz, or less than 60 MHz. Combinations of these ranges are also possible (e.g., greater than 50 MHz and less than 80 MHz, greater than 70 MHz and less than 100 MHz).

In certain embodiments, devices or components comprising the semiconductor structures have an input frequency of greater than 800 MHz. The input frequency can be less than 20 GHz in some cases, can be less than 10 GHz in some cases, less than 7 GHz in some cases, less than 4 GHz in some cases, less than 2 GHz in some cases, and yet less than 1 GHz in some cases. Combinations of these ranges are also possible (e.g., greater than 800 MHz and less than 1 GHz, greater than 800 MHz and less than 4 GHz).

According to certain embodiments, deviced formed using certain semiconductor structures described herein have high operating efficiency at elevated temperatures (e.g., substrate lattice temperatures). For example, transistors having semiconductor structures described herein can operate with high drain efficiencies (DE) or power-added efficiencies (PAE). Drain efficiency as used herein is a ratio of RF power output from a device to the DC power input to the device. Power-added efficiency as used herein is a ratio of a net RF power output from a device (RF power out minus RF power input) to the DC power input to the device. Without wishing to be bound by any theory, it is believed that relatively high efficiencies can be achieved, at least in part, due to the use of electronically conductive substrates, thick-III nitride layers, small ohmic contact areas, and/or a backside ground plane, which can result in reduced capacitive coupling and/or leakage current to the substrate.

In certain embodiments, a device comprising a semiconductor structure of the present embodiments is configured such that when the device's conductive substrate is at 25° C. the device exhibits a power-added efficiency between 50% and 60% and that a PAE of greater than 50% can be maintained for an increases in substrate temperature to as high as 100° C. According to some embodiments, a device is configured such that when the device's conductive substrate is at 25° C. the device exhibits a PAE between 50% and 60% and that a PAE of greater than 50% can be maintained for an increase in substrate temperature to as high as 135° C. According to some embodiments, a device is configured such that when the device's conductive substrate is at 25° C. the device exhibits a PAE between 50% and 60% and that a PAE of greater than 45% can be maintained for an increase in substrate temperature to as high as 200° C. In some embodiments, a device is configured such that when the device's conductive substrate is at 25° C. the device exhibits a PAE of up to 55%, up to 60%, up to 65%, up to 70%, up to 75%, up to 80%, up to 85%, or more.

According to some embodiments, a device comprising a semiconductor structure of the present embodiments can exhibit a drop in PAE of no greater than 5% when the temperature of the device's conductive substrate is increased in temperature from 25° C. to 100° C. According to some embodiments, a device comprising a semiconductor structure of the present embodiments can exhibit a drop in PAE of no greater than 5% when the temperature of the device's conductive substrate is increased in temperature from 25° C. to 130° C. According to some embodiments, a device comprising a semiconductor structure of the present embodiments can exhibit a drop in PAE of no greater than 10% when the temperature of the device's conductive substrate is increased in temperature from 25° C. to 130° C. According to some embodiments, a device comprising a semiconductor structure of the present embodiments can exhibit a drop in PAE of no greater than 10% when the temperature of the device's conductive substrate is increased in temperature from 25° C. to 200° C.

In some embodiments, a device comprising a semiconductor structure of the present embodiments can exhibit a drop in PAE of up to 1%, up to 2%, up to 3%, up to 4%, or more when the substrate is increased in temperature from 25° C. to 105° C. According to certain embodiments, a device comprising a semiconductor structure of the present embodiments can exhibit a drop in PAE of as little as 4%, as little as 3%, as little as 2%, as little as 1%, or less when the substrate is increased in temperature from 25° C. to 105° C. Combinations of these ranges are also possible (e.g., as little as 2% and up to 4%, as little as 3% and up to 5%). According to certain embodiments, a device comprising a semiconductor structure of the present embodiments can exhibit a drop in PAE of up to 1%, up to 3%, up to 5%, up to 7%, up to 9%, or more when the substrate is increased in temperature from 25° C. to 125° C. According to certain embodiments, a device comprising a semiconductor structure of the present embodiments can exhibit a drop in PAE of as little as 9%, as little as 7%, as little as 5%, as little as 3%, or less when the substrate is increased in temperature from 25° C. to 125° C. Combinations of these ranges are also possible (e.g., as little as 3% and up to 10%, as little as 5% and up to 7%).

According to certain embodiments, the semiconductor structures described herein can be used in RF signal handling (e.g., wireless communications), radar applications, RF switching, and power applications. In certain embodiments, the semiconductor structures used for such applications comprise GaN on a conductive silicon substrate.

Various of the devices described herein may be made using conventional semiconductor processing techniques. Such processing techniques can involve, for example, growing layers on the substrate in a process chamber under vacuum conditions.

Some methods may include cleaning the substrate surface prior to growing overlying layers and, typically, before introduction into the process chamber. The substrate surface may be cleaned to remove residual dopant species that may diffuse into the substrate during processing. For example, the substrate may be cleaned by wet chemical cleaning agents such as buffered oxide etch (BOE), hydro-fluoric acid (HF), RCA clean (which is a commercial, proprietary silicon surface cleaning agent), etc. Substrates may also be cleaned by a combination of such agents. The surface of the substrate may be cleaned with organic solvents such as acetone, methanol, trichloroethylene, isopropyl alcohol, etc., for example, to rid a surface of organic contamination.

In some embodiments, methods may include controlling the residual (e.g., residual reaction by-products) amounts of dopant in the process chamber. For example, the amount of residual dopant may be reduced by purging the chamber with a gas (e.g., $NH_3$) while heating to an elevated temperature, prior to introducing the substrate into the chamber. Purging has been found to minimize accumulation of reaction-by-products on reaction chamber walls and components.

In certain embodiments in which a diffusion barrier layer is present, the diffusion barrier layer may be formed in-situ with overlying layers (e.g., the III-nitride material region) of the structure. That is, the diffusion barrier layer may be formed during the same deposition step as the III-nitride material region (e.g., including the optional III-nitride material nucleation layer, the optional III-nitride material transition layer, the optional III-nitride material buffer layer, and/or the III-nitride material device region).

The III-nitride material region may be formed using known growth techniques.

In some embodiments, the optional III-nitride nucleation layer, the optional III-nitride transition layer, the optional III-nitride buffer layer, and/or the III-nitride device region are grown using a metalorganic chemical vapor deposition (MOCVD) process. It should be understood that other suitable techniques known in the art may also be utilized to deposit these layers including molecular beam epitaxy (MBE), hydride vapor phase epitaxy (HVPE), and the like. In certain embodiments, more than one growth technique may be used to grow different III-nitride material layers. For example, in one set of embodiments, MBE could be used to grow the nucleation layer, and the remaining III-nitride material layers may be formed using MOCVD. Other combinations are also possible.

Generally, the MOCVD process involves introducing different reactive source gases (e.g., Al source gases, Ga source gases, N source gases) into the process chamber and providing conditions which promote a reaction between the gases to form a layer. The reaction proceeds until a layer of desired thickness is achieved. The composition of the layer may be controlled, as described further below, by several factors including gas composition, gas concentration, and the reaction conditions (e.g., temperature and pressure).

Examples of suitable source gases for MOCVD growth of the optional III-nitride material nucleation layer, the optional III-nitride material transition layer, the optional III-nitride material buffer layer, and/or the III-nitride material device region include trimethylaluminum (TMA) or triethylaluminum (TEA) as sources of aluminum; trimethylindium (TMI) or triethylindium (TEI) as sources of indium; trimethylgallium (TMG) or trimethylgallium (TEG) as sources of gallium; and ammonia ($NH_3$) as a source of nitrogen. The particular source gas used depends upon the desired composition of the layers. For example, an aluminum source (e.g., TMA or TEA), a gallium source (TMG or TEG), and a nitrogen source are used to deposit films having an $Al_xGa_{1-x}N$ composition.

The flow rates of the source gases, the ratios of the source gases, and the absolute concentrations of the source gases may be controlled to provide layers (e.g., transition layers and gallium nitride material regions) having a desired composition. For the growth of $Al_xGa_{1-x}N$ layers, typical TMA flow rates are between about 5 µmol/min and about 50 µmol/min with a flow rate of about 20 µmol/min being preferred in some cases; typical TMG flow rates are between about 5 µmol/min and 250 µmol/min, with a flow rate of 115 µmol/min being preferred in some cases; and the flow rate of ammonia is typically between about 3 slpm to about 10 slpm. According to certain embodiments, relatively high flow rates (and also higher gas velocities) can be used, which have been found to be particularly effective in minimizing accumulation of dopants.

According to certain embodiments, the reaction temperatures are generally between about 900° C. and about 1200° C. In some embodiments, the process pressures are between about 1 Torr and about 760 Torr. It is to be understood that the process conditions, and in particular the flow rate, are highly dependent on the process system configuration. Typically, smaller throughput systems require less flow than larger throughput systems.

When forming a compositionally-graded layer (e.g., a compositionally graded transition layer, which might be formed, for example, within transition layer 170), process parameters may be suitably adjusted to control the compositional grading. The composition may be graded by changing the process conditions to favor the growth of particular compositions. For example, to increase incorporation of gallium in the transition layer thereby increasing the gallium concentration, the flow rate and/or the concentration of the gallium source (e.g., TMG or TEG) may be increased. Similarly, to increase incorporation of aluminum into the transition layer thereby increasing the aluminum concentration, the flow rate and/or the concentration of the aluminum source (e.g., TMA or TEA) may be increased. The manner in which the flow rate and/or the concentration of the source is increased (or decreased) can control the manner in which the composition is graded. In other embodiments, the temperature and/or pressure is adjusted to favor the growth of a particular compound. Growth temperatures and pressures favoring the incorporation of gallium into the transition layer differ from the growth temperatures and pressures favoring the incorporation of aluminum into the transition layer. Thus, the composition may be graded by suitably adjusting temperature and pressure.

When depositing a layer having a constant composition (e.g., a transition layer, a gallium nitride material layer, etc.), however, the process parameters can be maintained constant so as to provide a layer having a constant composition. When III-nitride material regions (e.g., gallium nitride material regions) include more than one material layer (e.g., more than one gallium nitride material layer) having different respective compositions, the process parameters may be changed at the appropriate time to change the composition of the layer being formed.

It should be understood that all of the layers/regions on the substrate (e.g., the optional III-nitride material nucleation layer, the optional III-nitride material transition layer, the optional III-nitride material buffer layer, and/or the III-nitride material device region) may be grown in the same process, or respective layers/regions may be grown separately.

The processes described herein have been described as involving growing the layers/regions (e.g., the optional III-nitride material nucleation layer, the optional III-nitride material transition layer, the optional III-nitride material buffer layer, and/or the III-nitride material device region) in vertical growth processes. That is, these layers/regions have been described as being grown in a vertical direction with respect to underlying layers/regions (including the substrate). However, in other embodiments of the invention (not shown), it is possible to grow at least a portion of the layer(s) of the III-nitride material region (e.g., gallium nitride material layer(s)) using a lateral epitaxial overgrowth (LEO) technique, for example, as described in U.S. Pat. No. 6,051, 849; or a pendeoepitaxial technique that involves growing sidewalls of gallium nitride material posts into trenches until growth from adjacent sidewalls coalesces to form a gallium nitride material region, for example, as described in U.S. Pat. No. 6,265,289. U.S. Pat. No. 7,071,498 entitled "Gallium Nitride Material Devices Including an Electrode-Defining Layer and Methods of Forming the Same," filed Dec. 17, 2003, and issued Jul. 4, 2006, which is incorporated herein by reference above, further describes techniques used to grow other layers and features shown in the various embodiments described herein.

It should also be understood that other processes may be used to form structures and devices of the present invention as known to those of ordinary skill in the art.

Certain of the layers and/or regions are referred to as being "formed on," "formed over," "formed directly on," "formed directly over," and/or "covering" another layer or region (e.g., the substrate). It should be understood that such phrases include situations in which a top surface of an underlying region or layer (e.g., substrate) is converted to the layer or region that is being formed. Such phrases also refer to situations in which new layers are formed by depositing the new, separate layer on the top surface of the underlying layer and/or region (e.g., a substrate).

As noted above, the term "region" may refer to one layer or may refer to multiple layers. It should also be understood that, wherever a single layer is described, the single layer may be replaced, according to certain embodiments, with multiple layers. For example, in certain instances, single layers described herein can be replaced with multiple layers that perform a similar function.

The following examples are intended to illustrate certain embodiments of the present invention, but do not exemplify the full scope of the invention.

EXAMPLE 1

Figure 5A:
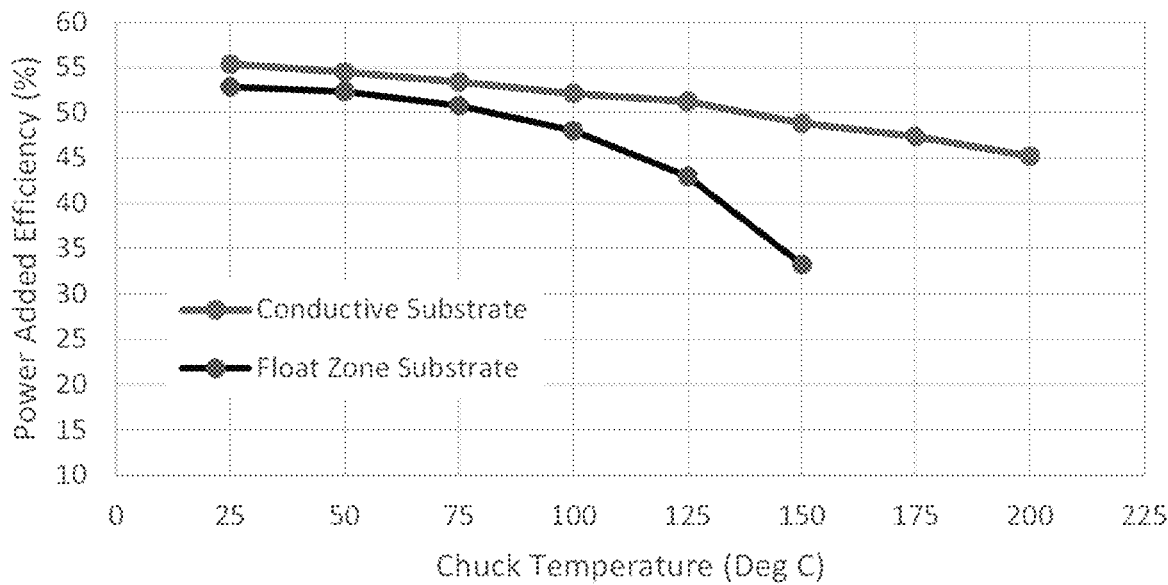
FIG. 5A is a plot showing measured efficiency of a semiconductor device as a function of substrate temperature for highly resistive silicon substrates and conductive silicon substrates, according to some embodiments.

Example results from fabricated devices and simulations are described in this section. FIG. 5A shows measured power-added efficiency (PAE) at 2.5 GHz for two GaN-on-silicon high-electron mobiltiy transistors (HEMTs) versus measured temperature of the silicon substrate. One GaN HEMT transistor was manufactured on a 625 µm thick highly conductive (0.02 Ω-cm i.e. conductive) silicon substrate and the other was manufactured on a 625 µm thick highly resistive (10,000 Ω-cm i.e. float-zone) silicon substrate. The transistor using a highly conductive substrate (upper trace) shows improved power added efficiency at all temperatures and particularly at elevated substrate temperatures compared to the HEMT formed on the highly resistive substrate.

Figure 5B:
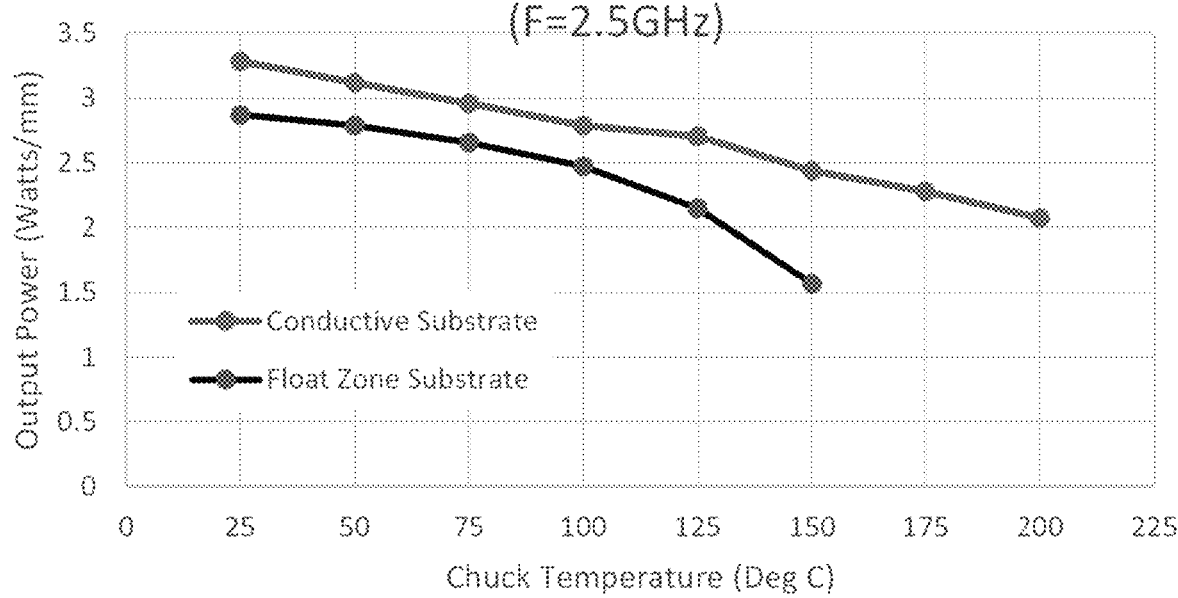
FIG. 5B is a plot showing measured output power of a semiconductor device as a function of substrate temperature for highly resistive silicon substrates and conductive silicon substrates, in some embodiments.

FIG. 5B shows measured output power density at 2.5 GHz as a function of substrate temperature for the same two GaN-on-silicon HEMT transistors that were used to obtain the results in FIG. 5A. The transistor formed on a highly conductive substrate (upper trace) shows improved output power density at all temperatures and particularly at elevated substrate temperatures compared to the transistor formed on the highly resistive substrate.

Figure 6:
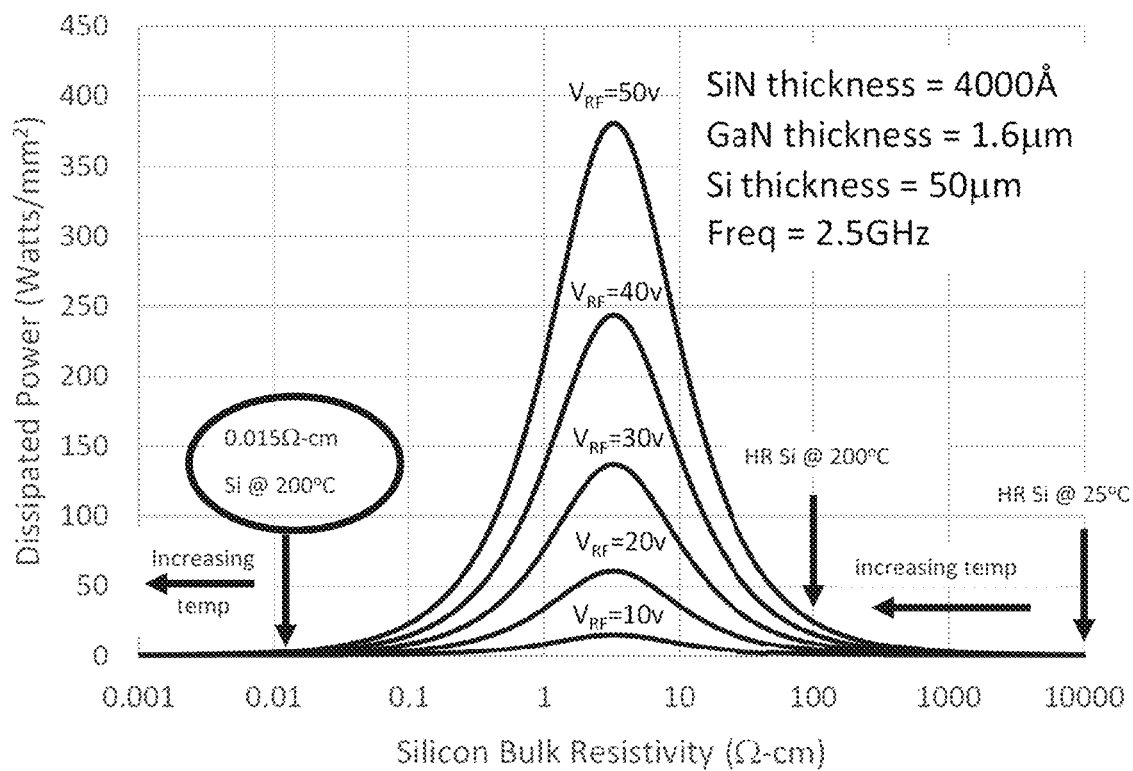
FIG. 6 is a plot of the dissipated power in a silicon substrate vs. the resistivity of a silicon substrate, according to certain embodiments.

FIG. 6 plots calculated power dissipation in a 50 µm thick silicon substrate as a function of the substrate's bulk resistivity for five different applied RF signals. The RF signals (2.5 GHz sinusoidal), ranging from 10 volts peak-to-peak to 50 volts peak-to-peak are capacitively coupled (over a 1 mm×1 mm area) to the silicon substrate through a 400-nm-thick silicon-nitride layer and 1.6-µm-thick GaN dielectric layer on top of the silicon substrate. The bottom of the silicon substrate is at ground potential. To minimize power dissipation in the silicon substrate, either a highly conductive or highly resistive substrate can be used (corresponding to either side of the bell curves). However, the change in bulk resistivity of highly resistive silicon substrates at elevated temperatures (~200° C.) tends towards the peak of the bell curves in FIG. 6, whereas the change in bulk resistivity of highly conductive silicon substrates at elevated temperatures tends away from the peak of the bell curves. Therefore, highly conductive silicon substrates dissipate less power at elevated substrate temperatures compared to highly resistive ones and are preferred for GaN-on-silicon HEMTs, diodes, and other semiconductor devices operating at elevated temperatures.

Figure 7:
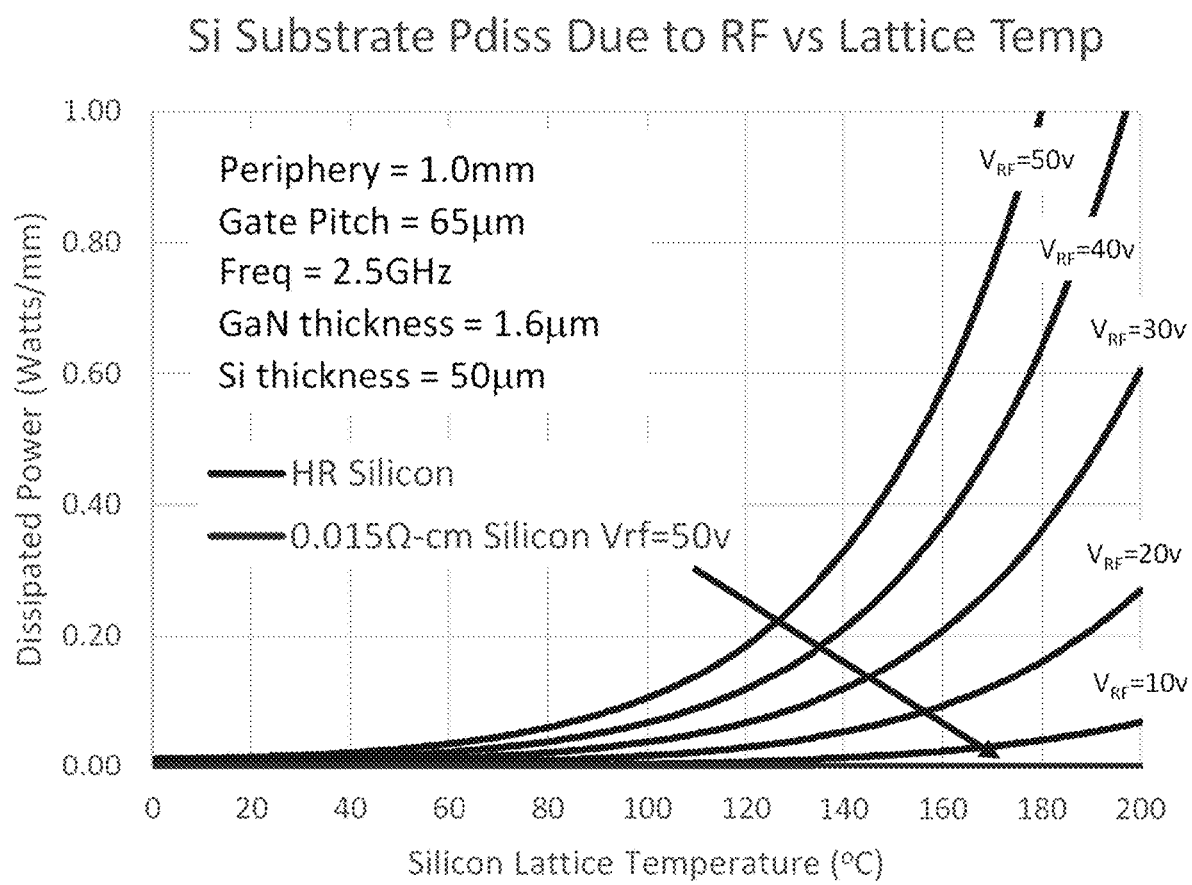
FIG. 7 is a plot of the dissipated power in a silicon substrate vs. the lattice temperature of a silicon substrate, in certain embodiments.

FIG. 7 plots simulated power dissipation in a silicon substrate for a 1 mm gate peripheral length GaN-on-silicon HEMT transistor versus the silicon substrate temperature for five 2.5 GHz sinusoidal RF signals (ranging from 10 volts to 50 volts peak-to-peak) that are applied between the transistor's drain and source contacts. The simulation uses a silicon substrate thickness of 50 µm (10,000 Ω-cm bulk resistivity), gate-to-gate pitch of 65 µm, and total GaN layer thickness of 1.6 µm for the transistor to calculate capacitive coupling to the substrate. Also plotted on the same graph are simulation results at 50 volts peak-to-peak for a same structure that instead has a highly conductive substrate (0.015 Ω-cm bulk resistivity).

As can be seen, for a 50 volt signal, the power dissipated in the highly resistive silicon at 180° C. substrate temperature is about 1.0 Watt/mm and essentially zero for the highly conductive silicon substrate. In embodiments, a GaN-on-silicon HEMT transistor can output about 7.0 Watts/mm (gate peripheral length) RF output power at 2.5 GHz with a drain-to-source bias $V_{DS}$ of 50 volts. Accordingly, 1.0 Watt/mm dissipation into the substrate will dramatically degrade both output power capability of the transistor (e.g., reduced to about 6.0 Watts/mm) as well as degrade device efficiency and increase the transistor junction temperature due to substrate heating.

Figure 8:
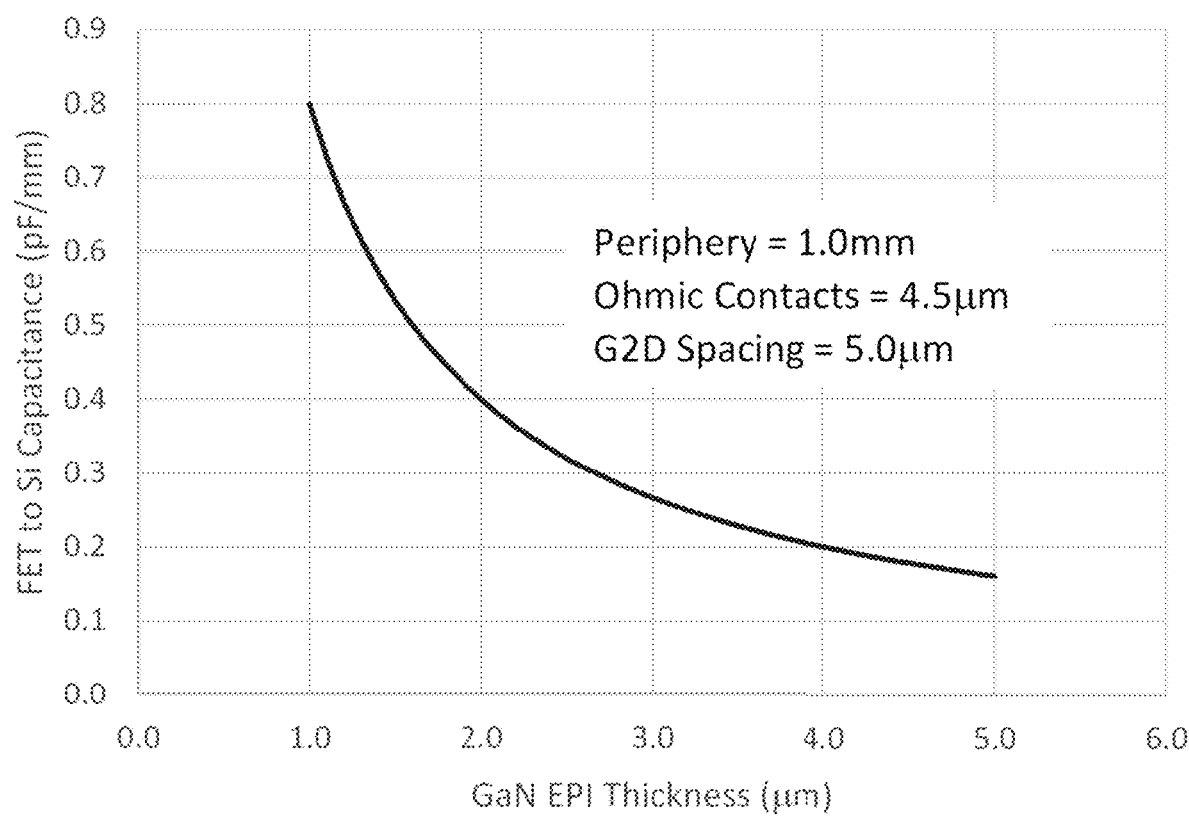
FIG. 8 is a plot of the intrinsic capacitance vs. the III-nitride material thickness, according to some embodiments.

FIG. 8 plots calculated active-area-to-substrate capacitance of a 1.0 mm gate peripheral length GaN-on-silicon HEMT transistor formed on a highly conductive silicon substrate as a function of GaN epitaxy thickness in the semiconductor structure. For this simulation the thickness of the epitaxial region is measured from the location of the 2-dimensional electron gas (2DEG) down to the surface of the conductive substrate. The simulation results represent a lower bound to the device's output capacitance that can be achieved for a GaN on highly conductive silicon substrate HEMT transistor, since it does not include capacitances associated with interconnects and contact pads, for example. The plotted capacitance values can influence maximum transistor bandwidth. The calculation assumes reduced-size ohmic contacts (e.g., 4.5 µm wide) and a gate-to-drain ohmic contact spacing of 5.0 µm (which can be typical for transistors configured for 50-volt operation). The results of FIG. 8 indicate that a thicker GaN epitaxy is desired to minimize the active area capacitance and capacitive coupling to a highly conductive silicon substrate (which may be held at a reference potential, such as ground potential).

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A semiconductor device, comprising:
   a substrate;
   a III-nitride material region located over the substrate;
   an ohmic contact over the III-nitride material region, the ohmic contact defining an ohmic contact interfacial area with the III-nitride material region; and
   a gate electrode over the III-nitride material region, the gate electrode defining a gate electrode interfacial area with the III-nitride material region, wherein
   the ohmic contact interfacial area is less than 50 times the gate electrode interfacial area.

2. The semiconductor device of claim 1, wherein at least a portion of the substrate has an electronic resistivity of less than 0.10 $\Omega$-cm at 25° C.

3. The semiconductor device of claim 1, wherein at least a portion of the substrate has an electronic resistivity of 10,000 $\Omega$-cm at 25° C.

4. The semiconductor device of claim 1, wherein at least a portion of the substrate comprises silicon.

5. The semiconductor device of claim 1, wherein at least a portion of the substrate comprises silicon carbide.

6. The semiconductor device of claim 1, wherein the substrate comprises a silicon-on-insulator structure.

7. The semiconductor device of claim 1, wherein the substrate comprises a bulk silicon or a silicon carbide substrate.

8. The semiconductor device of claim 1, wherein the III-nitride material region comprises gallium nitride materials.

9. The semiconductor device of claim 1, wherein the III-nitride material region comprises:
   a nucleation layer over the substrate;
   a buffer layer over the nucleation layer; and
   a device region over the buffer layer.

10. The semiconductor device of claim 9, further comprising a transition layer located between the nucleation layer and the buffer layer.

11. The semiconductor device of claim 10, wherein the transition layer comprises a superlattice.

12. The semiconductor device of claim 10, wherein the transition layer is compositionally graded.

13. The semiconductor device of claim 1, wherein the semiconductor device is a transistor or a diode.

14. The semiconductor device of claim 13, wherein the transistor or diode is configured to operate at a frequency between 100 MHz and 20 GHz.

15. The semiconductor device of claim 1, wherein:
   the semiconductor device comprises a transistor;
   the ohmic contact comprises a source ohmic contact of the transistor, the source ohmic contact defining a source ohmic contact interfacial area; and the source ohmic contact interfacial area is less than 50 times the gate electrode interfacial area.

16. The semiconductor device of claim 15, wherein the source ohmic contact interfacial area is less than 40 times the gate electrode interfacial area.

17. The semiconductor device of claim 15, wherein the source ohmic contact interfacial area is less than 30 times the gate electrode interfacial area.

18. The semiconductor device of claim 1, wherein:
the semiconductor device comprises a transistor;
the ohmic contact comprises a drain ohmic contact of the transistor, the drain ohmic contact defining a drain ohmic contact interfacial area; and
the drain ohmic contact interfacial area is less than 50 times the gate electrode interfacial area.

19. The semiconductor device of claim 18, wherein:
the drain ohmic contact interfacial area is less than 40 times the gate electrode interfacial area.

20. The semiconductor device of claim 18, wherein:
the drain ohmic contact interfacial area is less than 30 times the gate electrode interfacial area.

\* \* \* \* \*